(12) United States Patent
Wang et al.

(10) Patent No.: US 10,305,255 B2
(45) Date of Patent: May 28, 2019

(54) SURFACE EMITTING LASER

(71) Applicant: Trend Lighting Corp., Taoyuan (TW)

(72) Inventors: Jonathan Wang, Jersey City, NJ (US);
Pei-Chin Hsieh, Taoyuan (TW);
Pei-Jih Wang, Taoyuan (TW);
Shih-Chieh Cheng, Taoyuan (TW)

(73) Assignee: TREND LIGHTING CORP., Taoyuan (TW)

( * ) Notice: Subject to any disclaimer, the term of this patent is extended or adjusted under 35 U.S.C. 154(b) by 1 day.

(21) Appl. No.: 15/652,397

(22) Filed: Jul. 18, 2017

(65) Prior Publication Data
US 2018/0019573 A1 Jan. 18, 2018

(30) Foreign Application Priority Data

Jul. 18, 2016 (TW) .............................. 105122579 A

(51) Int. Cl.
| | |
|---|---|
| *H01S 5/02* | (2006.01) |
| *H01S 5/18* | (2006.01) |
| *H01S 5/22* | (2006.01) |
| *H01S 5/026* | (2006.01) |
| *H01S 5/042* | (2006.01) |
| *H01S 5/183* | (2006.01) |

(52) U.S. Cl.
CPC ............ *H01S 5/2205* (2013.01); *H01S 5/026*
(2013.01); *H01S 5/0215* (2013.01); ***H01S
5/0425* (2013.01); *H01S 5/18* (2013.01); *H01S
5/18308*** (2013.01); *H01S 5/1833* (2013.01);
*H01S 5/2226* (2013.01); *H01S 2304/04*
(2013.01)

(58) Field of Classification Search
CPC .... H01S 5/0215; H01S 5/0216; H01S 5/0217;
H01S 5/18308–5/18313; H01S 5/0425;
H01S 5/02256; H01S 5/0226; H01S
5/02268; H01S 5/02272
See application file for complete search history.

(56) References Cited

U.S. PATENT DOCUMENTS

| | | | | |
|---|---|---|---|---|
| 5,563,094 A | * | 10/1996 | Paoli ..................... | H01S 5/2231 |
| | | | | 148/DIG. 51 |
| 5,724,376 A | * | 3/1998 | Kish, Jr. ................ | H01S 5/0217 |
| | | | | 372/36 |
| 6,549,556 B1 | * | 4/2003 | Hwang ............... | H01S 5/18341 |
| | | | | 372/43.01 |
| 2001/0019566 A1 | * | 9/2001 | Jewell ..................... | G02B 3/00 |
| | | | | 372/43.01 |

(Continued)

OTHER PUBLICATIONS

Office action issued in corresponding Taiwanese application dated Feb. 15, 2017.

*Primary Examiner* — Xinning(Tom) Niu
*Assistant Examiner* — Sean P Hagan
(74) *Attorney, Agent, or Firm* — McClure, Qualey & Rodack, LLP

(57) ABSTRACT

A surface emitting laser includes a conductive substrate, a metal bonding layer, a laser structure layer, an epitaxial semiconductor reflection layer, and an electrode layer. The laser structure layer has an epitaxial current-blocking layer having a current opening. Currents are only transmitting through the current opening. The epitaxial current-blocking layer is grown by a semiconductor epitaxy process to confine the range of the currents to form electric fields.

17 Claims, 33 Drawing Sheets

(56) References Cited

U.S. PATENT DOCUMENTS

| | | | |
|---|---|---|---|
| 2004/0095978 A1* | 5/2004 | Cheng | H01S 5/18305 372/45.01 |
| 2008/0031295 A1* | 2/2008 | Tanaka | H01L 33/0079 372/44.01 |
| 2009/0168825 A1* | 7/2009 | Koda | H01S 5/18311 372/45.01 |
| 2010/0103972 A1* | 4/2010 | Saito | B82Y 20/00 372/50.1 |
| 2015/0043606 A1 | 2/2015 | Hamaguchi et al. | |

* cited by examiner

SURFACE EMITTING LASER

CROSS-REFERENCE TO RELATED APPLICATION

This non-provisional application claims priority under 35 U.S.C. § 119(a) to Patent Application No. 105122579 filed in Taiwan, R.O.C. on Jul. 18, 2016, the entire contents of which are hereby incorporated by reference.

BACKGROUND

Technical Field

The instant disclosure relates to a surface emitting laser, in particular, to a surface emitting laser with improved efficiency.

Related Art

Laser is an important development in photoelectric industries. Lasers are widely used in many manufacturing industries, e.g., laser cutting machines, laser engraving machines, laser rangefinders. Lasers may be divided into surface emitting lasers and edge emitting lasers. Currently, because the manufacturing process for surface emitting lasers is rather simpler as compared to that for edge emitting lasers and the surface emitting lasers can be provided for testing right after the manufactured, surface emitting lasers are main stream in the developments of laser.

A surface emitting laser is deposited or grown by epitaxial growth method provided in semiconductor manufacturing processes, e.g., metal organic chemical-vapor deposition (MOCVD), vapor phase epitaxy (VPE), liquid phase epitaxy (LPE), or molecular beam epitaxy (MBE), and is manufactured by combinations of steps, e.g., photolithography, etching process, lift-off process, thin film deposition process, metal film deposition process, spin process, alloy process, wafer bonding process, and laser lift-off process. In the surface emitting laser, a current-blocking layer is manufactured between the laser emitting structure and the distributed Bragg reflector (DBR, for the sake of convenience, hereinafter called DBR layer) to confine currents to form an electric field within the laser emitting structure to generate a light beam, and the light beam is further reflected by the DBR layer to form resonance gain and then is emitted in the form of laser. The current-blocking layer is used to confine currents to form an electric field within the laser emitting structure to allow the surface emitting laser emitting laser beams. Therefore, the current-blocking layer is quite important.

In a conventional manufacturing method for the current-blocking layer, the surface of the laser emitting structure layer is oxidized to form an oxidized structure, and the oxidized structure is insulated. However, since the oxidation process cannot be controlled properly, the quality of the oxidized structure varies. As a result, the current-blocking layer cannot block currents efficiently. In addition, because the oxidized structure is formed by oxidation, the oxidized structure is inflated and deformed. As a result, the combination between the DBR layer and the laser emitting structure layer becomes worse and the DBR layer may be ablated from the laser emitting structure layer. Consequently, the efficiency of the surface emitting laser worsens.

In another conventional manufacturing method for the current-blocking layer, the uppermost part of the laser emitting structure layer is defined as the current-blocking layer by an ion implantation process. In the ion implantation process, hydrogen ions are implanted on the laser emitting structure layer to break the bonding of the uppermost part of the laser emitting structure layer, so that the uppermost of the laser emitting structure layer is insulated. However, the ion implantation method would make the surface of the uppermost part of the laser emitting structure layer rough. As a result, the interface between the DBR layer and the laser emitting structure layer is very uneven, so that the reflection rate of the DBR layer is reduced. Moreover, the implanted depth of the hydrogen ions cannot be controlled properly; when the implanted depth is too deep, the laser emitting structure layer would be damaged, while when the implanted depth is too shallow, the performance for blocking current of the current-blocking layer would worsen.

As above, the conventional manufacturing methods for the current-blocking layer are destructive manufacturing methods. However, neither the oxidation process nor the ion implantation process can be controlled properly, thus the quality of the manufactured current-blocking layers varies. As a result, the surface emitting lasers may have structural defects which worsen the performance of the surface emitting laser.

SUMMARY

In view of the aforementioned problems in manufacturing the current-blocking layer, a surface emitting laser with improved efficiency is provided, according to the instant disclosure. The current-blocking layer is grown by semiconductor epitaxy process. Hence, the laser structure layer in the laser can be properly combined with other layers to improve the efficiency of the surface emitting laser.

In one embodiment, a surface emitting laser with improved efficiency comprises a conductive substrate; a metal bonding layer on an upper surface of the conductive substrate; a laser structure layer on an upper surface of the metal bonding layer, wherein the laser structure layer has an epitaxial current-blocking layer, and the epitaxial current-blocking layer has a current opening for current passing; an epitaxial semiconductor reflection layer on an upper surface of the laser structure layer; an electrode layer on an upper surface of the epitaxial semiconductor reflection layer for packaging and electrical testing; wherein, the epitaxial current-blocking layer is grown by a semiconductor epitaxy process, and a type of a semiconductor material of the epitaxial current-blocking layer is different from a type of a semiconductor material of the laser structure layer.

Accordingly, because the epitaxial current-blocking layer in the laser structure layer is grown by the semiconductor epitaxy process, neither the uncontrollable oxidation manufacturing method nor the ion implantation method are needed for making the current-blocking layer. Hence, the problem of unwanted inflation of the laser structure layer and the problem of ablation of the laser structure layer from the epitaxial semiconductor reflection layer caused by the uncontrollable oxidation method can be prevented, and the problem of the unsmooth surface of the laser structure layer caused by the ion implantation method can be prevented. The smooth structure of the epitaxial current-blocking layer allows the structure of the laser structure layer to be smooth, so that the junction interface between the laser structure layer and the epitaxial semiconductor reflection layer can be proper combined to improve the efficiency of the surface emitting laser.

In another embodiment, a surface emitting laser with improved efficiency comprises a conductive substrate; a first epitaxial semiconductor reflection layer on an upper surface of the conductive substrate; a laser structure layer on an upper surface of the first epitaxial semiconductor reflection layer, wherein the laser structure layer has an epitaxial current-blocking layer, and the first epitaxial current-blocking layer has a current opening for current passing; a second epitaxial semiconductor reflection layer on an upper surface of the laser structure layer; an electrode layer on the upper surface of the laser structure layer for packaging and electrical testing; wherein, the epitaxial current-blocking layer is grown by a semiconductor epitaxy process, and a type of a semiconductor material of the epitaxial current-blocking layer is different from a type of a semiconductor material of the laser structure layer.

Accordingly, because the epitaxial current-blocking layer in the laser structure layer is grown by the semiconductor epitaxy process, neither the uncontrollable oxidation manufacturing method nor the ion implantation method are needed for making the current-blocking layer. Hence, the problem of unwanted inflation of the laser structure layer and the problem of ablation of the laser structure layer from the first and second epitaxial semiconductor reflection layers caused by the uncontrollable oxidation method can be prevented, and the problem of the unsmooth surface of the laser structure layer caused by the ion implantation method can be prevented. The smooth structure of the epitaxial current-blocking layer allows the structure of the laser structure layer to be smooth, so that the junction interface between the laser structure layer and the first and second epitaxial semiconductor reflection layers can be proper combined to improve the efficiency of the surface emitting laser.

BRIEF DESCRIPTION OF THE DRAWINGS

The disclosure will become more fully understood from the detailed description given herein below for illustration only, and thus not limitative of the disclosure, wherein:

FIG. 2-1 illustrates another structural view of the first embodiment;

FIG. 2-2 illustrates yet another structural view of the first embodiment;

DETAILED DESCRIPTION

Figure 1:
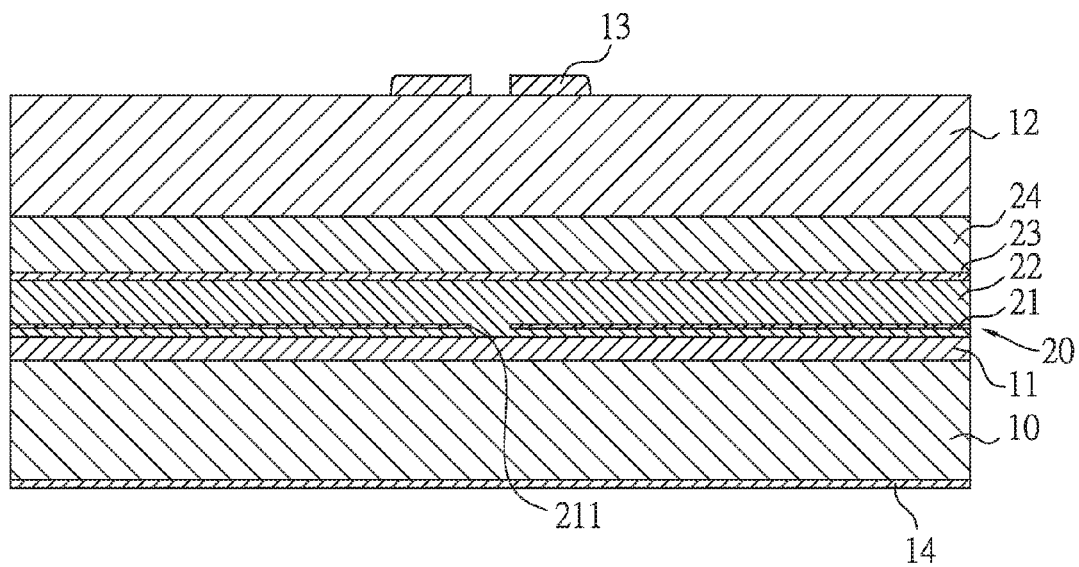
FIG. 1 illustrates a structural view of a first embodiment of the instant disclosure.

Please refer to FIG. 1, illustrating a surface emitting laser with improved efficiency according to a first embodiment of the instant disclosure. The surface emitting laser comprises a conductive substrate 10, a metal bonding layer 11, a laser structure layer 20, an epitaxial semiconductor reflection layer 12, and a first electrode layer 13. The laser structure layer 20, the epitaxial semiconductor reflection layer 12, and the first electrode layer 13 form a surface-emitting type laser structure. The surface-emitting type laser structure is manufactured by a semiconductor epitaxy process and a semiconductor manufacturing process. In this embodiment, the semiconductor epitaxy process may be a metal organic chemical-vapor deposition (MOCVD) process, and the semiconductor manufacturing process may be combinations of photolithography, etching process, lift-off process, thin film deposition process, metal film deposition process, spin process, alloy process, wafer bonding process, laser lift-off process, etc.

In this embodiment, the conductive substrate 10 is an electrically conductive substrate with great heat dissipation and electrical conductive properties. The conductive substrate 10 may be made of molybdenum, gallium phosphide, silicon, aluminum, or copper.

In this embodiment, the combination between the surface-emitting type laser structure and the conductive substrate 10 may be accomplished by a wafer bonding process. In the wafer bonding process, firstly the metal bonding layer 11 is disposed on an upper surface of the conductive substrate 10. Next, after a substrate for loading the surface-emitting type laser structure is removed, the surface-emitting type laser structure is transferred to an upper surface of the metal bonding layer 11 to form the surface emitting laser. In this embodiment, a second electrode layer 14 is disposed on a lower surface of the conductive substrate 10.

In this embodiment, the metal bonding layer 11 is used to connect the laser structure layer 20 with the conductive substrate 10. The metal bonding layer 11 may be used for electrical conduction and for reflecting the light generated by the laser structure layer 20, so that the light can be resonated back and forth between the metal bonding layer 11 and the epitaxial semiconductor reflection layer 12 to form resonance gain. As a result, the light can be emitted in the form of laser eventually.

The epitaxial semiconductor reflection layer 12 may be formed by stacking two semiconductor materials with different reflection indexes to form a distributed Bragg reflector.

The first electrode layer 13 and the second electrode layer 14 are for receiving voltage/current for testing and for electrical connection in the subsequent packaging process. The type of the semiconductor material of the second electrode layer 14 is different from the type of the semiconductor material of the first electrode layer 13, and the first electrode layer 13 and the second electrode layer 14 have different electrical polarities. When the first electrode layer 13 is a positive electrode, the second electrode layer 14 is a negative electrode. Conversely, when the first electrode layer 13 is a negative electrode, the second electrode layer 14 is a positive electrode.

The laser structure layer 20 has a first epitaxial current-blocking layer 21, and a middle portion of the first epitaxial current-blocking layer 21 has a first current opening 211, so that the currents only passes through the first current opening 211. In this embodiment, the laser structure layer 20 sequentially has, from a top to a bottom, a first semiconductor epitaxial layer 22, an emitting reaction active layer 23, and a second semiconductor epitaxial layer 24 on the upper surface of the metal bonding layer 11, and the first epitaxial current-blocking layer 21 is in the first semiconductor epitaxial layer 22. In this embodiment, the type of the semiconductor material of the first semiconductor epitaxial layer 22 is opposite to the type of the semiconductor material of the second semiconductor epitaxial layer 24. When the first semiconductor epitaxial layer 22 is a P type semiconductor, the second semiconductor epitaxial layer 24 is an N type semiconductor. Conversely, when the first semiconductor epitaxial layer 22 is an N type semiconductor, the second semiconductor epitaxial layer 24 is a P type semiconductor.

In this embodiment, the epitaxial semiconductor reflection layer 12 may be a P-type semiconductor reflection layer or an N-type semiconductor reflection layer. The type of the semiconductor material of the epitaxial semiconductor reflection layer 12 corresponds to the type of the semiconductor material of the second semiconductor epitaxial layer 24. When the second semiconductor epitaxial layer 24 is an N type semiconductor, the epitaxial semiconductor reflection layer 12 is an N type semiconductor reflection layer. Conversely, when the second semiconductor epitaxial layer 24 is a P type semiconductor, the epitaxial semiconductor reflection layer 12 is a P type semiconductor reflection layer.

Figures 1, 2:
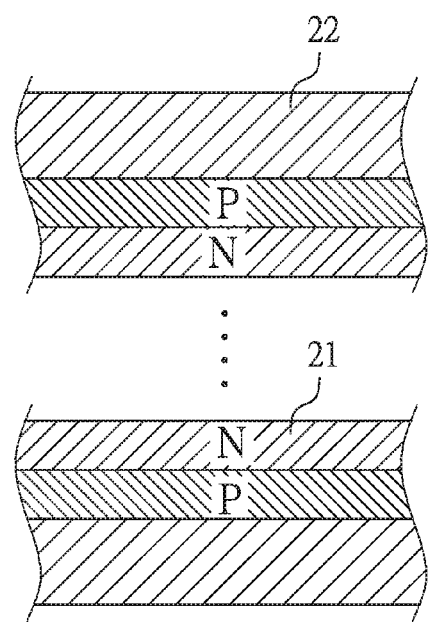
Figure 2:
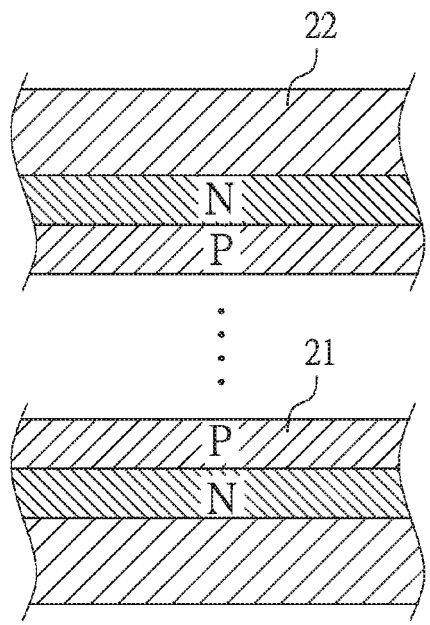

Please refer to FIGS. 2-1 and 2-2. The first epitaxial current-blocking layer 21 may be grown by a semiconductor epitaxy process. The first epitaxial current-blocking layer 21 may be formed by an N type semiconductor layer or a P type semiconductor layer. Alternatively, the first epitaxial current-blocking layer 21 may be formed by three of more layers including both N type and P type semiconductor layers. The N type and P type semiconductor layers are stacked with one another in an interlacing manner, and a total number of the stacked N type and P type semiconductor layers of the first epitaxial current-blocking layer 21 is an odd number.

In this embodiment, the first epitaxial current-blocking layer 21 may be an N type semiconductor layer or a P type semiconductor layer. The type of the semiconductor material of the first epitaxial current-blocking layer 21 is opposite to the type of the semiconductor material of the first semiconductor epitaxial layer 22. That is, when the first semiconductor epitaxial layer 22 is an N type semiconductor, the first epitaxial current-blocking layer 21 is a P type semiconductor; conversely, when the first semiconductor epitaxial layer 22 is a P type semiconductor, the first epitaxial current-blocking layer 21 is an N type semiconductor.

In this embodiment, when the first epitaxial current-blocking layer 21 is formed by three or more layers including both N type and P type semiconductors stacked with one another in an interlacing manner, the type of the semiconductor material of an uppermost layer of the first epitaxial current-blocking layer 21 and the type of the semiconductor material of a lowermost layer of the first epitaxial current-blocking layer 21 are opposite to the type of the semiconductor material of the first semiconductor epitaxial layer 22. That is, when the first semiconductor epitaxial layer 22 is a P type semiconductor, the uppermost layer and the lowermost layer of the first epitaxial current-blocking layer 21 are N type semiconductors; conversely, when the first semiconductor epitaxial layer 22 is an N type semiconductor, the uppermost layer and the lowermost layer of the first epitaxial current-blocking layer 21 are P type semiconductors.

In this embodiment, a heterojunction structure is formed on a junction interface between the first epitaxial current-blocking layer 21 and the first epitaxial semiconductor layer 22 to retard currents transmitting through the first epitaxial current-blocking layer 21 efficiently, so that currents are confined to pass only through the first current opening 211. Because the first epitaxial current-blocking layer 21 is grown by the semiconductor epitaxy process, the surface emitting laser is not damaged during the manufacturing processes, and the structure of the laser structure layer 20 can be uniform and smooth. Hence, the junction interface between the metal bonding layer 11 and the epitaxial semiconductor reflection layer 12 and the laser structure layer 20 can be combined properly to improve the performance of the surface emitting laser efficiently.

Figure 3:
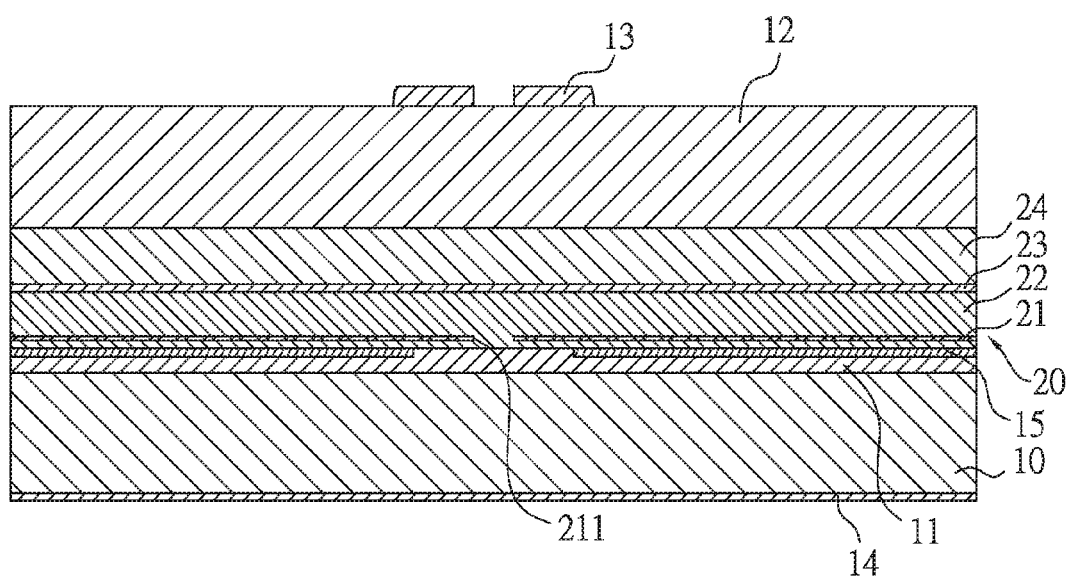
FIG. 3 illustrates a structural view of a second embodiment of the instant disclosure.

Please refer to FIG. 3, illustrating a second embodiment of the instant disclosure. In the second embodiment, the structure of the metal bonding layer 11 is different from that of the first embodiment. In the second embodiment, the surface emitting laser further comprises an insulating layer 15. A thickness of a portion of the metal bonding layer 11 corresponding to the first current opening 211 is retained, and the rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15 is on the surface of the etched portions of the metal bonding layer 11, and the surface of the retained portions of the metal bonding layer 11 is flush with the surface of the insulating layer 15 and bonded to the first semiconductor epitaxial layer 22. Hence, the currents can be gathered efficiently and prevented from being diffused. Moreover, the metal bonding layer 11 can be protected via the insulating layer 15.

Figure 4:
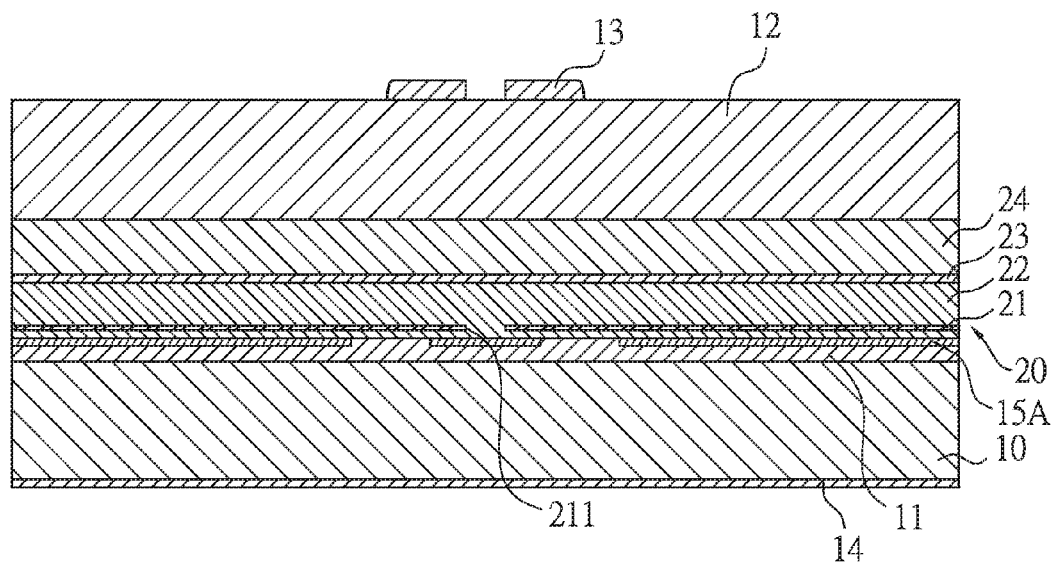
FIG. 4 illustrates a structural view of a third embodiment of the instant disclosure.

Please refer to FIG. 4, illustrating a third embodiment of the instant disclosure. In the third embodiment, the structure of the metal bonding layer 11 is different from that of the first embodiment. In the third embodiment, the surface emitting laser further comprises an insulating layer 15A. A thickness of a portion of the metal bonding layer 11 corresponding to two sides of the first current opening 211 is retained, and rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15A is on the surface of the etched portions of the metal bonding layer 11, and the surface of the retained portions of the metal bonding layer 11 is flush with the surface of the insulating layer 15A and bonded to the first semiconductor epitaxial layer 22. Hence, the currents can be gathered efficiently and prevented from being diffused. Moreover, the metal bonding layer 11 can be protected via the insulating layer 15A.

Figure 5:
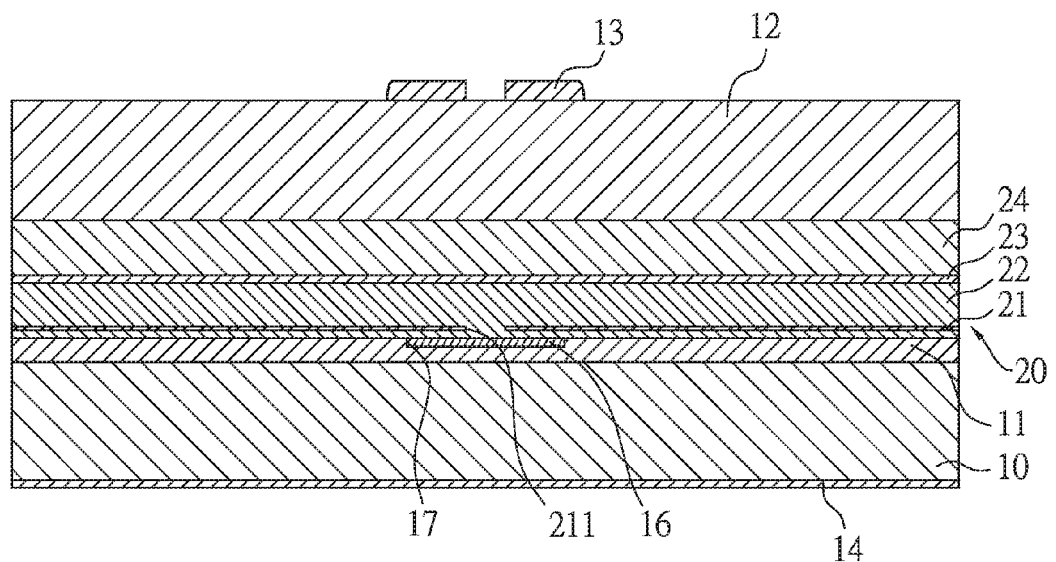
FIG. 5 illustrates a structural view of a fourth embodiment of the instant disclosure.

Please refer to FIG. 5, illustrating a fourth embodiment of the instant disclosure. In the fourth embodiment, the structure of the metal bonding layer 11 is different from that of the first embodiment. In the fourth embodiment, the surface emitting laser further comprises a conductive metal 16. A portion of the metal bonding layer 11 corresponding to the first current opening 211 is etched to form a recessed groove 17 in a semiconductor manufacturing process. The conductive metal 16 is in the recessed groove 17 to correspond to the first current opening 211. The surface of the conductive metal 16 is flush with the surface of the metal bonding layer 11 and bonded to the laser structure layer 20. Hence, via the conductive metal 16, the currents can be gathered efficiently and prevented from being diffused.

Figure 6:
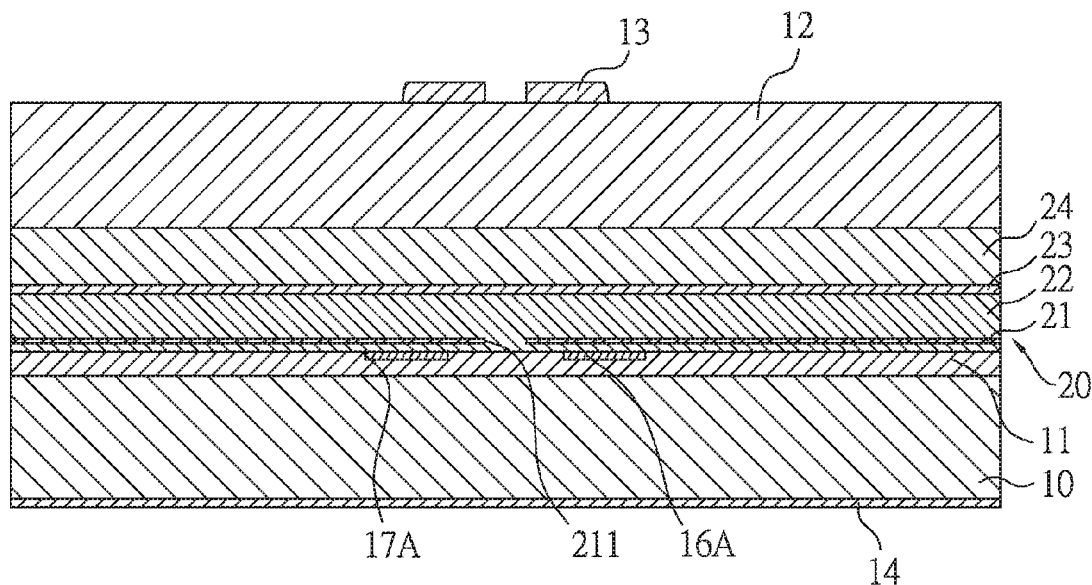
FIG. 6 illustrates a structural view of a fifth embodiment of the instant disclosure.

Please refer to FIG. 6, illustrating a fifth embodiment of the instant disclosure. In the fifth embodiment, the structure of the metal bonding layer 11 is different from that of the first embodiment. In the fifth embodiment, the surface emitting laser further comprises two conductive metals 16A. Portions of the metal bonding layer 11 respectively corresponding to the two sides of the first current opening 211 are etched downwardly to form two recessed grooves 17A in a semiconductor manufacturing process. The conductive metals 16A are in the recessed grooves 17A, respectively. The surfaces of the conductive metals 16A are flush with the surface of the metal bonding layer 11 and bonded to the laser structure layer 20. Hence, via the conductive metals 16A, the currents can be gathered efficiently and prevented from being diffused.

Figure 7:
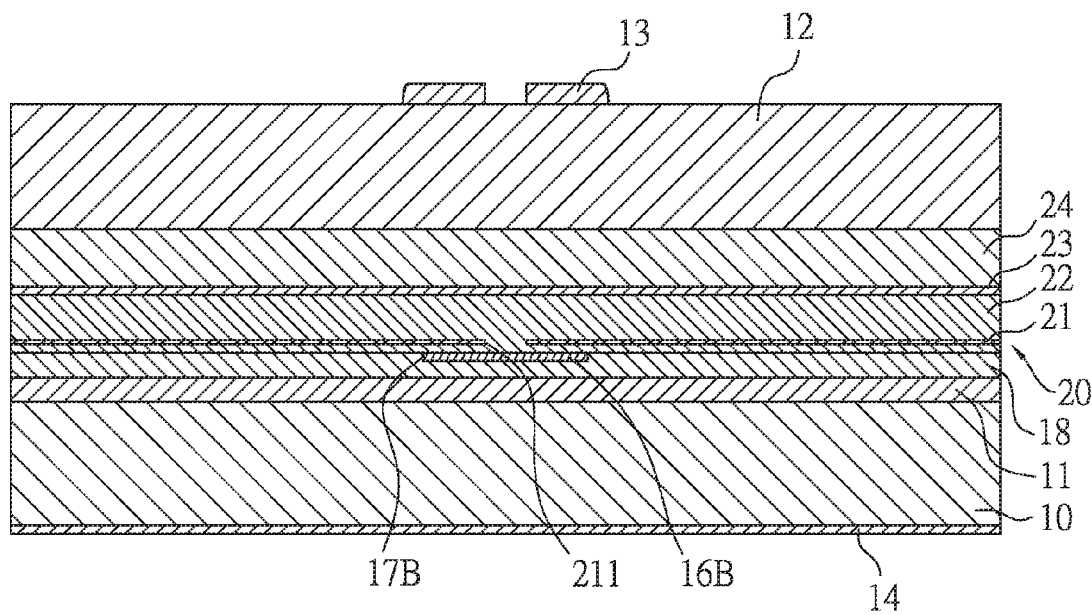
FIG. 7 illustrates a structural view of a sixth embodiment of the instant disclosure.

Please refer to FIG. 7, illustrating a sixth embodiment of the instant disclosure. In the sixth embodiment, the surface emitting laser further comprises a transparent conductive layer 18 and a conductive metal 16B. The transparent conductive layer 18 is between the metal bonding layer 11 and the laser structure layer 20. A portion of the transparent conductive layer 18 corresponding to the first current opening 211 is etched to form a recessed groove 17B in a semiconductor manufacturing process. The conductive metal 16B is in the recessed groove 17B. The surface of the conductive metal 16B is flush with the surface of the transparent conductive layer 18 and bonded to the laser structure layer 20. Hence, the mobility of the currents can be improved via the transparent conductive layer 18, and via the conductive metal 16B, the currents can be gathered efficiently and prevented from being diffused.

Figure 8:
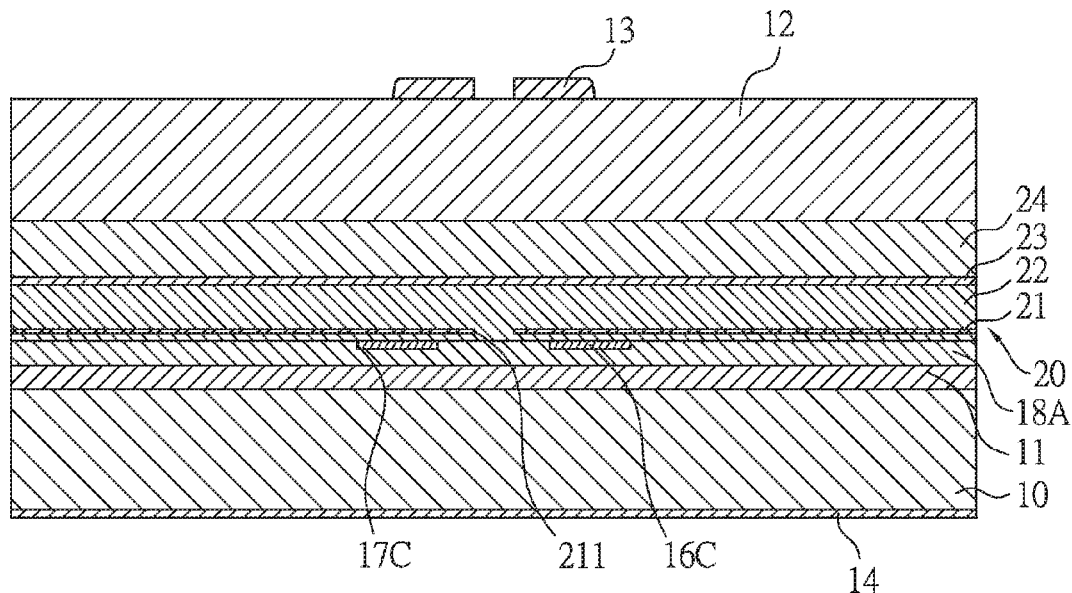
FIG. 8 illustrates a structural view of a seventh embodiment of the instant disclosure.

Please refer to FIG. 8, illustrating a seventh embodiment of the instant disclosure. In the seventh embodiment, the surface emitting laser further comprises a transparent conductive layer 18A and two conductive metals 16C. The transparent conductive layer 18A is between the metal bonding layer 11 and the laser structure layer 20. Portions of the transparent conductive layer 18A respectively corresponding to the two sides of the first current opening 211 are etched downwardly to form two recessed grooves 17C. The conductive metals 16C are in the recessed grooves 17C, respectively. The surfaces of the conductive metals 16C are flush with the surface of the transparent conductive layer 18A and bonded to the laser structure layer 20. Hence, the mobility of the currents can be improved via the transparent conductive layer 18A, and via the conductive metals 16C, the currents can be gathered efficiently and prevented from being diffused.

Figure 9:
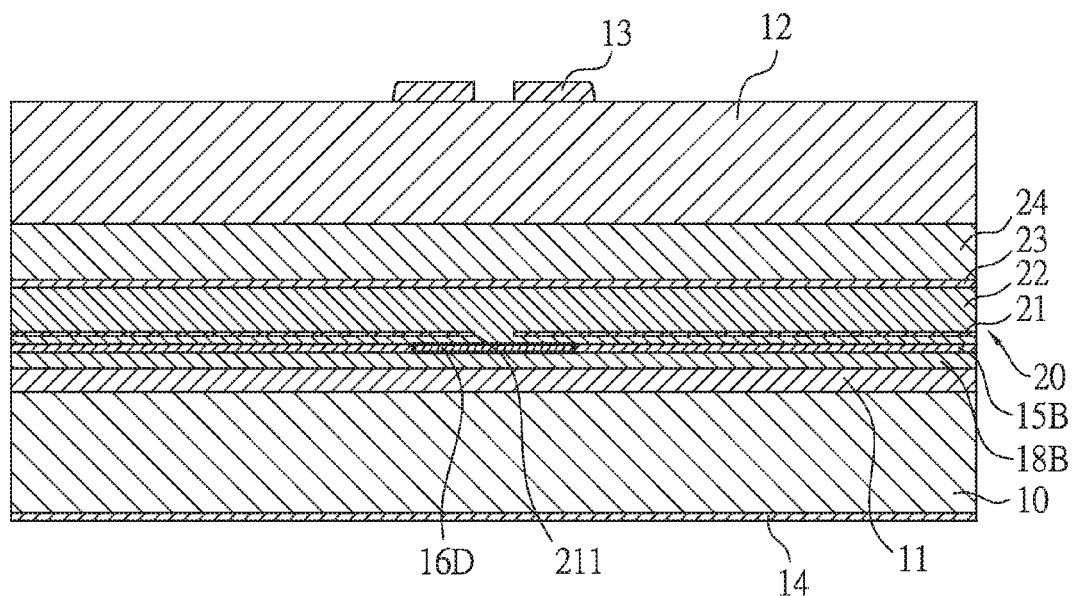
FIG. 9 illustrates a structural view of an eighth embodiment of the instant disclosure.

Please refer to FIG. 9, illustrating an eighth embodiment of the instant disclosure. In the eighth embodiment, the surface emitting laser further comprises a transparent conductive layer 18B, a conductive metal 16D, and an insulating layer 15B. The transparent conductive layer 18B is between the metal bonding layer 11 and the laser structure layer 20. The conductive metal 16D is on a portion of the transparent conductive layer 18B corresponding to the first current opening 211 and the conductive metal 16D corresponds to the first current opening 211. The insulating layer 15B is on the surface of the transparent conductive layer 18B and surrounds the conductive metal 16D. The surface of the insulating layer 15B is flush with the surface of the conductive metal 16D and bonded to the laser structure layer 20. Hence, via the conductive metal 16D, the currents can be gathered efficiently and prevented from being diffused. Furthermore, the insulating layer 15B can protect the transparent conductive layer 18B. Moreover, the mobility of the currents can be improved via the transparent conductive layer 18B.

Figure 10:
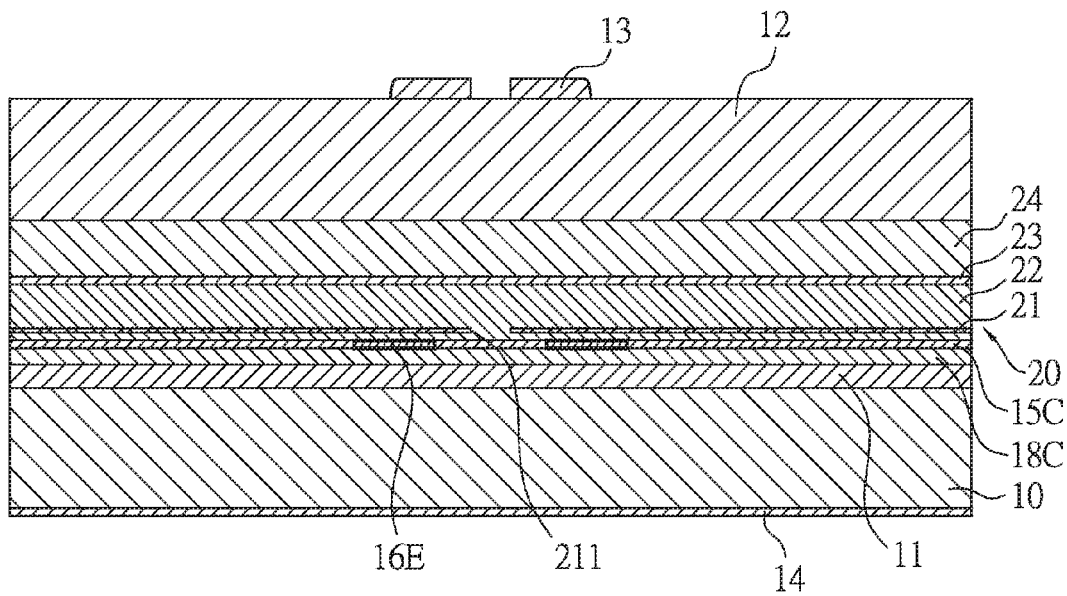
FIG. 10 illustrates a structural view of a ninth embodiment of the instant disclosure.

Please refer to FIG. 10, illustrating a ninth embodiment of the instant disclosure. In the ninth embodiment, the surface emitting laser further comprises a transparent conductive layer 18C, two conductive metals 16E, and an insulating layer 15C. The transparent conductive layer 18C is between the metal bonding layer 11 and the laser structure layer 20. The conductive metals 16E are on portions of the transparent conductive layer 18C corresponding to the two sides of the first current opening 211, respectively. The insulating layer 15C is on the surface of the transparent conductive layer 18C and surrounds the conductive metals 16E. The surface of the insulating layer 15C is flush with the surfaces of the conductive metals 16E and bonded to the laser structure layer 20. Hence, via the conductive metals 16E, the currents can be gathered efficiently and prevented from being diffused. Furthermore, the insulating layer 15C can protect the transparent conductive layer 18C and the insulating layer 15C can prevent the currents from transmitting through other portions. Moreover, the mobility of the currents can be improved via the transparent conductive layer 18C.

Figure 11:
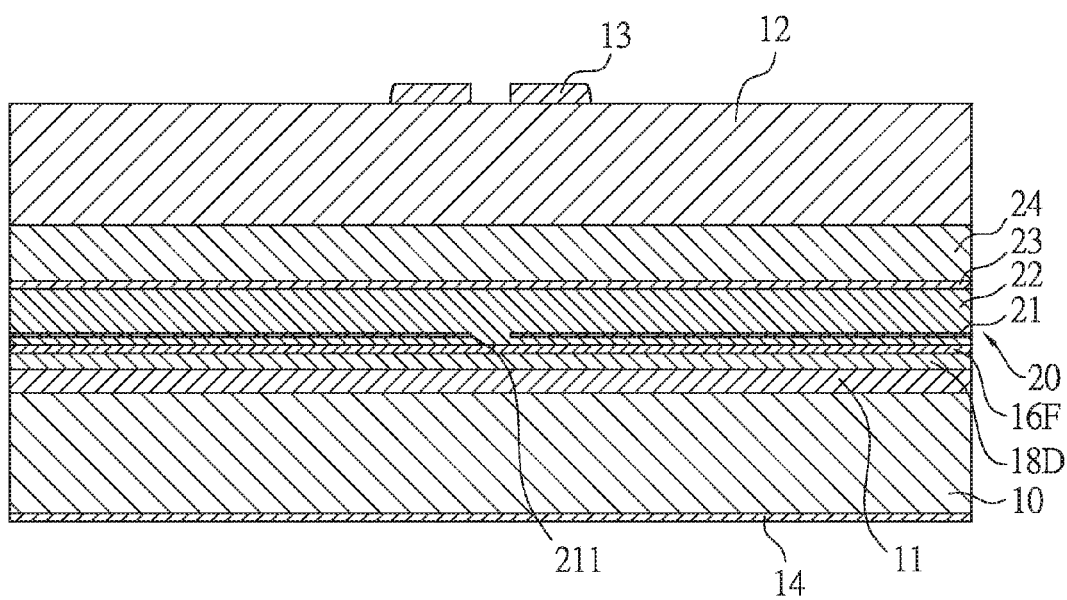
FIG. 11 illustrates a structural view of a tenth embodiment of the instant disclosure.

Please refer to FIG. 11, illustrating a tenth embodiment of the instant disclosure. In the tenth embodiment, the surface emitting laser further comprises a transparent conductive layer 18D and a layer of conductive metal 16F. The transparent conductive layer 18D is between the metal bonding layer 11 and the laser structure layer 20. The conductive metal 16F is between the transparent conductive layer 18D and the laser structure layer 20. The conductive metal 16F is a whole layer to correspond to the transparent conductive layer 18D and the laser structure layer 20. Hence, the mobility of the currents can be improved via the transparent conductive layer 18D. Moreover, the layer of the conductive metal 16F allows the currents to pass through the surface emitting laser evenly.

Figure 12:
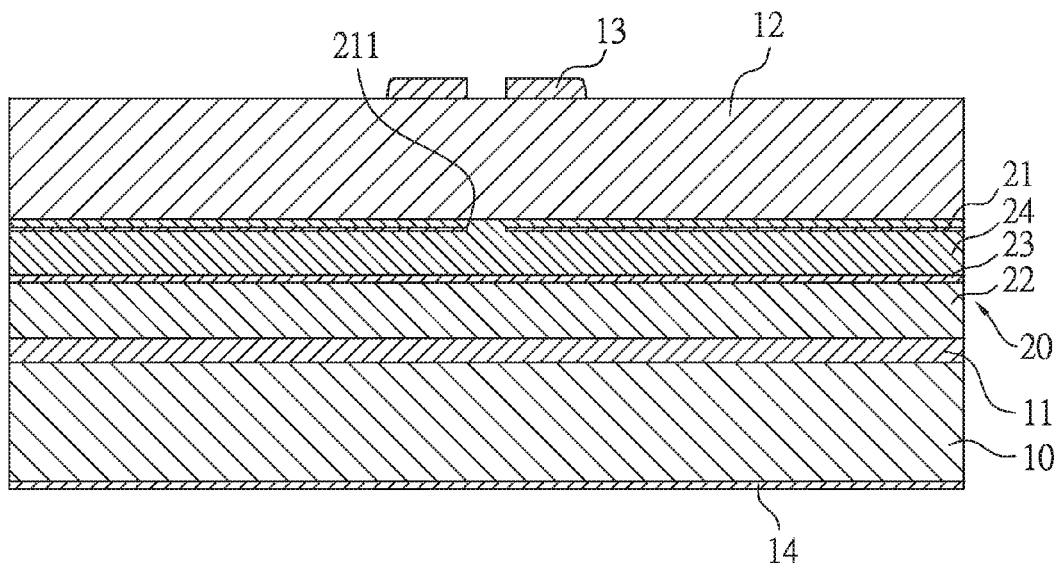
FIG. 12 illustrates a structural view of an eleventh embodiment of the instant disclosure.

Please refer to FIG. 12, illustrating an eleventh embodiment of the instant disclosure. In the eleventh embodiment, the position of the first epitaxial current-blocking layer 21 is different from that of the first embodiment. In the eleventh embodiment, the first epitaxial current-blocking layer 21 is in the second semiconductor epitaxial layer 24. When the first epitaxial current-blocking layer 21 is an N type semiconductor layer or a P type semiconductor layer, the type of the semiconductor material of the first epitaxial current-blocking layer 21 is opposite to the type of the semiconductor material of the second semiconductor epitaxial layer 24. When the first epitaxial current-blocking layer 21 is formed by three of more layers including both N type and P type semiconductor layers stacked with one another in an interlacing manner, the type of the semiconductor material of an uppermost layer of the first epitaxial current-blocking layer 21 and the type of the semiconductor material of a lowermost layer of the first epitaxial current-blocking layer 21 are opposite to the type of the semiconductor material of the second semiconductor epitaxial layer 24.

Figure 13:
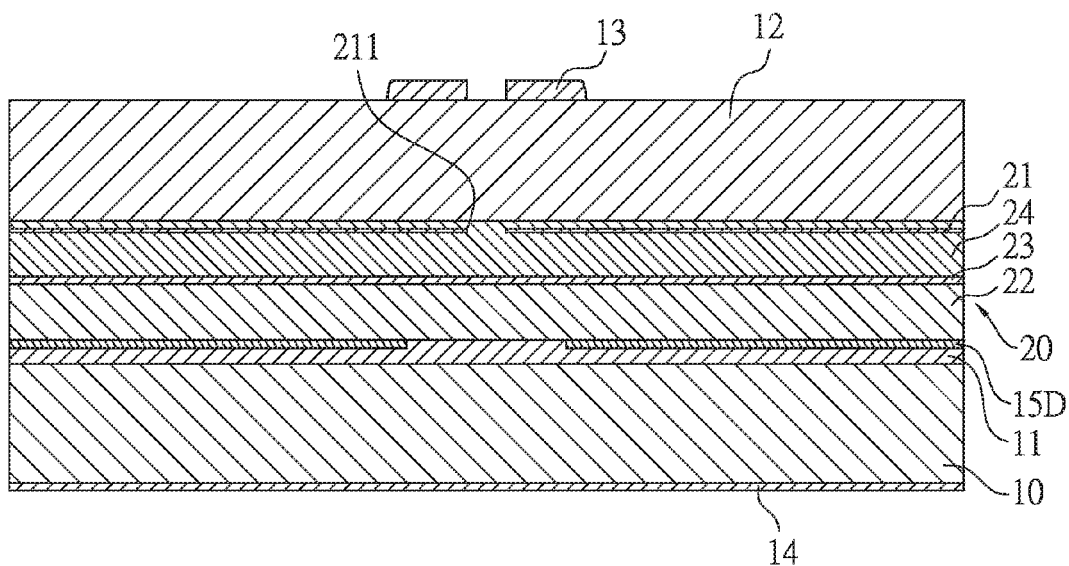
FIG. 13 illustrates a structural view of a twelfth embodiment of the instant disclosure.

Please refer to FIG. 13, illustrating a twelfth embodiment of the instant disclosure. In the twelfth embodiment, the surface emitting laser further comprises an insulating layer 15D. A thickness of a portion of the metal bonding layer 11 corresponding to the first current opening 211 is retained, and the rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15D is on the surface of the etched portions of the metal bonding layer 11, and the surface of the retained portions of the metal bonding layer 11 is flush with the surface of the insulating layer 15D and bonded to the first semiconductor epitaxial layer 22. Hence, the currents can be gathered efficiently and prevented from being diffused. Moreover, the metal bonding layer 11 can be protected via the insulating layer 15.

Figure 14:
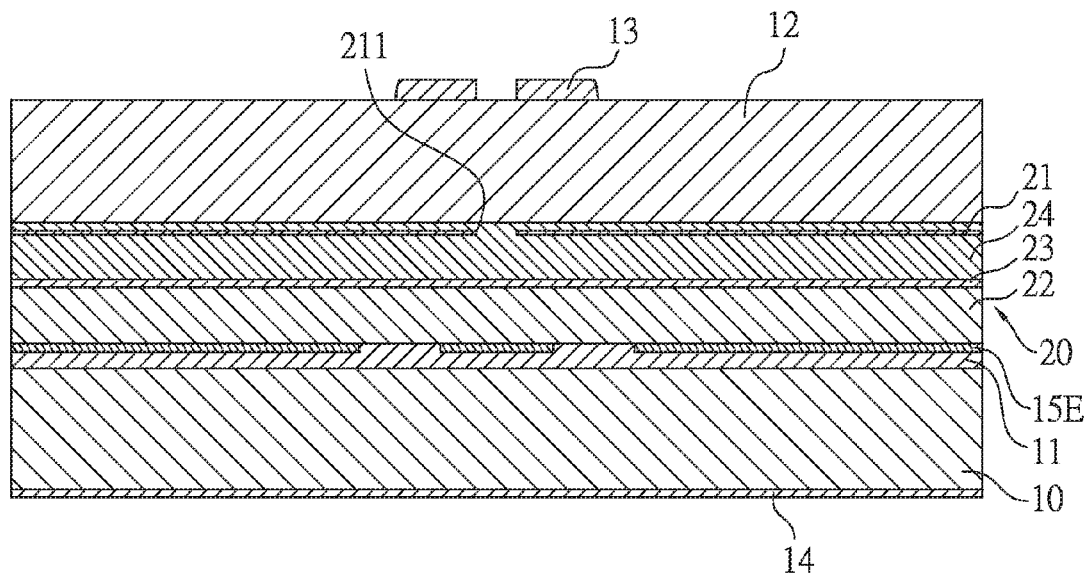
FIG. 14 illustrates a structural view of a thirteenth embodiment of the instant disclosure.

Please refer to FIG. 14, illustrating a thirteenth embodiment of the instant disclosure. In the thirteenth embodiment, the surface emitting laser further comprises an insulating layer 15E. A thickness of a portion of the metal bonding layer 11 corresponding to two sides of the first current opening 211 is retained, and rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15E is on the surface of the etched portions of the metal bonding layer 11, and the surface of the retained portions of the metal bonding layer 11 is flush with the surface of the insulating layer 15E and bonded to the first semiconductor epitaxial layer 22. Hence, the currents can be gathered efficiently and prevented from being diffused. Moreover, the metal bonding layer 11 can be protected via the insulating layer 15E.

Figure 15:
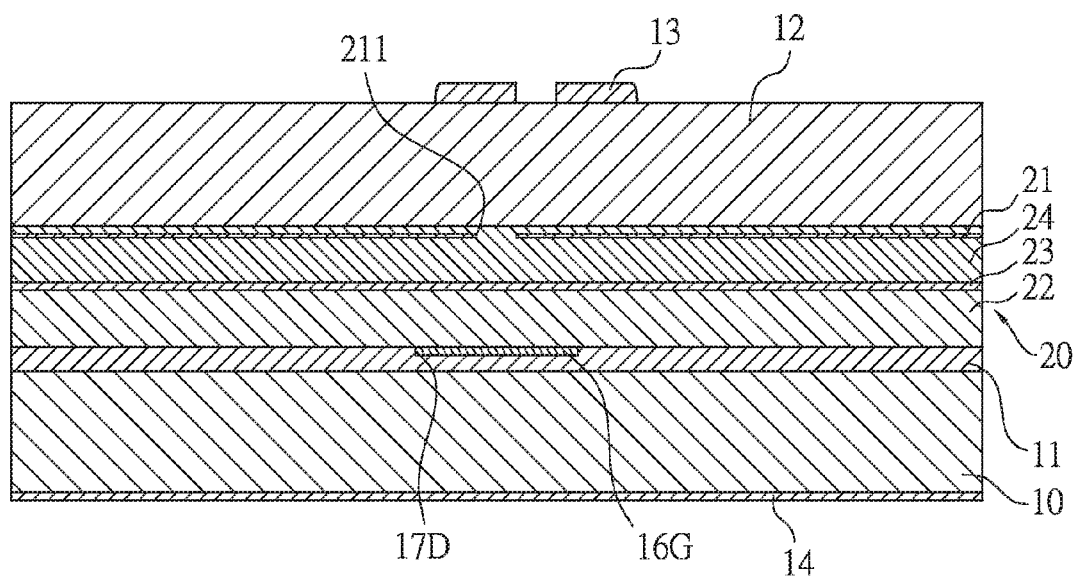
FIG. 15 illustrates a structural view of a fourteenth embodiment of the instant disclosure.

Please refer to FIG. 15, illustrating a fourteenth embodiment of the instant disclosure. In the fourteenth embodiment, the surface emitting laser further comprises a conductive metal 16G A portion of the metal bonding layer 11 corresponding to the first current opening 211 is etched downwardly to form a recessed groove 17D in a semiconductor manufacturing process. The conductive metal 16G is in the recessed groove 17D to correspond to the first current opening 211. The surface of the conductive metal 16G is flush with the surface of the metal bonding layer 11 and bonded to the laser structure layer 20. Hence, via the conductive metal 16G the currents can be gathered efficiently and prevented from being diffused.

Figure 16:
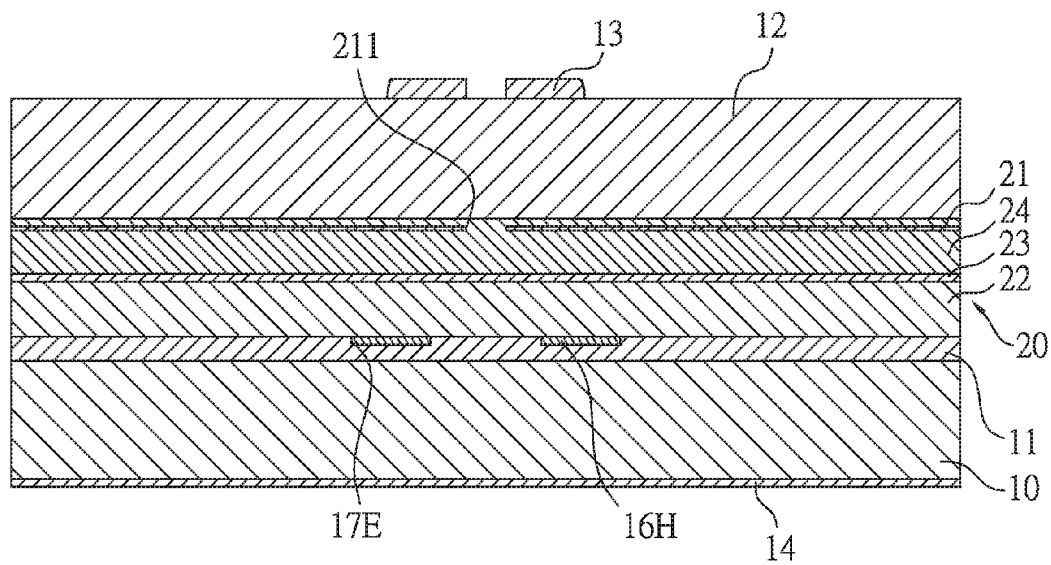
FIG. 16 illustrates a structural view of a fifteenth embodiment of the instant disclosure.

Please refer to FIG. 16, illustrating a fifteenth embodiment of the instant disclosure. In the fifteenth embodiment, the surface emitting laser further comprises two conductive metals 16H. Portions of the metal bonding layer 11 respectively corresponding to the two sides of the first current opening 211 are etched downwardly to form two recessed grooves 17E in a semiconductor manufacturing process. The conductive metals 16H are in the recessed grooves 17E, respectively. The surfaces of the conductive metals 16H are flush with the surface of the metal bonding layer 11 and bonded to the laser structure layer 20. Hence, via the conductive metals 16H, the currents can be gathered efficiently and prevented from being diffused.

Figure 17:
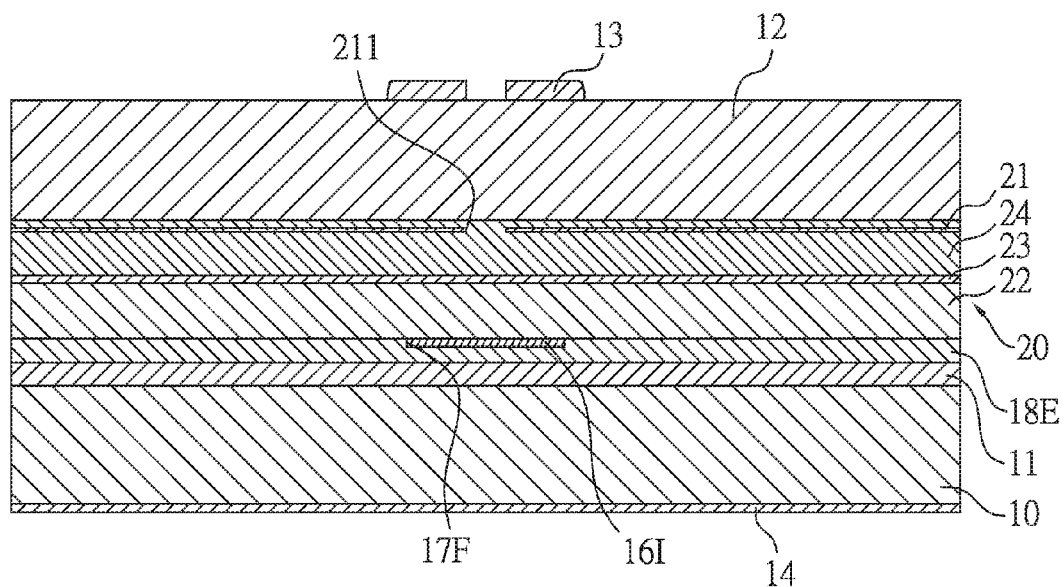
FIG. 17 illustrates a structural view of a sixteenth embodiment of the instant disclosure.

Please refer to FIG. 17, illustrating a sixteenth embodiment of the instant disclosure. In the sixteenth embodiment, the surface emitting laser further comprises a transparent conductive layer 18E and a conductive metal 161. The transparent conductive layer 18E is between the metal bonding layer 11 and the laser structure layer 20. A portion of the transparent conductive layer 18E corresponding to the first current opening 211 is etched to form a recessed groove 17F in a semiconductor manufacturing process. The conductive metal 161 is in the recessed groove 17F. The surface of the conductive metal 161 is flush with the surface of the transparent conductive layer 18E and bonded to the laser structure layer 20. Hence, the mobility of the currents can be improved via the transparent conductive layer 18E, and via the conductive metal 161, the currents can be gathered efficiently and prevented from being diffused.

Figure 18:
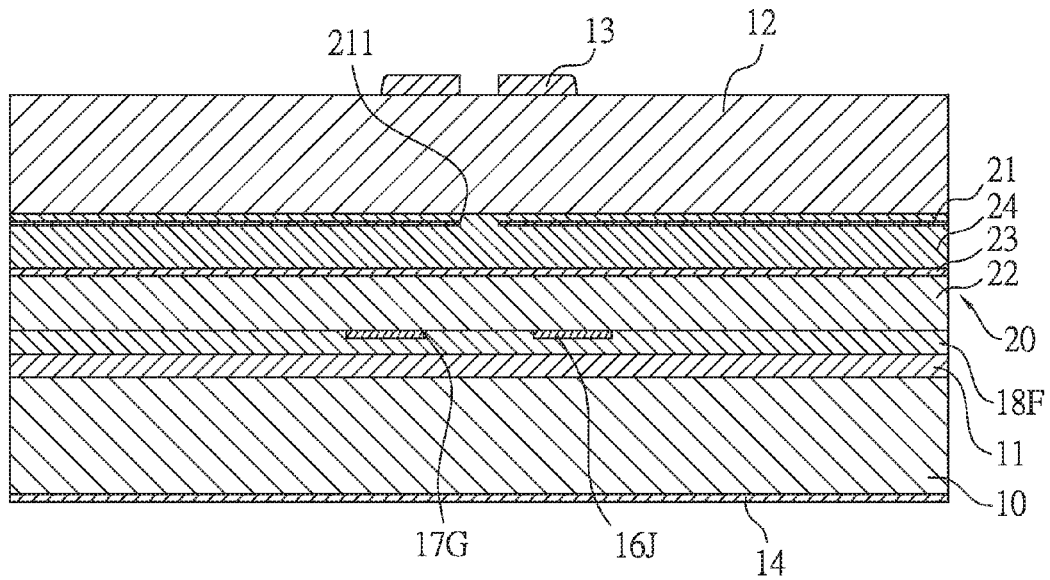
FIG. 18 illustrates a structural view of a seventeenth embodiment of the instant disclosure.

Please refer to FIG. 18, illustrating a seventeenth embodiment of the instant disclosure. In the seventeenth embodiment, the surface emitting laser further comprises a transparent conductive layer 18F and two conductive metals 16J. The transparent conductive layer 18F is between the metal bonding layer 11 and the laser structure layer 20. Portions of the transparent conductive layer 18F respectively corresponding to the two sides of the first current opening 211 are etched downwardly to form two recessed grooves 17G. The conductive metals 16J are in the recessed grooves 17G respectively. The surfaces of the conductive metals 16J are flush with the surface of the transparent conductive layer 18F and bonded to the laser structure layer 20. Hence, the mobility of the currents can be improved via the transparent conductive layer 18F, and via the conductive metals 16J, the currents can be gathered efficiently and prevented from being diffused.

Figure 19:
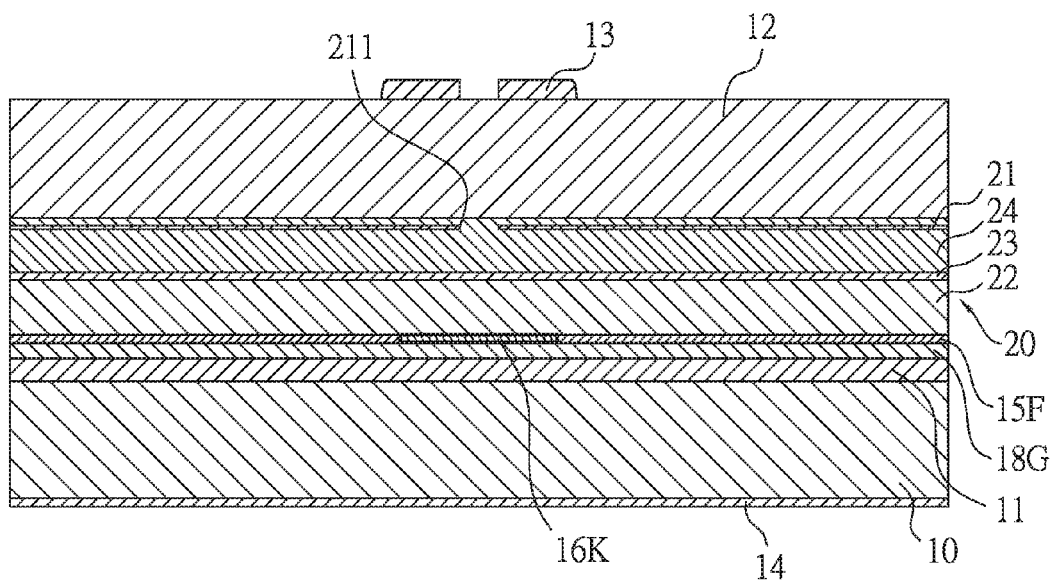
FIG. 19 illustrates a structural view of an eighteenth embodiment of the instant disclosure.

Please refer to FIG. 19, illustrating an eighteenth embodiment of the instant disclosure. In the eighteenth embodiment, the surface emitting laser further comprises a transparent conductive layer 186G, a conductive metal 16K, and an insulating layer 15F. The transparent conductive layer 18G is between the metal bonding layer 11 and the laser structure layer 20. The conductive metal 16K is on a portion of the transparent conductive layer 18G corresponding to the first current opening 211 and the conductive metal 16K corresponds to the first current opening 211. The insulating layer 15F is on the surface of the transparent conductive layer 18G and surrounds the conductive metal 16K. The surface of the insulating layer 15F is flush with the surface of the conductive metal 16K and bonded to the laser structure layer 20. Hence, the mobility of the currents can be improved via the transparent conductive layer 18G. Moreover, via the conductive metal 16K, the currents can be gathered efficiently and prevented from being diffused. Furthermore, the insulating layer 15B can protect the transparent conductive layer 18B and prevent the currents from transmitting through other portions.

Figure 20:
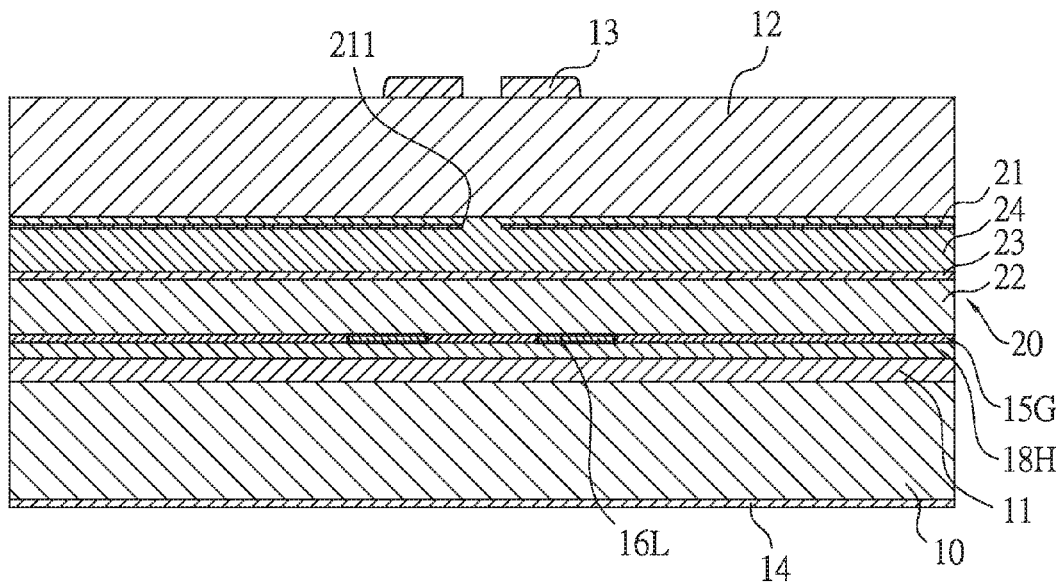
FIG. 20 illustrates a structural view of a nineteenth embodiment of the instant disclosure.

Please refer to FIG. 20, illustrating a nineteenth embodiment of the instant disclosure. In the nineteenth embodiment, the surface emitting laser further comprises a transparent conductive layer 18H, two conductive metals 16L, and an insulating layer 15G The transparent conductive layer 18H is between the metal bonding layer 11 and the laser structure layer 20. The conductive metals 16L are on portions of the transparent conductive layer 18H corresponding to the two sides of the first current opening 211, respectively. The insulating layer 15G is on the surface of the transparent conductive layer 18H and surrounds the conductive metals 16L. The surface of the insulating layer 15G is flush with the surfaces of the conductive metals 16L and bonded to the laser structure layer 20. Hence, the mobility of the currents can be improved via the transparent conductive layer 18H. Moreover, via the conductive metals 16L, the currents can be gathered efficiently and prevented from being diffused. Furthermore, the insulating layer 15G can protect the transparent conductive layer 18H and prevent the currents from transmitting through other portions.

Figure 21:
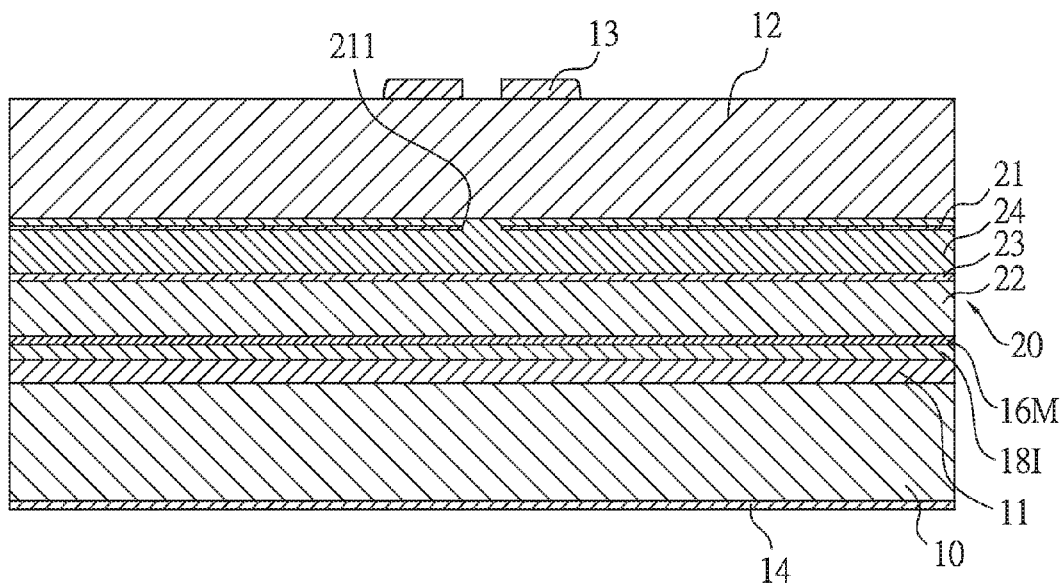
FIG. 21 illustrates a structural view of a twentieth embodiment of the instant disclosure.

Please refer to FIG. 21, illustrating a twentieth embodiment of the instant disclosure. In the twentieth embodiment, the surface emitting laser further comprises a transparent conductive layer 18I and a layer of conductive metal 16M. The transparent conductive layer 18I is between the metal bonding layer 11 and the laser structure layer 20. The conductive metal 16M is between the transparent conductive layer 18I and the laser structure layer 20. The conductive metal 16M is a whole layer to correspond to the transparent conductive layer 18I and the laser structure layer 20. Hence, the mobility of the currents can be improved via the transparent conductive layer 18I. Moreover, the layer of the conductive metal 16M allows the currents to pass through the surface emitting laser evenly.

Figure 22:
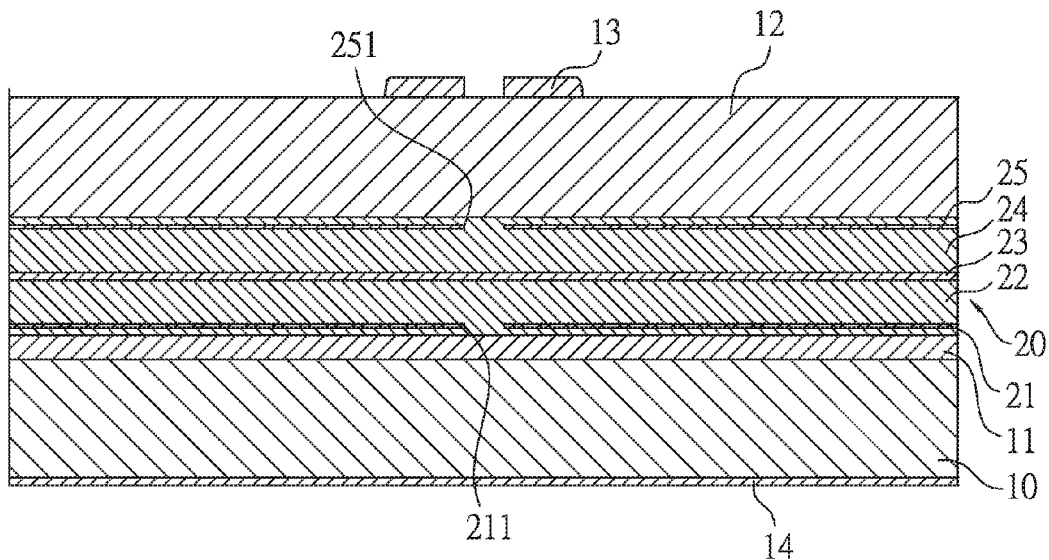
FIG. 22 illustrates a structural view of a twenty-first embodiment of the instant disclosure.

Please refer to FIG. 22, illustrating a twenty-first embodiment of the instant disclosure. In the twenty-first embodiment, the surface emitting laser further comprises a second epitaxial current-blocking layer 25. The second epitaxial current-blocking layer 25 is in the second semiconductor epitaxial layer 24. A middle portion of the second epitaxial current-blocking layer 25 has a second current opening 251 corresponding to the first current opening 211, so that currents can be transmitted between the first electrode layer 13 and the metal bonding layer 11.

In this embodiment, the second epitaxial current-blocking layer 25 and the first epitaxial current-blocking layer 21 are the same. When the second epitaxial current-blocking layer 25 is an N type semiconductor layer or a P type semiconductor layer, the type of the semiconductor material of the second epitaxial current-blocking layer 25 is opposite to the type of the semiconductor material of the second semiconductor epitaxial layer 24. When the second epitaxial current-blocking layer 25 is formed by three or more layers including both N type and P type semiconductor layers stacked with one another in an interlacing manner, the type of the semiconductor material of an uppermost layer of the second epitaxial current-blocking layer 25 and the type of the semiconductor material of a lowermost layer of the second epitaxial current-blocking layer 25 are opposite to the type of the semiconductor material of the second semiconductor epitaxial layer 24.

Figure 23:
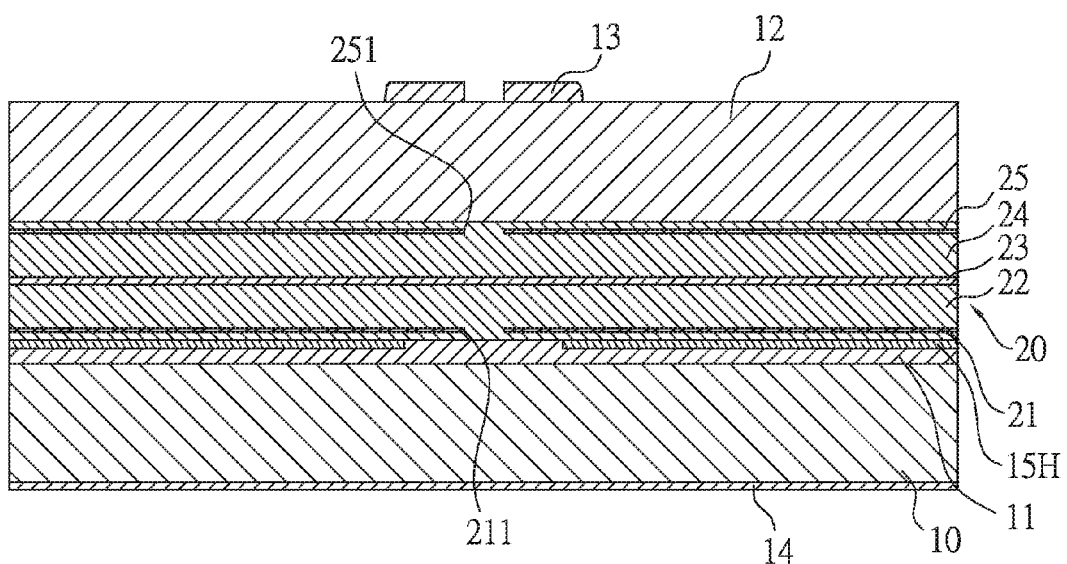
FIG. 23 illustrates a structural view of a twenty-second embodiment of the instant disclosure.

Please refer to FIG. 23, illustrating a twenty-second embodiment of the instant disclosure. In the twenty-second embodiment, the structure of the metal bonding layer 11 is different from that of the twenty-first embodiment. In the twenty-second embodiment, the surface emitting laser further comprises an insulating layer 15H. A thickness of a portion of the metal bonding layer 11 corresponding to the first current opening 211 is retained, and the rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15H is on the surface of the etched portions of the metal bonding layer 11, and the surface of the retained portions of the metal bonding layer 11 is flush with the surface of the insulating layer 15H and bonded to the first semiconductor epitaxial layer 22. Hence, the currents can be gathered efficiently and prevented from being diffused. Moreover, the metal bonding layer 11 can be protected via the insulating layer 15H.

Figure 24:
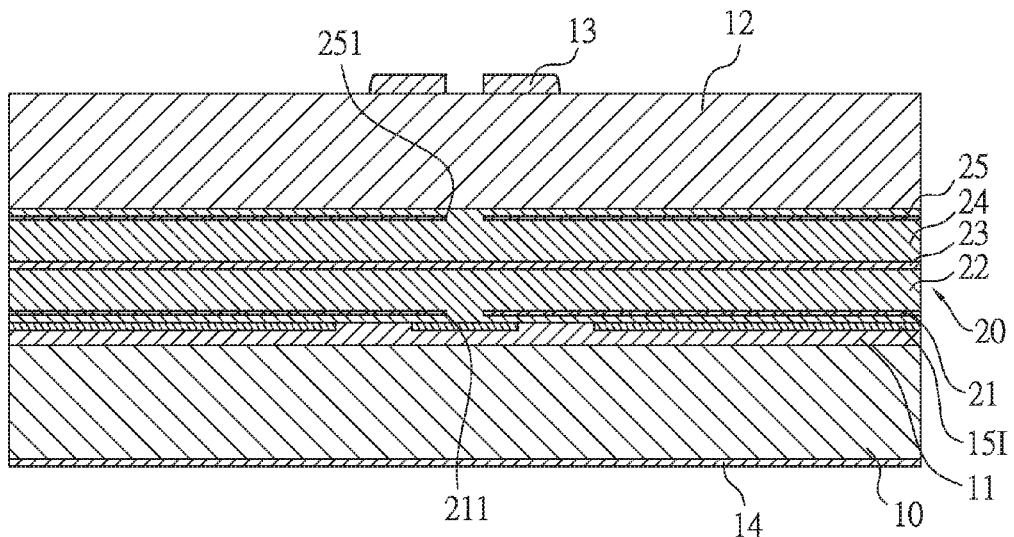
FIG. 24 illustrates a structural view of a twenty-third embodiment of the instant disclosure.

Please refer to FIG. 24, illustrating a twenty-third embodiment of the instant disclosure. In the twenty-third embodiment, the structure of the metal bonding layer 11 is different from that of the twenty-first embodiment. In the twenty-third embodiment, the surface emitting laser further comprises an insulating layer 15I. A thickness of a portion of the metal bonding layer 11 corresponding to two sides of the first current opening 211 is retained, and rest portions of the metal bonding layer 11 are etched downwardly by a depth via a semiconductor manufacturing process. The depth may be determined by the practical conditions of the manufacturing process. The maximized depth is about half of the thickness of the metal bonding layer 11. The insulating layer 15I is on the surface of the etched portions of the metal bonding layer 11, and the surface of the retained portions of the metal bonding layer 11 is flush with the surface of the insulating layer 15I and bonded to the first semiconductor epitaxial layer 22. Hence, the currents can be gathered efficiently and prevented from being diffused. Moreover, the insulating layer 15I can protect the metal bonding layer 11 and prevent the currents from transmitting through other portions.

Figure 25:
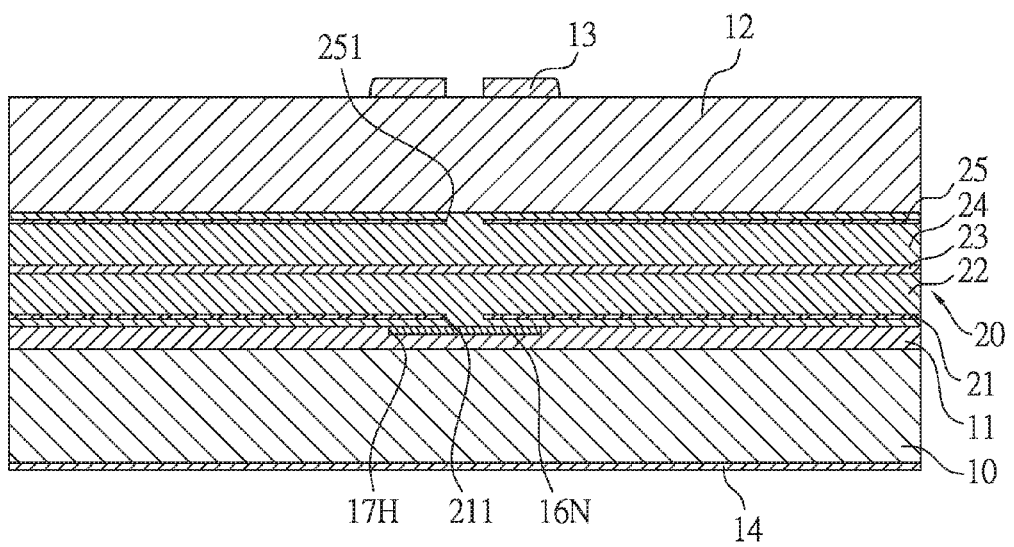
FIG. 25 illustrates a structural view of a twenty-fourth embodiment of the instant disclosure.

Please refer to FIG. 25, illustrating a twenty-fourth embodiment of the instant disclosure. In the twenty-fourth embodiment, the structure of the metal bonding layer 11 is different from that of the twenty-first embodiment. In the twenty-fourth embodiment, the surface emitting laser further comprises a conductive metal 16N. A portion of the metal bonding layer 11 corresponding to the first current opening 211 is etched to form a recessed groove 17H in a semiconductor manufacturing process. The conductive metal 16N is in the recessed groove 17H to correspond to the first current opening 211. The surface of the conductive metal 16N is flush with the surface of the metal bonding layer 11 and bonded to the laser structure layer 20. Hence, via the conductive metal 16N, the currents can be gathered efficiently and prevented from being diffused.

Figure 26:
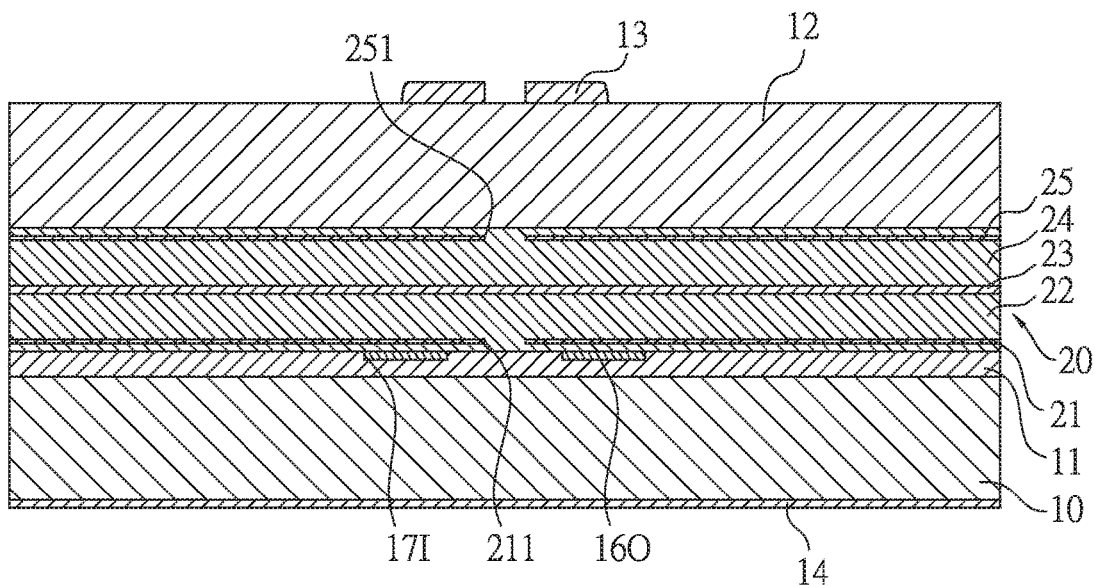
FIG. 26 illustrates a structural view of a twenty-fifth embodiment of the instant disclosure.

Please refer to FIG. 26, illustrating a twenty-fifth embodiment of the instant disclosure. In the twenty-fifth embodiment, the structure of the metal bonding layer 11 is different from that of the twenty-first embodiment. In the twenty-fifth embodiment, the surface emitting laser further comprises two conductive metals 16O. Portions of the metal bonding layer 11 respectively corresponding to the two sides of the first current opening 211 are etched downwardly to form two recessed grooves 17I in a semiconductor manufacturing process. The conductive metals 16O are in the recessed grooves 17I, respectively. The surfaces of the conductive metals 16O are flush with the surface of the metal bonding layer 11 and bonded to the laser structure layer 20. Hence, via the conductive metals 16O, the currents can be gathered efficiently and prevented from being diffused.

Figure 27:
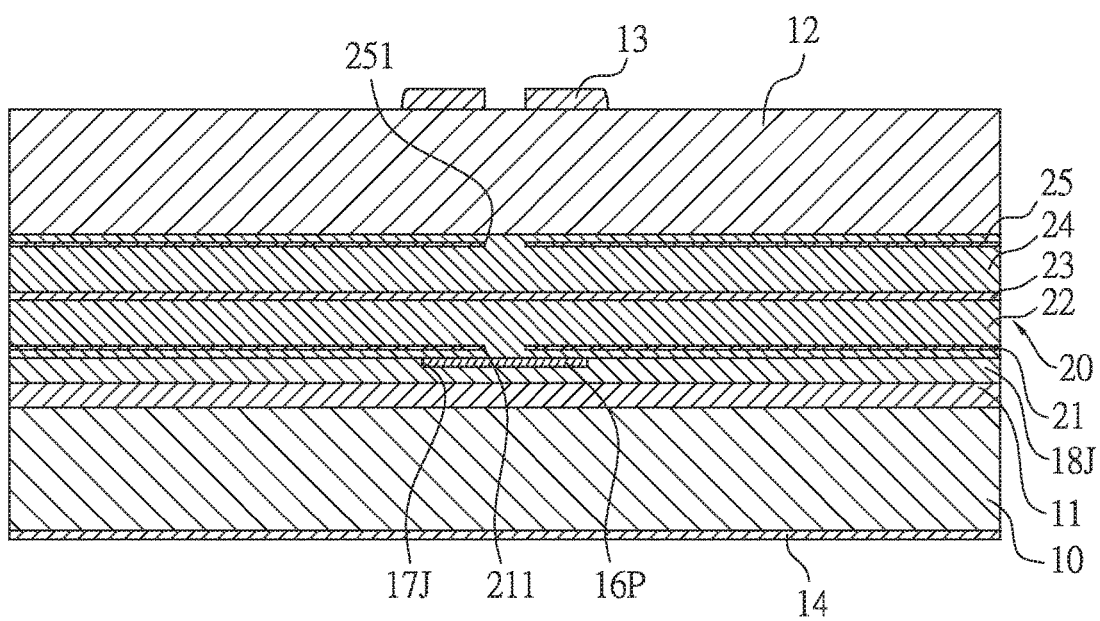
FIG. 27 illustrates a structural view of a twenty-sixth embodiment of the instant disclosure.

Please refer to FIG. 27, illustrating a twenty-sixth embodiment of the instant disclosure. In the twenty-sixth embodiment, the surface emitting laser further comprises a transparent conductive layer 18J and a conductive metal 16P. The transparent conductive layer 18J is between the metal bonding layer 11 and the laser structure layer 20. A portion of the transparent conductive layer 18J corresponding to the first current opening 211 is etched to form a recessed groove 17J in a semiconductor manufacturing process. The conductive metal 16P is in the recessed groove 17J. The surface of the conductive metal 16P is flush with the surface of the transparent conductive layer 18J and bonded to the laser structure layer 20. Hence, via the conductive metal 16P, the currents can be gathered efficiently and prevented from being diffused, and the mobility of the currents can be improved via the transparent conductive layer 18J.

Figure 28:
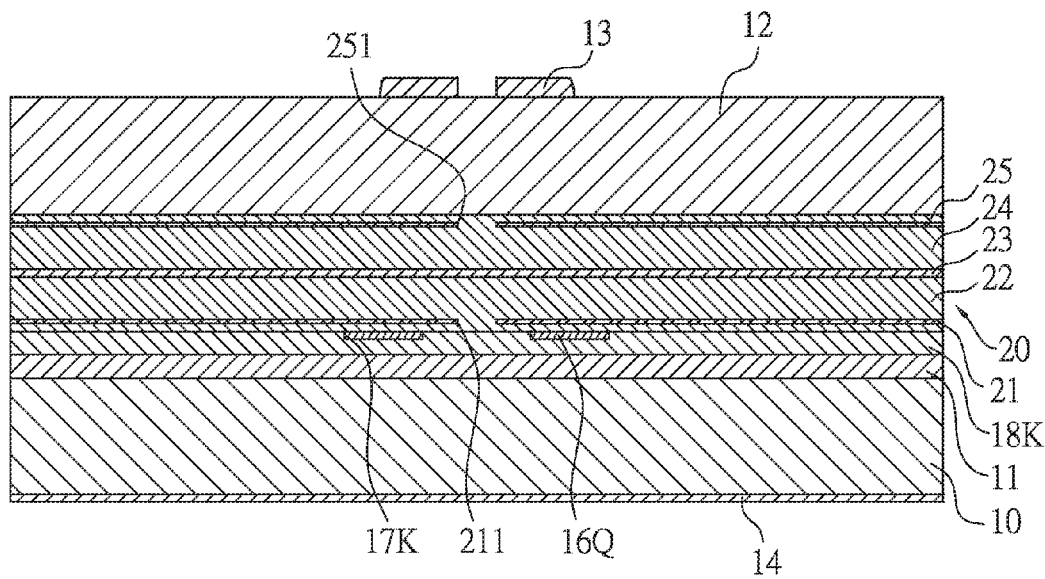
FIG. 28 illustrates a structural view of a twenty-seventh embodiment of the instant disclosure.

Please refer to FIG. 28, illustrating a twenty-seventh embodiment of the instant disclosure. In the twenty-seventh embodiment, the surface emitting laser further comprises a transparent conductive layer 18K and two conductive metals 16Q. The transparent conductive layer 18K is between the metal bonding layer 11 and the laser structure layer 20. Portions of the transparent conductive layer 18K respectively corresponding to the two sides of the first current opening 211 are etched downwardly to form two recessed grooves 17K. The conductive metals 16Q are in the recessed grooves 17K, respectively. The surfaces of the conductive metals 16Q are flush with the surface of the transparent conductive layer 18K and bonded to the laser structure layer 20. Hence, via the conductive metals 16Q, the currents can be gathered efficiently and prevented from being diffused, and the mobility of the currents can be improved via the transparent conductive layer 18K.

Figure 29:
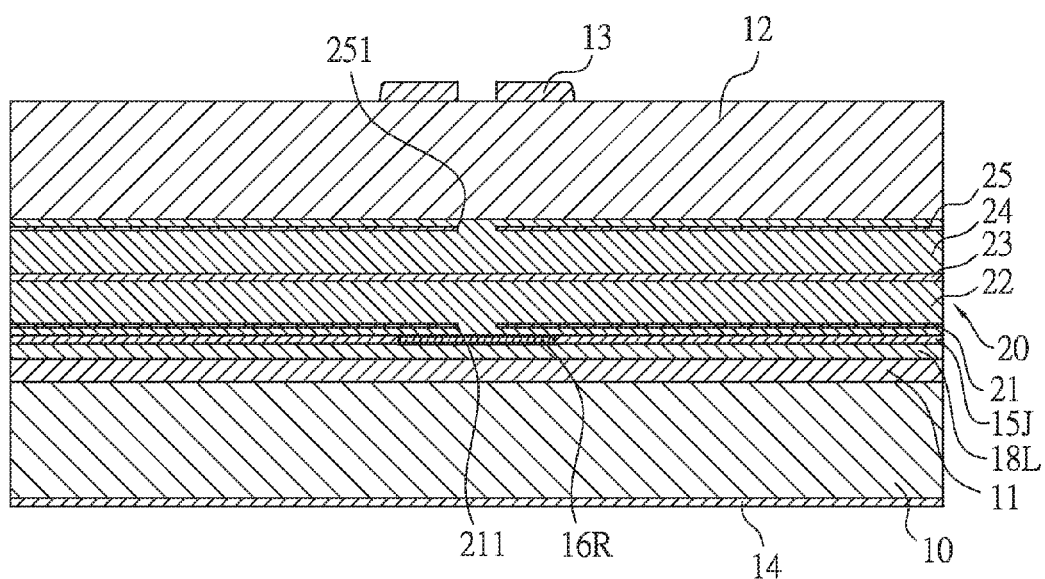
FIG. 29 illustrates a structural view of a twenty-eighth embodiment of the instant disclosure.

Please refer to FIG. 29, illustrating a twenty-eighth embodiment of the instant disclosure. In the twenty-eighth embodiment, the surface emitting laser further comprises a transparent conductive layer 18L, a conductive metal 16R, and an insulating layer 15J. The transparent conductive layer 18L is between the metal bonding layer 11 and the laser structure layer 20. The conductive metal 16R is on a portion of the transparent conductive layer 18L corresponding to the first current opening 211 and the conductive metal 16R corresponds to the first current opening 211. The insulating layer 15J is on the surface of the transparent conductive layer 18L and surrounds the conductive metal 16R. The surface of the insulating layer 15J is flush with the surface of the conductive metal 16R and bonded to the laser structure layer 20. Hence, via the conductive metal 16R, the currents can be gathered efficiently and prevented from being diffused. Moreover, the mobility of the currents can be improved via the transparent conductive layer 18L. Furthermore, the insulating layer 15J can protect the transparent conductive layer 18L and prevent the currents from transmitting through other portions.

Figure 30:
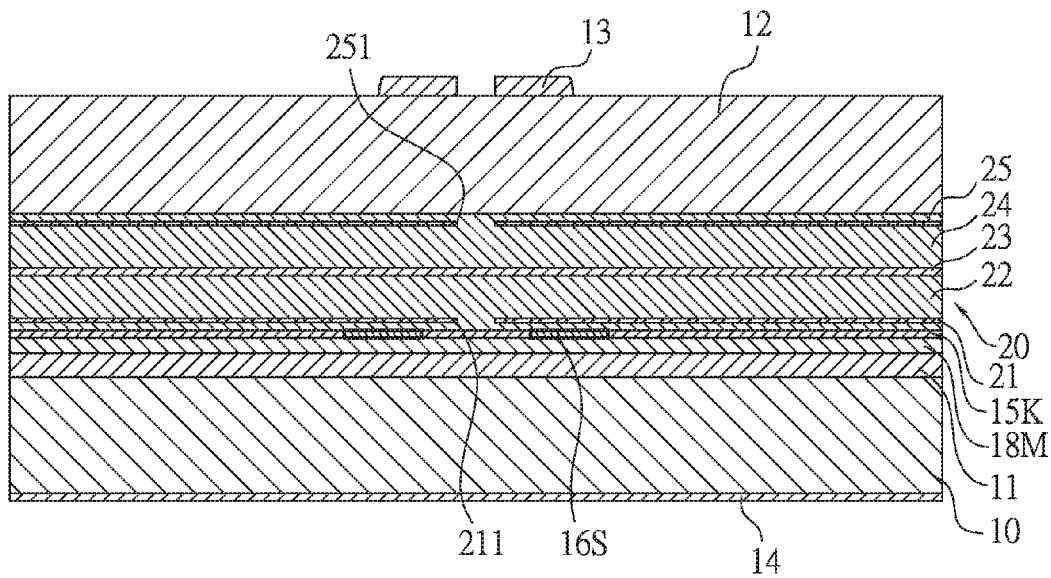
FIG. 30 illustrates a structural view of a twenty-ninth embodiment of the instant disclosure.

Please refer to FIG. 30, illustrating a twenty-ninth embodiment of the instant disclosure. In the twenty-ninth embodiment, the surface emitting laser further comprises a transparent conductive layer 18M, two conductive metals 16S, and an insulating layer 15K. The transparent conductive layer 18M is between the metal bonding layer 11 and the laser structure layer 20. The conductive metals 16S are on portions of the transparent conductive layer 18M corresponding to the two sides of the first current opening 211, respectively. The insulating layer 15K is on the surface of the transparent conductive layer 18M and surrounds the conductive metals 16S. The surface of the insulating layer 15K is flush with the surfaces of the conductive metals 16S and bonded to the laser structure layer 20. Hence, via the conductive metals 16S, the currents can be gathered efficiently and prevented from being diffused. Moreover, the mobility of the currents can be improved via the transparent conductive layer 18M. Furthermore, the insulating layer 15K can protect the transparent conductive layer 18M and prevent the currents from transmitting through other portions.

Figure 31:
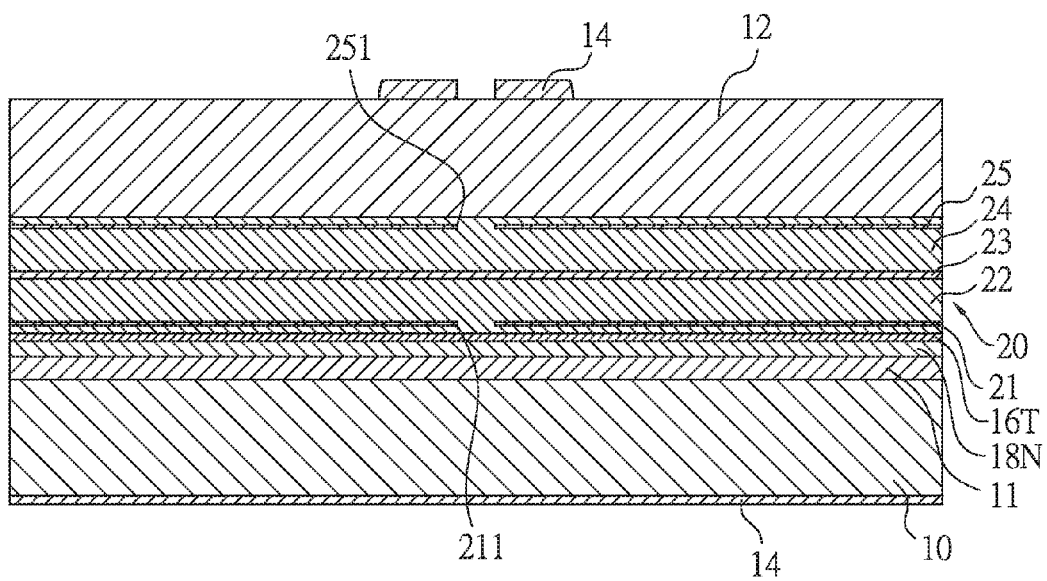
FIG. 31 illustrates a structural view of a thirtieth embodiment of the instant disclosure.

Please refer to FIG. 31, illustrating a thirtieth embodiment of the instant disclosure. In the thirtieth embodiment, the surface emitting laser further comprises a transparent conductive layer 18N and a layer of conductive metal 16T. The transparent conductive layer 18N is between the metal bonding layer 11 and the laser structure layer 20. The conductive metal 16T is between the transparent conductive layer 18N and the laser structure layer 20. The conductive metal 16T is a whole layer to correspond to the transparent conductive layer 18N and the laser structure layer 20. Hence, the mobility of the currents can be improved via the transparent conductive layer 18N. Moreover, the layer of the conductive metal 16T allows the currents to pass through the surface emitting laser evenly.

In the foregoing embodiments, the insulating layers 15-15K may be a titanium dioxide ($TiO_2$) transparent dielectric material, a silicon dioxide ($SiO_2$) transparent dielectric material, a silicon nitride ($Si_3N_4$) transparent dielectric material, a magnesium fluoride ($MgF_2$) transparent dielectric material, or a transparent insulating polymer, etc.

In the foregoing embodiments, the transparent conductive layer 18-18N may be made of indium tin oxide (ITO), zinc oxide (ZnO), indium zinc tin oxide (IZTO), indium gallium zinc oxide (IGZO), beta-phase gallium oxide ($\beta$-$Ga_2O_3$), etc.

Figure 32:
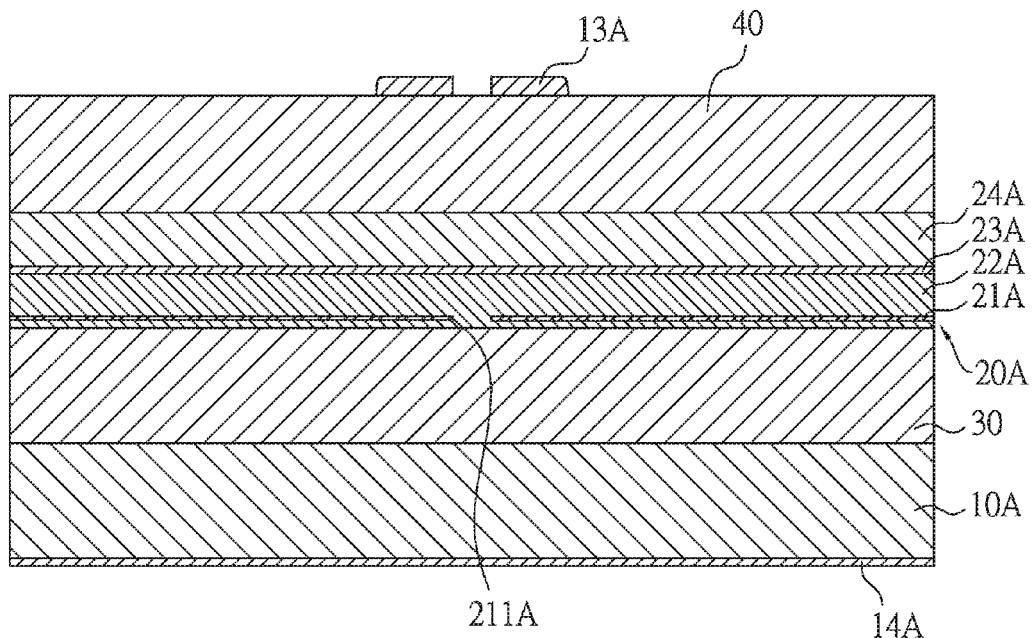
FIG. 32 illustrates a structural view of a thirty-first embodiment of the instant disclosure.

Please refer to FIG. 32, illustrating a thirty-first embodiment. In this embodiment, the surface emitting laser comprises a conductive substrate 10A, a first epitaxial semiconductor reflection layer 30, a laser structure layer 20A, a second epitaxial semiconductor reflection layer 40, and a first electrode layer 13A. The first epitaxial semiconductor reflection layer 30, the laser structure layer 20A, the second epitaxial semiconductor reflection layer 40, and the first electrode layer 13A form a surface-emitting type laser structure, and the surface-emitting type laser structure is manufactured by a semiconductor manufacturing process.

In this embodiment, the conductive substrate is an electrically conductive substrate with great heat dissipation and electrical conductive properties. The conductive substrate 10A may be made of molybdenum, gallium phosphide, silicon, aluminum, or copper.

In this embodiment, the combination between the surface-emitting type laser structure and the conductive substrate 10A may be accomplished by a wafer bonding process. In the wafer bonding process, a substrate for loading the surface-emitting type laser structure is removed, and then the surface-emitting type laser structure is transferred to an upper surface of the conductive substrate 10A to form the surface emitting laser. In this embodiment, a second electrode layer 14A is disposed on a lower surface of the conductive substrate 10.

In this embodiment, the light generated by the laser structure layer 20A is reflected between the first epitaxial semiconductor reflection layer 30 and the second epitaxial semiconductor reflection layer 40, so that the light can be resonated back and forth to form resonance gain and emitted in the form of laser eventually. The first epitaxial semiconductor reflection layer 30 and the second epitaxial semiconductor reflection layer 40 may be formed by stacking two semiconductor materials with different reflection indexes to form distributed Bragg reflectors. The first electrode layer 13A and the second electrode layer 14A are for inputting voltage/current for testing and electrical connection in the subsequent packaging process. Moreover, the type of the semiconductor material of the second electrode layer 14A is different from the type of the semiconductor material of the first electrode layer 13A, and the first electrode layer 13A and the second electrode layer 14A have different electrical polarities.

The laser structure layer 20A has a first epitaxial current-blocking layer 21A, and a middle portion of the first epitaxial current-blocking layer 21A has a first current opening 211A, so that the currents only passes through the first current opening 211. In this embodiment, the laser structure layer 20A has a first semiconductor epitaxial layer 22A, an emitting reaction active layer 23A, and a second semiconductor epitaxial layer 24A sequentially from the upper surface of the first epitaxial semiconductor reflection layer 30. The type of the semiconductor material of the first semiconductor epitaxial layer 22A is opposite to the type of the semiconductor material of the second semiconductor epitaxial layer 24A. The first epitaxial current-blocking layer 21A is in the first semiconductor epitaxial layer 22A.

In this embodiment, the type of the semiconductor material of the first epitaxial semiconductor reflection layer 30 is opposite to the type of the semiconductor material of the second epitaxial semiconductor reflection layer 40. The type of the semiconductor material of the first epitaxial semiconductor reflection layer 30 corresponds to the type of the semiconductor material of the first semiconductor epitaxial layer 22A. The type of the semiconductor material of the second epitaxial semiconductor reflection layer 40 corresponds the type of the semiconductor material of the second semiconductor epitaxial layer 24A. When the first semiconductor epitaxial layer 22A is a P type semiconductor, the first epitaxial semiconductor reflection layer 30 is a P type semiconductor reflection layer, the second semiconductor epitaxial layer 24A is an N type semiconductor, and the second epitaxial semiconductor reflection layer 40 is N type semiconductor reflection layer. Conversely, when the first semiconductor epitaxial layer 22A is an N type semiconductor, the first epitaxial semiconductor reflection layer 30 is an N type semiconductor reflection layer, the second semiconductor epitaxial layer 24A is a P type semiconductor, and the second epitaxial semiconductor reflection layer 40 is a P type semiconductor reflection layer.

Please refer to FIGS. 2-1 and 2-2. The first epitaxial current-blocking layer 21A may be grown by a semiconductor epitaxy process. The first epitaxial current-blocking layer 21A may be formed by an N type semiconductor layer or a P type semiconductor layer. Alternatively, the first epitaxial current-blocking layer 21A may be formed by three of more layers including both N type and P type semiconductor layers. The N type and P type semiconductor layers are stacked with one another in an interlacing manner, and a total number of the stacked N type and P type semiconductor layers of the first epitaxial current-blocking layer 21A is an odd number.

In this embodiment, the first epitaxial current-blocking layer 21A may be an N type semiconductor layer or a P type semiconductor layer. The type of the semiconductor material of the first epitaxial current-blocking layer 21A is opposite to the type of the semiconductor material of the first semiconductor epitaxial layer 22A. That is, when the first semiconductor epitaxial layer 22A is an N type semiconductor, the first epitaxial current-blocking layer 21A is a P type semiconductor; conversely, when the first semiconductor epitaxial layer 22A is a P type semiconductor, the first epitaxial current-blocking layer 21A is an N type semiconductor.

In this embodiment, when the first epitaxial current-blocking layer 21A is formed by three or more layers including both N type and P type semiconductors stacked with one another in an interlacing manner, the type of the semiconductor material of an uppermost layer of the first epitaxial current-blocking layer 21A and the type of the semiconductor material of a lowermost layer of the first epitaxial current-blocking layer 21A are opposite to the type of the semiconductor material of the first semiconductor epitaxial layer 22A. That is, when the first semiconductor epitaxial layer 22A is a P type semiconductor, the uppermost layer and the lowermost layer of the first epitaxial current-blocking layer 21A are N type semiconductors; conversely, when the first semiconductor epitaxial layer 22A is an N type semiconductor, the uppermost layer and the lowermost layer of the first epitaxial current-blocking layer 21A are P type semiconductors.

Figure 33:
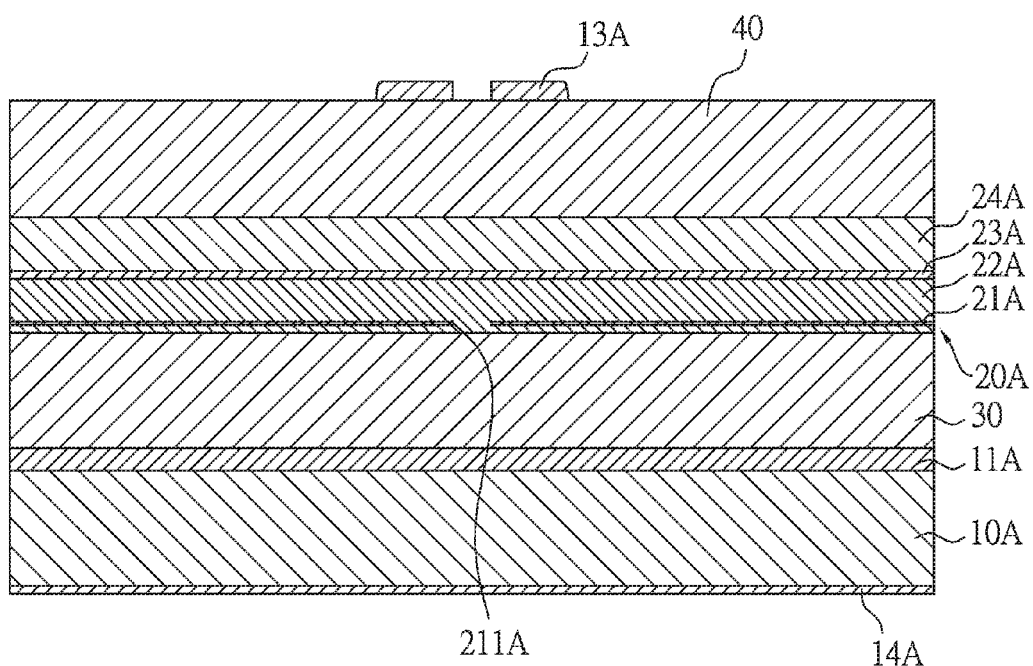
FIG. 33 illustrates a structural view of a thirty-second embodiment of the instant disclosure.

Please refer to FIG. 33, illustrating a thirty-second embodiment of the instant disclosure. In the thirty-second embodiment, the surface emitting laser further comprises a metal bonding layer 11A, and the metal bonding layer 11A is disposed between the conductive substrate 10A and the first epitaxial semiconductor reflection layer 30. In this embodiment, the metal bonding layer 11A is provided for bonding purposes, and the metal bonding layer 11A may be further provided for electrical conduction.

Figure 34:
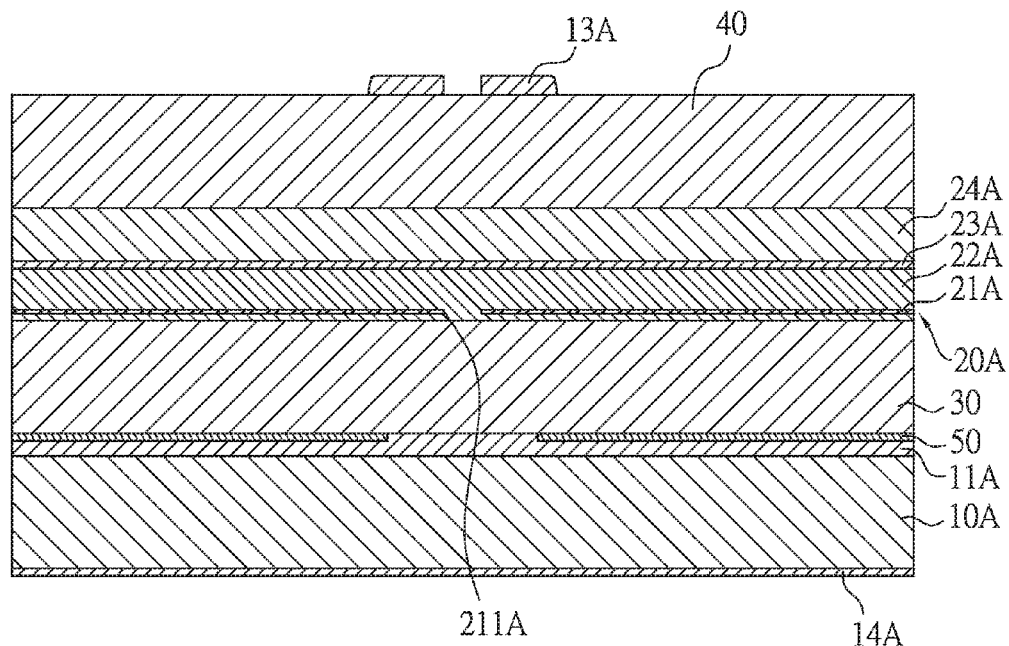
FIG. 34 illustrates a structural view of a thirty-third embodiment of the instant disclosure.

Please refer to FIG. 34, illustrating a thirty-third embodiment of the instant disclosure. In the thirty-third embodiment, the structure of the metal bonding layer 11A is different from that of the thirty-second embodiment. In the thirty-third embodiment, the surface emitting laser further comprises an insulating layer 50. A thickness of a portion of the metal bonding layer 11A corresponding to the first current opening 211A is retained, and the rest portions of the metal bonding layer 11A are etched downwardly by a depth via a semiconductor manufacturing process. The depth may be determined by the practical conditions of the manufacturing process, and the maximized depth is about half of the thickness of the metal bonding layer 11A. The insulating layer 50 is on the surface of the etched portions of the metal bonding layer 11A, and the surface of the retained portions of the metal bonding layer 11A is flush with the surface of the insulating layer 50 and bonded to the first epitaxial semiconductor reflection layer 30. Hence, the retained portions of the metal bonding layer 11A allow the currents to be efficiently gathered and prevent the currents from being diffused. Moreover, the etched portion of the metal bonding layer 11A can be protected via the insulating layer 50.

Figure 35:
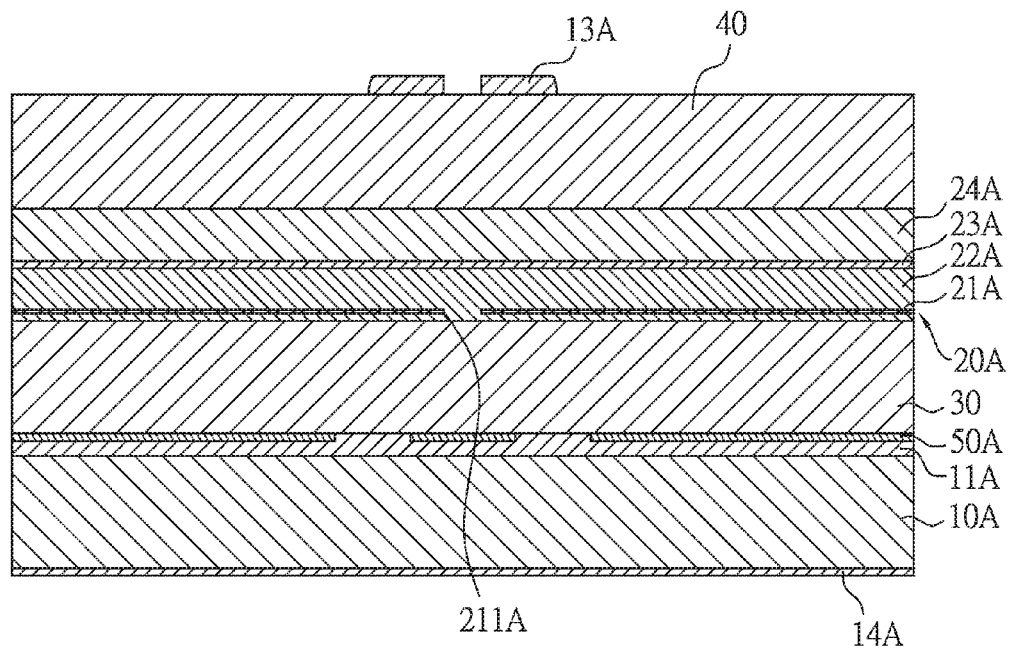
FIG. 35 illustrates a structural view of a thirty-fourth embodiment of the instant disclosure.

Please refer to FIG. 35, illustrating a thirty-fourth embodiment of the instant disclosure. In the thirty-fourth embodiment, the structure of the metal bonding layer 11A is different from that of the thirty-second embodiment. In the thirty-fourth embodiment, the surface emitting laser further comprises an insulating layer 50A. A thickness of a portion of the metal bonding layer 11A corresponding to two sides of the first current opening 211A is retained, and rest portions of the metal bonding layer 11A are etched downwardly by a depth via a semiconductor manufacturing process. The depth may be determined by the practical conditions of the manufacturing process. The maximized depth is about half of the thickness of the metal bonding layer 11A. The insulating layer 50A is on the surface of the etched portions of the metal bonding layer 11A, and the surface of the retained portions of the metal bonding layer 11A is flush with the surface of the insulating layer 50A and bonded to the first epitaxial reflection layer 30. Hence, the retained portions of the metal bonding layer 11A allow the currents to be efficiently gathered and prevent the currents from being diffused. Moreover, the insulating layer 50A can protect the etched portion of the metal bonding layer 11A and the insulating layer 50A can prevent the currents from transmitting through other portions.

Figure 36:
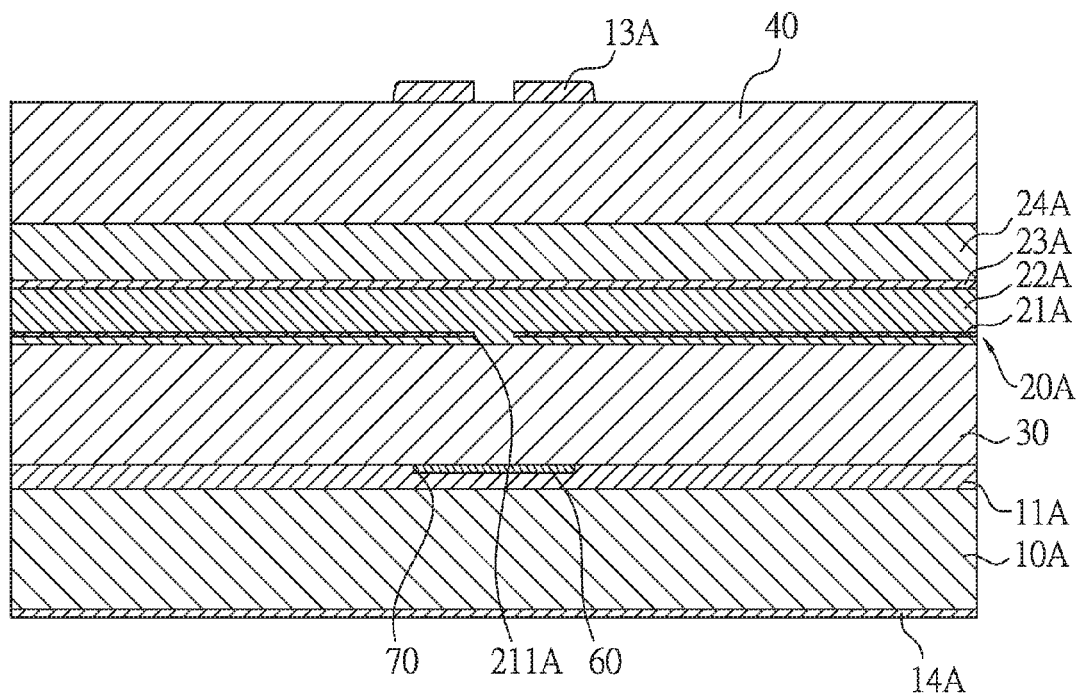
FIG. 36 illustrates a structural view of a thirty-fifth embodiment of the instant disclosure.

Please refer to FIG. 36, illustrating a thirty-fifth embodiment of the instant disclosure. In the thirty-fifth embodiment, the structure of the metal bonding layer 11A is different from that of the thirty-second embodiment. In the thirty-fifth embodiment, the surface emitting laser further comprises a conductive metal 60. A portion of the metal bonding layer 11A corresponding to the first current opening 211A is etched downwardly to form a recessed groove 70 in a semiconductor manufacturing process. The conductive metal 60 is in the recessed groove 70 to correspond to the first current opening 211A. The surface of the conductive metal 60 is flush with the surface of the metal bonding layer 11A and bonded to the first epitaxial semiconductor reflection layer 30. Hence, via the conductive metal 60, the currents can be gathered efficiently and prevented from being diffused.

Figure 37:
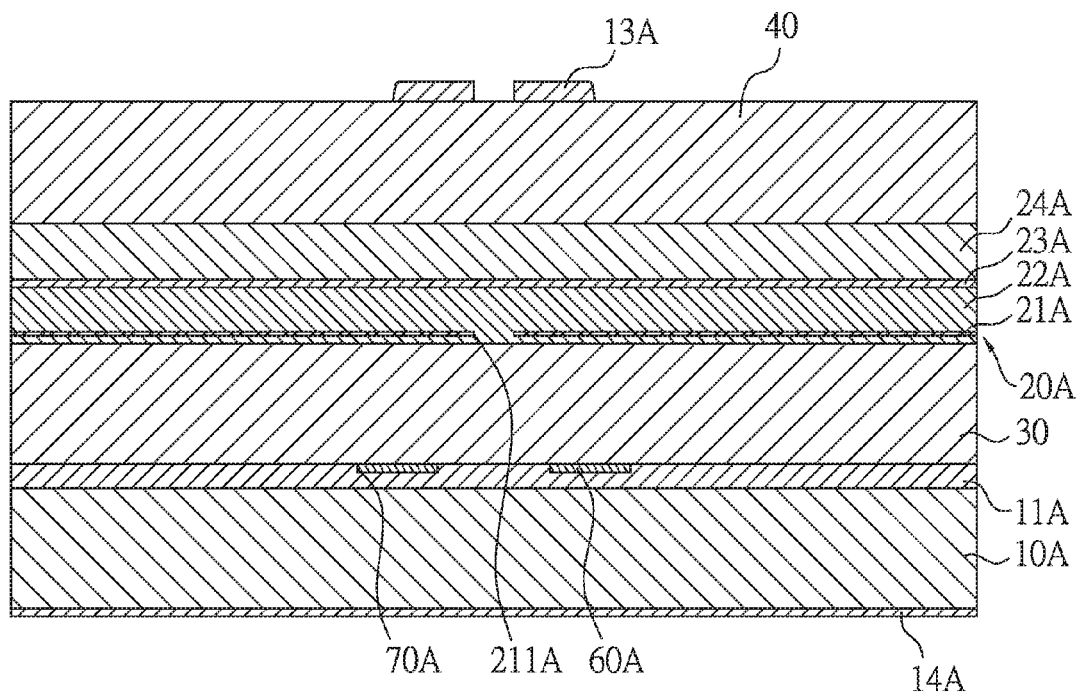
FIG. 37 illustrates a structural view of a thirty-sixth embodiment of the instant disclosure.

Please refer to FIG. 37, illustrating a thirty-sixth embodiment of the instant disclosure. In the thirty-sixth embodiment, the structure of the metal bonding layer 11A is different from that of the thirty-second embodiment. In the thirty-sixth embodiment, the surface emitting laser further comprises two conductive metals 60A. Portions of the metal bonding layer 11A respectively corresponding to the two sides of the first current opening 211A are etched downwardly to form two recessed grooves 70A in a semiconductor manufacturing process. The conductive metals 60A are in the recessed grooves 70A, respectively. The surfaces of the conductive metals 60A are flush with the surface of the metal bonding layer 11A and bonded to the first epitaxial semiconductor reflection layer 30. Hence, via the conductive metals 60A, the currents can be gathered efficiently and prevented from being diffused.

Figure 38:
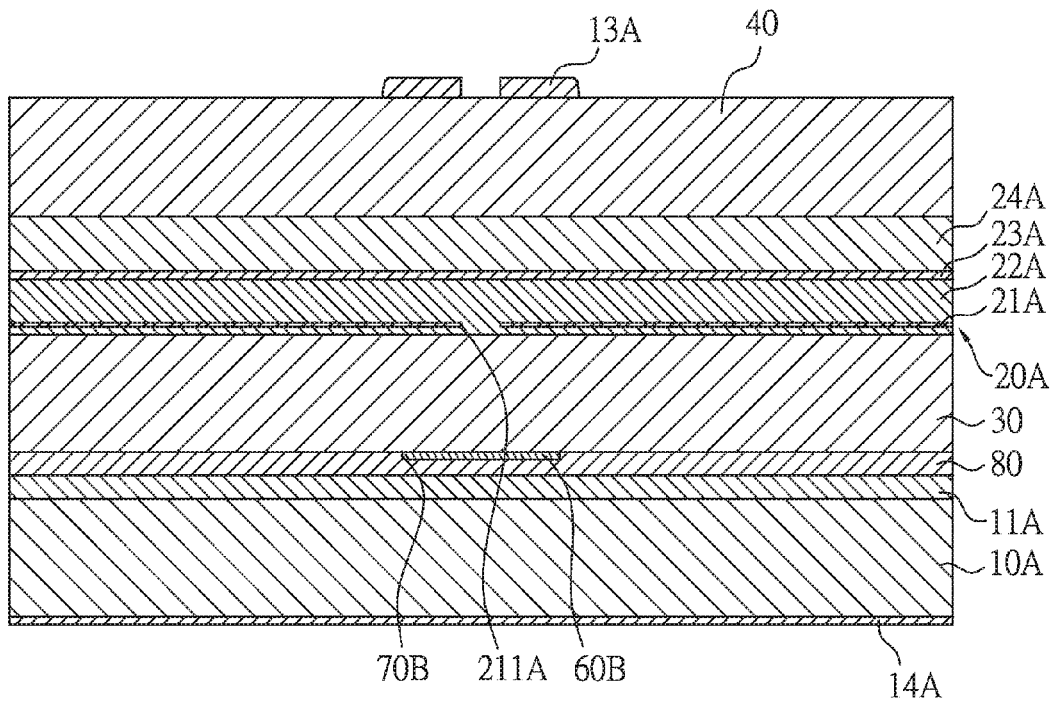
FIG. 38 illustrates a structural view of a thirty-seventh embodiment of the instant disclosure.

Please refer to FIG. 38, illustrating a thirty-seventh embodiment of the instant disclosure. In the thirty-seventh embodiment, the surface emitting laser further comprises a transparent conductive layer 80 and a conductive metal 60B. The transparent conductive layer 80 is between the metal bonding layer 11A and the first epitaxial semiconductor reflection layer 30. A portion of the transparent conductive layer 80 corresponding to the first current opening 211A is etched to form a recessed groove 70B in a semiconductor manufacturing process. The conductive metal 60B is in the recessed groove 70B. The surface of the conductive metal 60B is flush with the surface of the transparent conductive layer 80 and bonded to the first epitaxial semiconductor reflection layer 30. Hence, via the conductive metal 60B, the currents can be gathered efficiently and prevented from being diffused, and the mobility of the currents can be improved via the transparent conductive layer 80.

Figure 39:
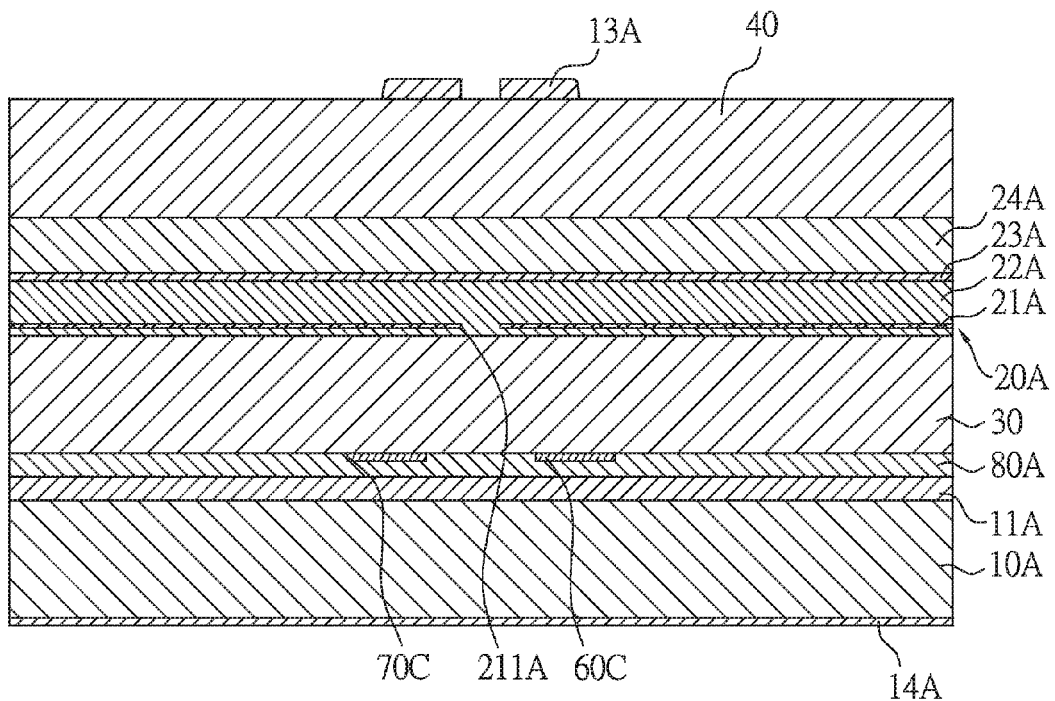
FIG. 39 illustrates a structural view of a thirty-eighth embodiment of the instant disclosure.

Please refer to FIG. 39, illustrating a thirty-eighth embodiment of the instant disclosure. In the thirty-eighth embodiment, the surface emitting laser further comprises a transparent conductive layer 80A and two conductive metals 60C. The transparent conductive layer 80A is between the metal bonding layer 11A and the first epitaxial semiconductor reflection layer 30. Portions of the transparent conductive layer 80A respectively corresponding to the two sides of the first current opening 211A are etched downwardly to form two recessed grooves 70C. The conductive metals 60C are in the recessed grooves 70C, respectively. The surfaces of the conductive metals 60C are flush with the surface of the transparent conductive layer 80A and bonded to the first epitaxial semiconductor reflection layer 30. Hence, via the conductive metals 60C, the currents can be gathered efficiently and prevented from being diffused, and the mobility of the currents can be improved via the transparent conductive layer 80A.

Figure 40:
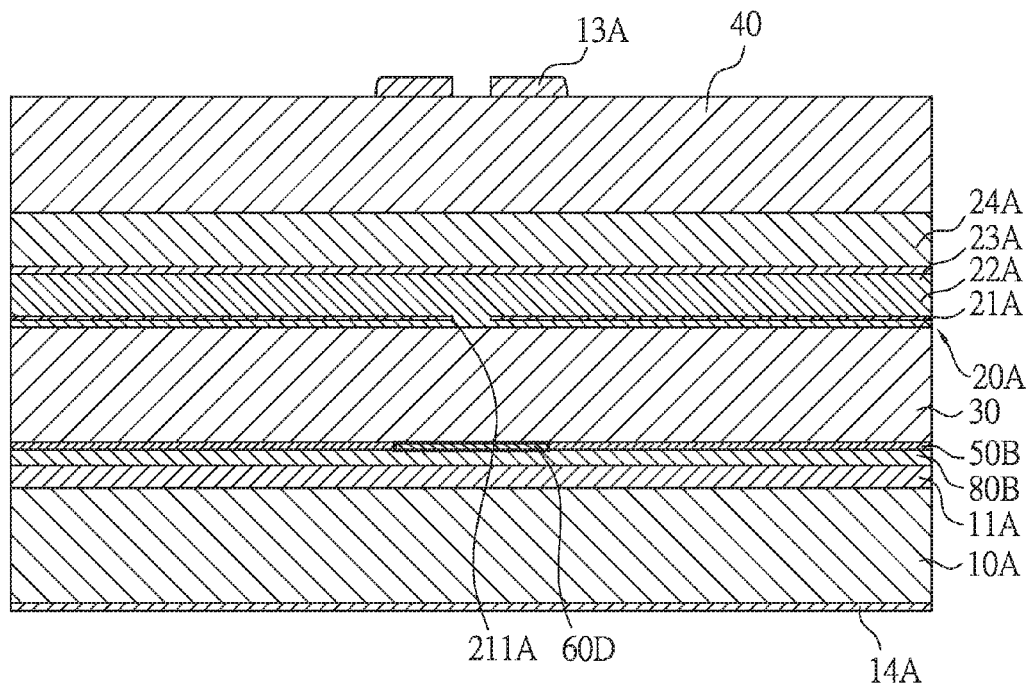
FIG. 40 illustrates a structural view of a thirty-ninth embodiment of the instant disclosure.

Please refer to FIG. 40, illustrating a thirty-ninth embodiment of the instant disclosure. In the thirty-ninth embodiment, the surface emitting laser further comprises a transparent conductive layer 80B, a conductive metal 60D, and an insulating layer 50B. The transparent conductive layer 80B is between the metal bonding layer 11A and the first epitaxial semiconductor reflection layer 30. The conductive metal 60D is on a portion of the transparent conductive layer 80B corresponding to the first current opening 211A and the conductive metal 60D corresponds to the first current opening 211A. The insulating layer 50B is on the surface of the transparent conductive layer 80B and surrounds the conductive metal 60D. The surface of the insulating layer 50B is flush with the surface of the conductive metal 60D and bonded to the first epitaxial semiconductor layer 30. Hence, via the conductive metal 60D, the currents can be gathered efficiently and prevented from being diffused. Moreover, the mobility of the currents can be improved via the transparent conductive layer 80B.

Figure 41:
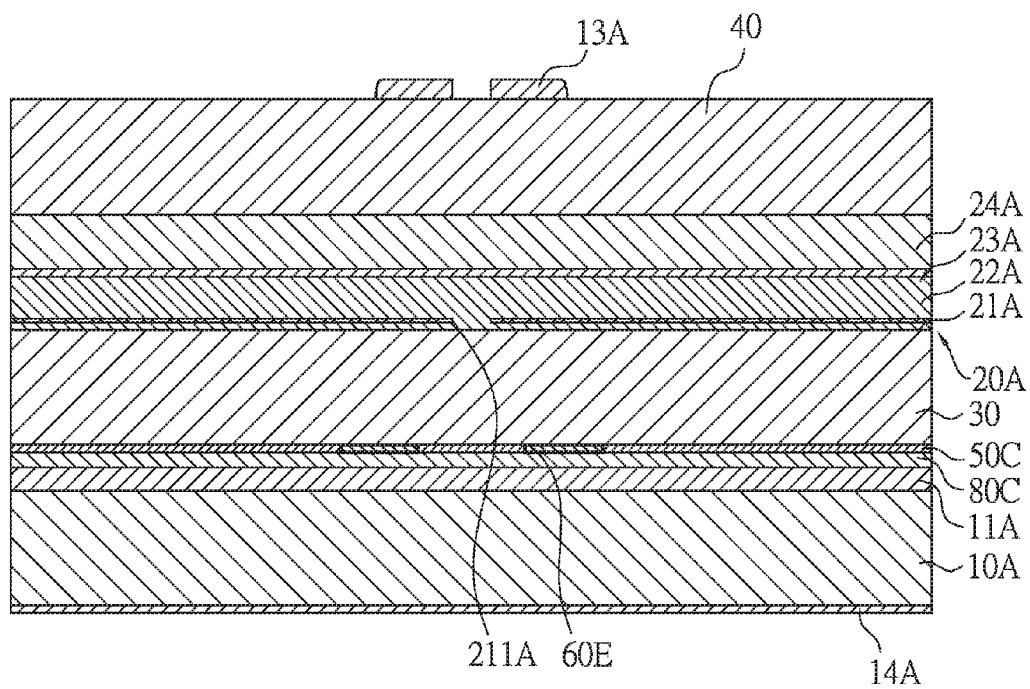
FIG. 41 illustrates a structural view of a fortieth embodiment of the instant disclosure.

Please refer to FIG. 41, illustrating a fortieth embodiment of the instant disclosure. In the fortieth embodiment, the surface emitting laser further comprises a transparent conductive layer 80C, two conductive metals 60E, and an insulating layer 50C. The transparent conductive layer 80C is between the metal bonding layer 11A and the first epitaxial semiconductor layer 30. The conductive metals 60E are on portions of the transparent conductive layer 80C corresponding to the two sides of the first current opening 211A, respectively. The insulating layer 50C is on the surface of the transparent conductive layer 80C and surrounds the conductive metals 60E. The surface of the insulating layer 50C is flush with the surfaces of the conductive metals 60E and bonded to the first epitaxial semiconductor layer 30. Hence, via the conductive metals 60E, the currents can be gathered efficiently and prevented from being diffused. Moreover, the mobility of the currents can be improved via the transparent conductive layer 80C. Furthermore, the insulating layer 50C can protect the transparent conductive layer 80C and the insulating layer 50C can prevent the currents from transmitting through other portions.

Figure 42:
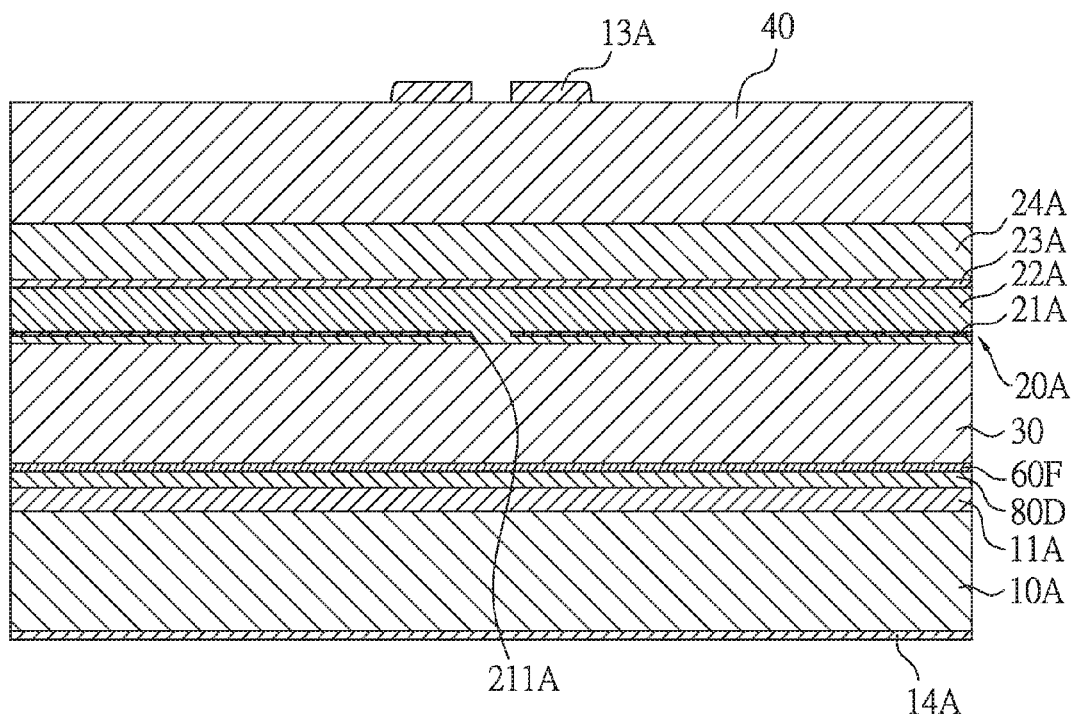
FIG. 42 illustrates a structural view of a forty-first embodiment of the instant disclosure.

Please refer to FIG. 42, illustrating a forty-first embodiment of the instant disclosure. In the forty-first embodiment, the surface emitting laser further comprises a transparent conductive layer 80D and a layer of conductive metal 60F. The transparent conductive layer 80D is between the metal bonding layer 11A and the first epitaxial semiconductor reflection layer 30. The conductive metal 60F is between the transparent conductive layer 80D and the first epitaxial semiconductor reflection layer 30. The conductive metal 60F is a whole layer to correspond to the transparent conductive layer 80D and the first epitaxial semiconductor reflection layer 30. Hence, the mobility of the currents can be improved via the transparent conductive layer 80D. Moreover, the layer of the conductive metal 60F allows the currents to pass through the surface emitting laser evenly.

Figure 43:
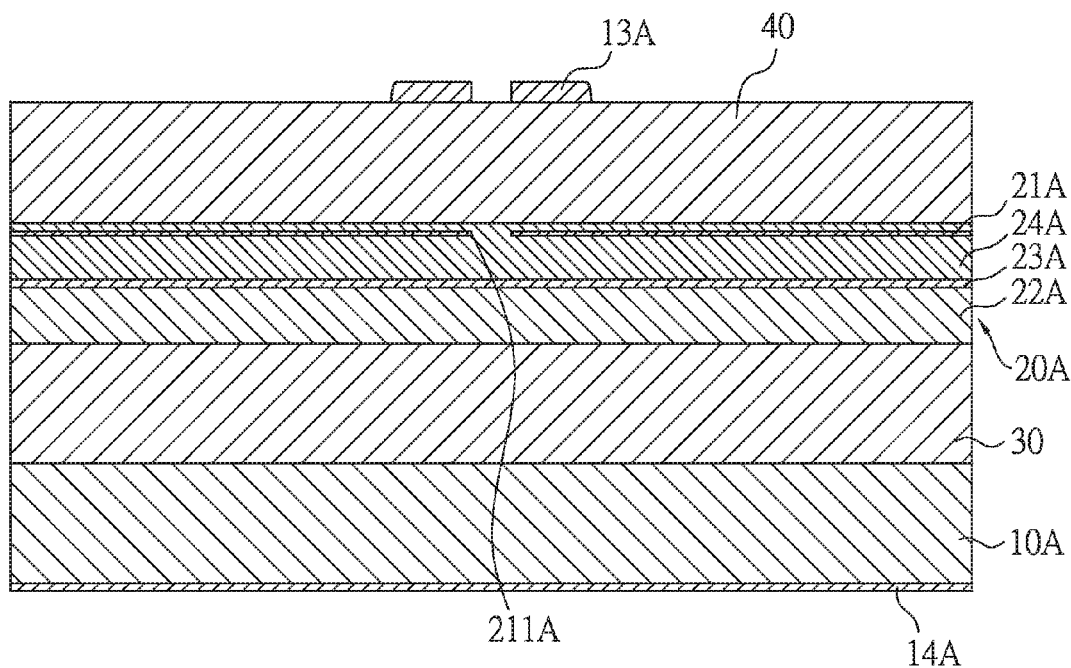
FIG. 43 illustrates a structural view of a forty-second embodiment of the instant disclosure.

Please refer to FIG. 43, illustrating a forty-second embodiment of the instant disclosure. In the forty-second embodiment, the position of the first epitaxial current-blocking layer 21A is different from that of the thirty-first embodiment. In the forty-second embodiment, the first epitaxial current-blocking layer 21A is in the second semiconductor epitaxial layer 24A. When the first epitaxial current-blocking layer 21A is an N type semiconductor layer or a P type semiconductor layer, the type of the semiconductor material of the first epitaxial current-blocking layer 21A is opposite to the type of the semiconductor material of the second semiconductor epitaxial layer 24A. When the first epitaxial current-blocking layer 21A is formed by three of more layers including both N type and P type semiconductor layers stacked with one another in an interlacing manner, the type of the semiconductor material of an uppermost layer of the first epitaxial current-blocking layer 21A and the type of the semiconductor material of a lowermost layer of the first epitaxial current-blocking layer 21A are opposite to the type of the semiconductor material of the second semiconductor epitaxial layer 24A.

Figure 44:
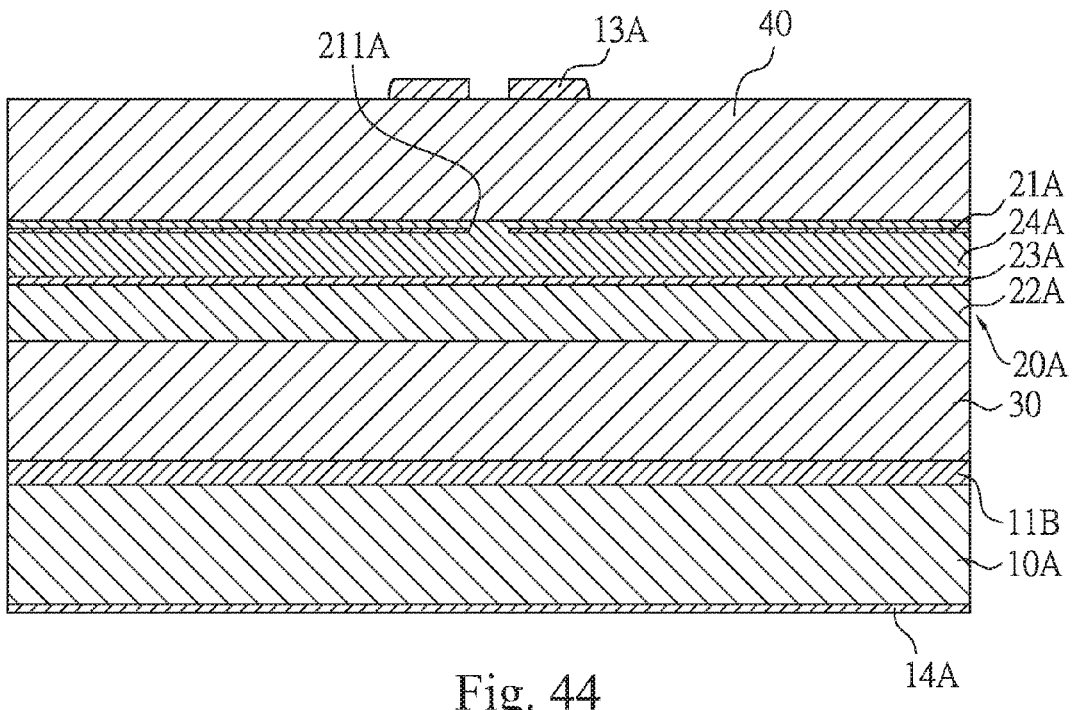
FIG. 44 illustrates a structural view of a forty-third embodiment of the instant disclosure.

Please refer to FIG. 44, illustrating a forty-third embodiment of the instant disclosure. In the forty-third embodiment, the surface emitting laser further comprises a metal bonding layer 11B, and the metal bonding layer 11B is disposed between the conductive substrate 10A and the first epitaxial semiconductor reflection layer 30. In this embodiment, the metal bonding layer 11B is provided for bonding purposes, and the metal bonding layer 11B may be further provided for electrical conduction.

Figure 45:
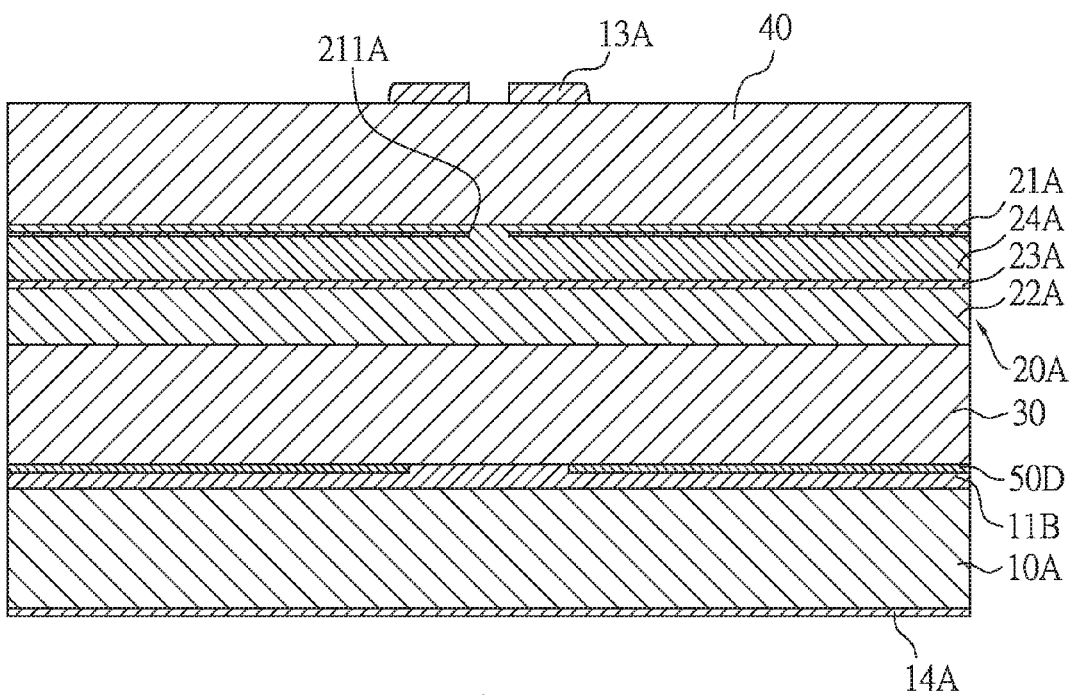
FIG. 45 illustrates a structural view of a forty-fourth embodiment of the instant disclosure.

Please refer to FIG. 45, illustrating a forty-fourth embodiment of the instant disclosure. In the forty-fourth embodiment, the structure of the metal bonding layer 11B is different from that of the forty-third embodiment. In the forty-fourth embodiment, the surface emitting laser further comprises an insulating layer 50D. A thickness of a portion of the metal bonding layer 11B corresponding to the first current opening 211A is retained, and the rest portions of the metal bonding layer 11B are etched downwardly by a depth via a semiconductor manufacturing process. The depth may be determined by the practical conditions of the manufacturing process. The maximized depth is about half of the thickness of the metal bonding layer 11B. The insulating layer 50D is on the surface of the etched portions of the metal bonding layer 11B, and the surface of the retained portions of the metal bonding layer 11B is flush with the surface of the insulating layer 50D and bonded to the first epitaxial semiconductor reflection layer 30. Hence, the retained portions of the metal bonding layer 11B allow the currents to be efficiently gathered and prevent the currents from being diffused. Moreover, the etched portion of the metal bonding layer 11A can be protected via the insulating layer 50D.

Figure 46:
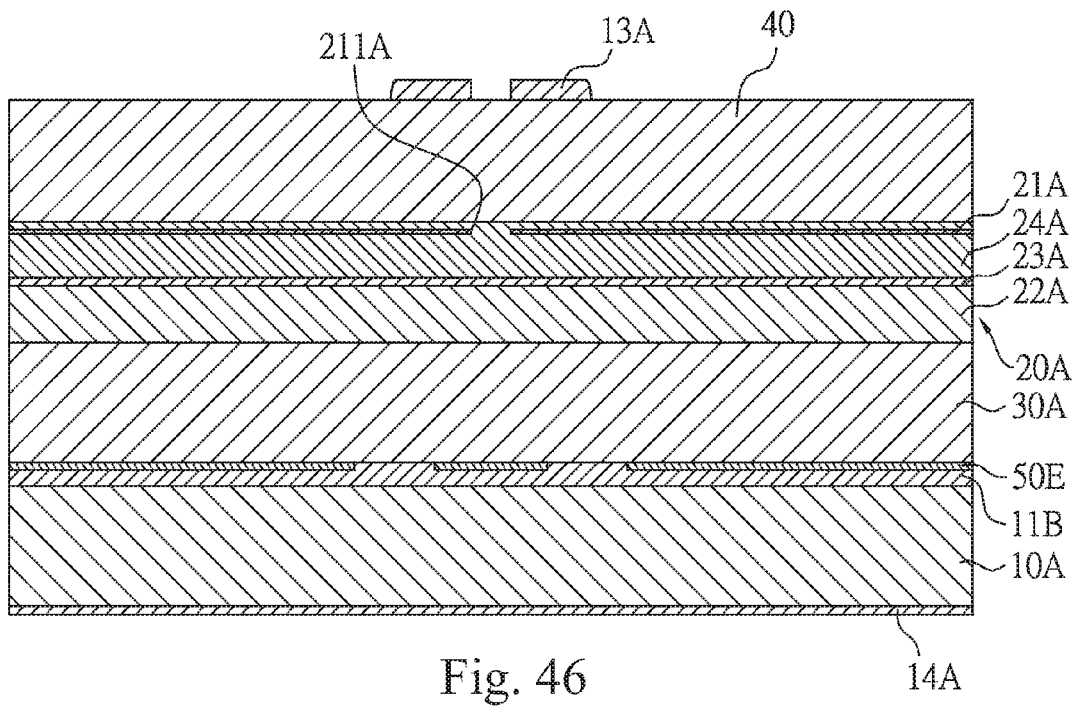
FIG. 46 illustrates a structural view of a forty-fifth embodiment of the instant disclosure.

Please refer to FIG. 46, illustrating a forty-fifth embodiment of the instant disclosure. In the forty-fifth embodiment, the structure of the metal bonding layer 11B is different from that of the forty-third embodiment. In the forty-fifth embodiment, the surface emitting laser further comprises an insulating layer 50E. A thickness of a portion of the metal bonding layer 11B corresponding to two sides of the first current opening 211A is retained, and rest portions of the metal bonding layer 11B are etched downwardly by a depth via a semiconductor manufacturing process. The depth may be determined by the practical conditions of the manufacturing process. The maximized depth is about half of the thickness of the metal bonding layer 11B. The insulating layer 50E is on the surface of the etched portions of the metal bonding layer 11B, and the surface of the retained portions of the metal bonding layer 11B is flush with the surface of the insulating layer 50E and bonded to the first epitaxial reflection layer 30. Hence, the retained portions of the metal bonding layer 11B allow the currents to be efficiently gathered and prevent the currents from being diffused. Moreover, the insulating layer 50E can protect the etched portion of the metal bonding layer 11B.

Figure 47:
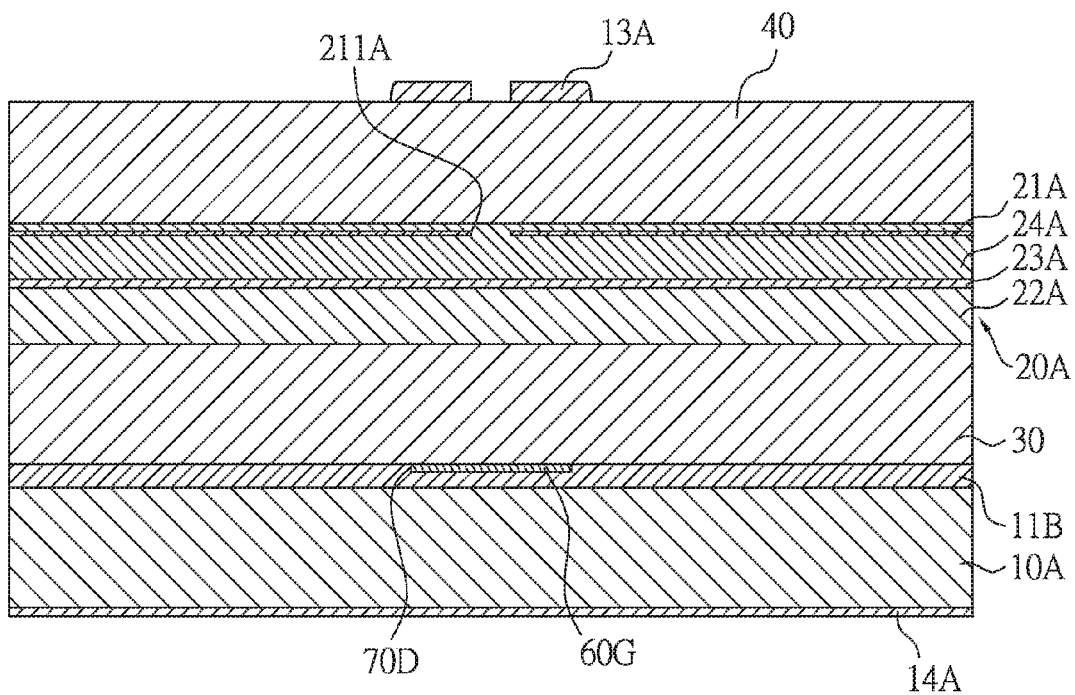
FIG. 47 illustrates a structural view of a forty-sixth embodiment of the instant disclosure.

Please refer to FIG. 47, illustrating a forty-sixth embodiment of the instant disclosure. In the forty-sixth embodiment, the structure of the metal bonding layer 11B is different from that of the forty-third embodiment. In the forty-sixth embodiment, the surface emitting laser further comprises a conductive metal 60G A portion of the metal bonding layer 11B corresponding to the first current opening 211A is etched downwardly to form a recessed groove 70D in a semiconductor manufacturing process. The conductive metal 60G is in the recessed groove 70D to correspond to the first current opening 211A. The surface of the conductive metal 60G is flush with the surface of the metal bonding layer 11B and bonded to the first epitaxial semiconductor reflection layer 30. Hence, via the conductive metal 60G; the currents can be gathered efficiently and prevented from being diffused.

Figure 48:
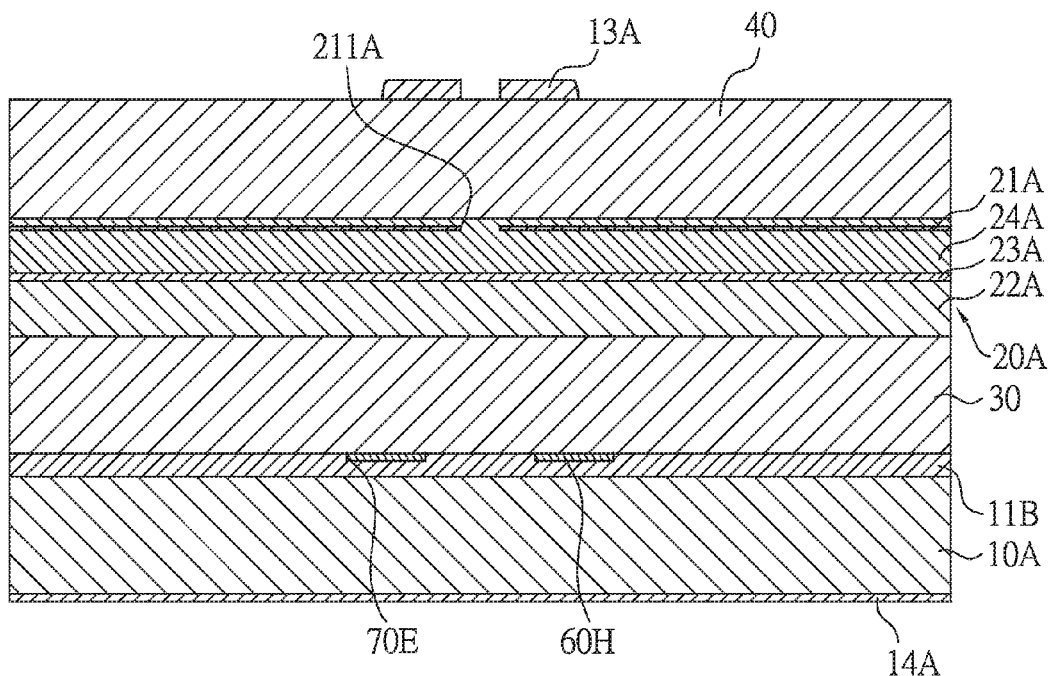
FIG. 48 illustrates a structural view of a forty-seventh embodiment of the instant disclosure.

Please refer to FIG. 48, illustrating a forty-seventh embodiment of the instant disclosure. In the forty-seventh embodiment, the structure of the metal bonding layer 11B is different from that of the forty-third embodiment. In the forty-seventh embodiment, the surface emitting laser further comprises two conductive metals 60H. Portions of the metal bonding layer 11B respectively corresponding to the two sides of the first current opening 211A are etched downwardly to form two recessed grooves 70E in a semiconductor manufacturing process. The conductive metals 60H are in the recessed grooves 70E, respectively. The surfaces of the conductive metals 60H are flush with the surface of the metal bonding layer 11B and bonded to the first epitaxial semiconductor reflection layer 30. Hence, via the conductive metals 60H, the currents can be gathered efficiently and prevented from being diffused.

Figure 49:
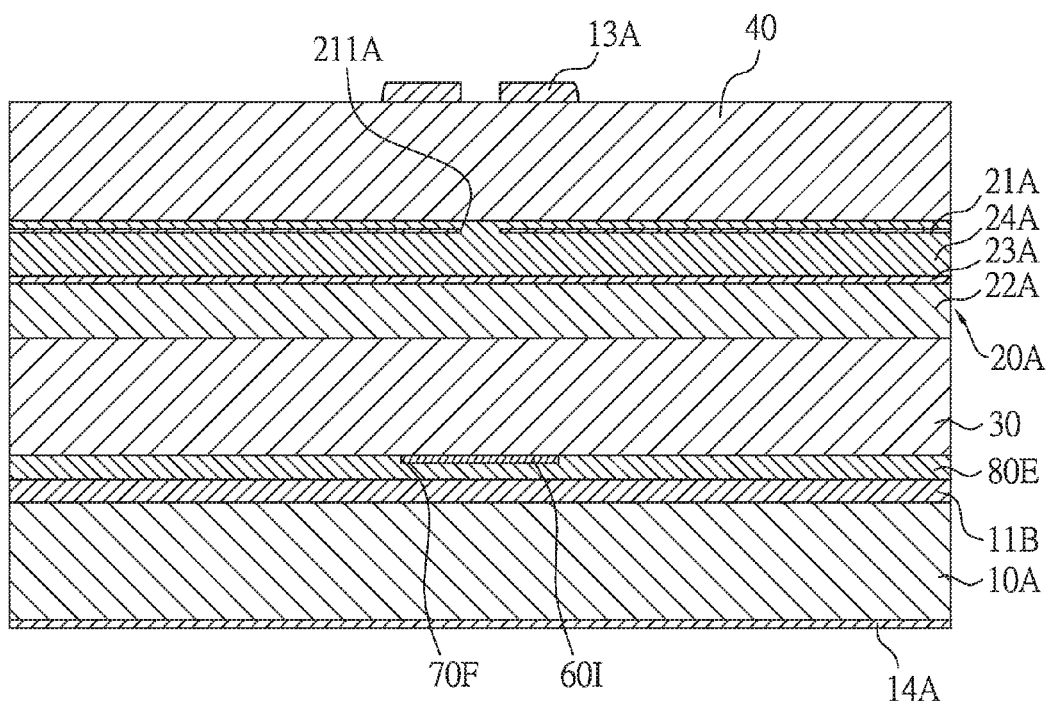
FIG. 49 illustrates a structural view of a forty-eighth embodiment of the instant disclosure.

Please refer to FIG. 49, illustrating a forty-eighth embodiment of the instant disclosure. In the forty-eighth embodiment, the surface emitting laser further comprises a transparent conductive layer 80E and a conductive metal 60I. The transparent conductive layer 80E is between the metal bonding layer 11B and the first epitaxial semiconductor reflection layer 30. A portion of the transparent conductive layer 80E corresponding to the first current opening 211A is etched to form a recessed groove 70F in a semiconductor manufacturing process. The conductive metal 60I is in the recessed groove 70F. The surface of the conductive metal 60I is flush with the surface of the transparent conductive layer 80E and bonded to the first epitaxial semiconductor reflection layer 30. Hence, via the conductive metal 60I, the currents can be gathered efficiently and prevented from being diffused, and the mobility of the currents can be improved via the transparent conductive layer 80.

Figure 50:
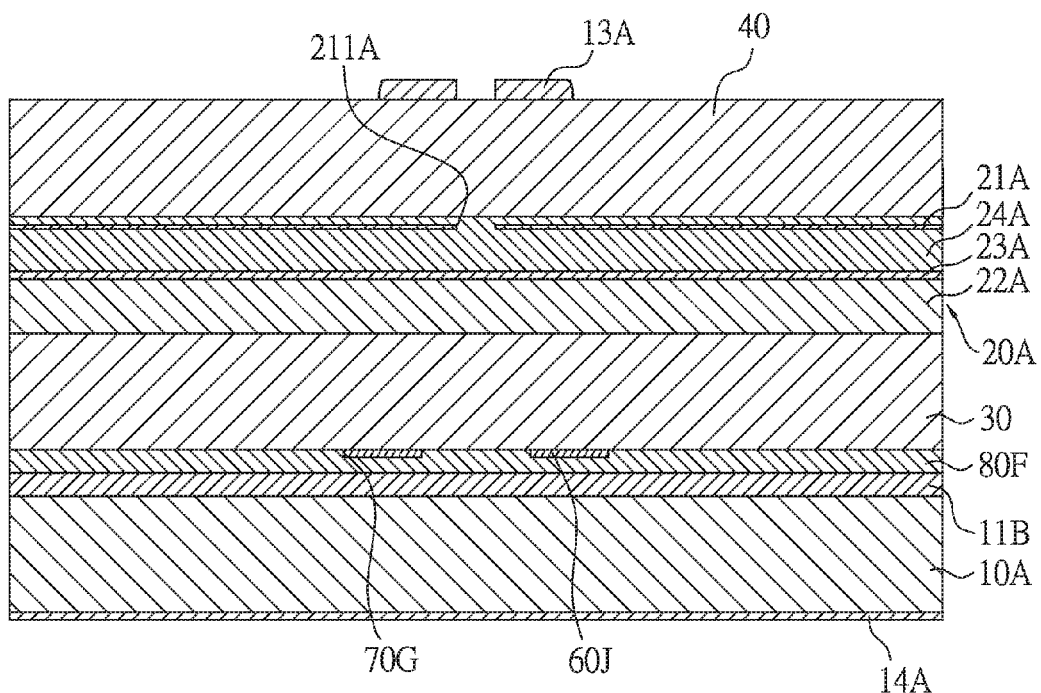
FIG. 50 illustrates a structural view of a forty-ninth embodiment of the instant disclosure.

Please refer to FIG. 50, illustrating a forty-ninth embodiment of the instant disclosure. In the forty-ninth embodiment, the surface emitting laser further comprises a transparent conductive layer 80F and two conductive metals 60J.

The transparent conductive layer 80F is between the metal bonding layer 11B and the first epitaxial semiconductor reflection layer 30. Portions of the transparent conductive layer 80F respectively corresponding to the two sides of the first current opening 211A are etched downwardly to form two recessed grooves 70G. The conductive metals 60J are in the recessed grooves 70G respectively. The surfaces of the conductive metals 60J are flush with the surface of the transparent conductive layer 80F and bonded to the first epitaxial semiconductor reflection layer 30. Hence, via the conductive metals 60J, the currents can be gathered efficiently and prevented from being diffused, and the mobility of the currents can be improved via the transparent conductive layer 80F.

Figure 51:
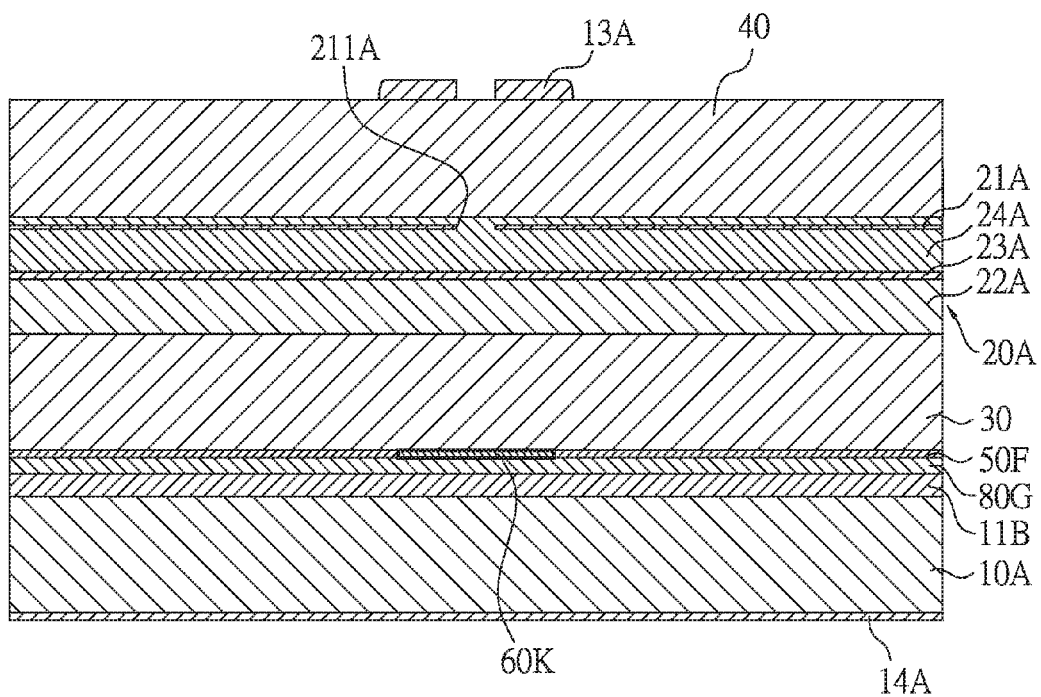
FIG. 51 illustrates a structural view of a fiftieth embodiment of the instant disclosure.

Please refer to FIG. 51, illustrating a fiftieth embodiment of the instant disclosure. In the fiftieth embodiment, the surface emitting laser further comprises a transparent conductive layer 80G, a conductive metal 60K, and an insulating layer 50F. The transparent conductive layer 80G is between the metal bonding layer 11B and the first epitaxial semiconductor reflection layer 30. The conductive metal 60K is on a portion of the transparent conductive layer 80G corresponding to the first current opening 211A and the conductive metal 60K corresponds to the first current opening 211A. The insulating layer 50F is on the surface of the transparent conductive layer 80G and surrounds the conductive metal 60K. The surface of the insulating layer 50F is flush with the surface of the conductive metal 60K and bonded to the first epitaxial semiconductor layer 30. Hence, via the conductive metal 60K, the currents can be gathered efficiently and prevented from being diffused. Moreover, the mobility of the currents can be improved via the transparent conductive layer 80G. Furthermore, the insulating layer 50F can protect the transparent conductive layer 80G.

Figure 52:
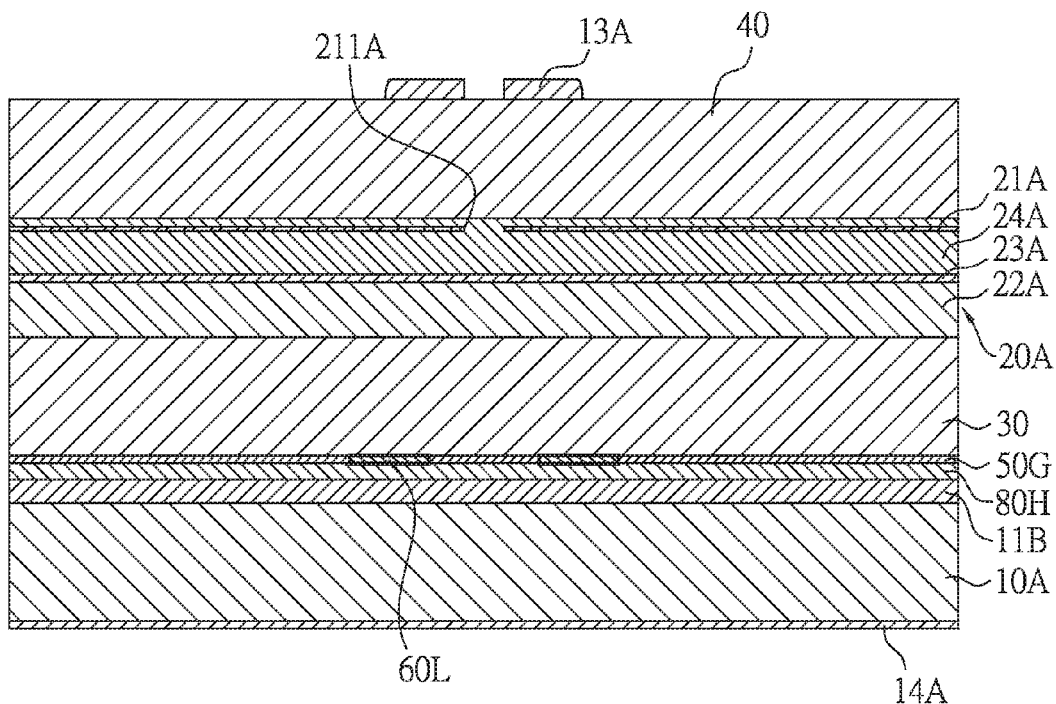
FIG. 52 illustrates a structural view of a fifty-first embodiment of the instant disclosure.

Please refer to FIG. 52, illustrating a fifty-first embodiment of the instant disclosure. In the fifty-first embodiment, the surface emitting laser further comprises a transparent conductive layer 80H, two conductive metals 60L, and an insulating layer 50G The transparent conductive layer 80H is between the metal bonding layer 11L and the first epitaxial semiconductor layer 30. The conductive metals 60L are on portions of the transparent conductive layer 80H corresponding to the two sides of the first current opening 211A, respectively. The insulating layer 50G is on the surface of the transparent conductive layer 80H and surrounds the conductive metals 60L. The surface of the insulating layer 50G is flush with the surfaces of the conductive metals 60L and bonded to the first epitaxial semiconductor layer 30. Hence, via the conductive metals 60L, the currents can be gathered efficiently and prevented from being diffused. Moreover, the mobility of the currents can be improved via the transparent conductive layer 80H. Furthermore, the insulating layer 50G can protect the transparent conductive layer 80H.

Figure 53:
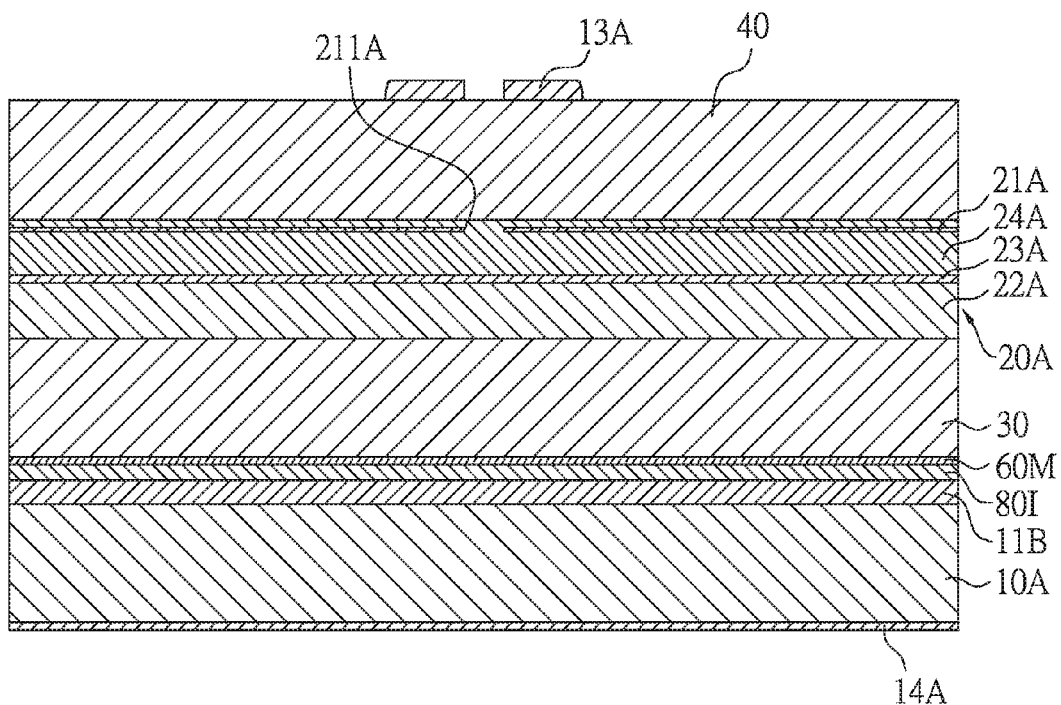
FIG. 53 illustrates a structural view of a fifty-second embodiment of the instant disclosure.

Please refer to FIG. 53, illustrating a fifty-second embodiment of the instant disclosure. In the fifty-second embodiment, the surface emitting laser further comprises a transparent conductive layer 80I and a layer of conductive metal 60M. The transparent conductive layer 80I is between the metal bonding layer 11B and the first epitaxial semiconductor reflection layer 30. The conductive metal 60M is between the transparent conductive layer 80I and the first epitaxial semiconductor reflection layer 30. The conductive metal 60M is a whole layer to correspond to the transparent conductive layer 80I and the first epitaxial semiconductor reflection layer 30. Hence, the mobility of the currents can be improved via the transparent conductive layer 80I. Moreover, the layer of the conductive metal 60M allows the currents to pass through the surface emitting laser evenly.

Figure 54:
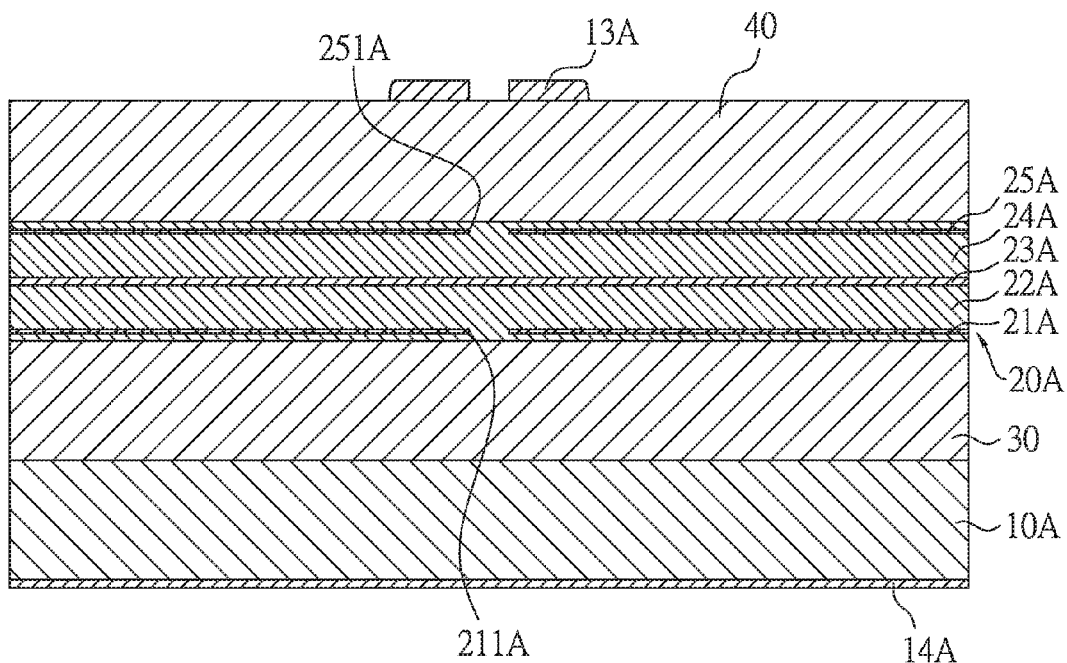
FIG. 54 illustrates a structural view of a fifty-third embodiment of the instant disclosure.

Please refer to FIG. 54, illustrating a fifty-third embodiment of the instant disclosure. In the fifty-third embodiment, the surface emitting laser further comprises a second epitaxial current-blocking layer 25A. The second epitaxial current-blocking layer 25A is in the second semiconductor epitaxial layer 24A. A middle portion of the second epitaxial current-blocking layer 25A has a second current opening 251A corresponding to the first current opening 211A.

In this embodiment, the second epitaxial current-blocking layer 25A and the first epitaxial current-blocking layer 21A are the same. When the second epitaxial current-blocking layer 25A is an N type semiconductor layer or a P type semiconductor layer, the type of the semiconductor material of the second epitaxial current-blocking layer 25A is opposite to the type of the semiconductor material of the second semiconductor epitaxial layer 24A. When the second epitaxial current-blocking layer 25A is formed by three or more layers including both N type and P type semiconductor layers stacked with one another in an interlacing manner, the type of the semiconductor material of an uppermost layer of the second epitaxial current-blocking layer 25A and the type of the semiconductor material of a lowermost layer of the second epitaxial current-blocking layer 25A are opposite to the type of the semiconductor material of the second semiconductor epitaxial layer 24A.

Figure 55:
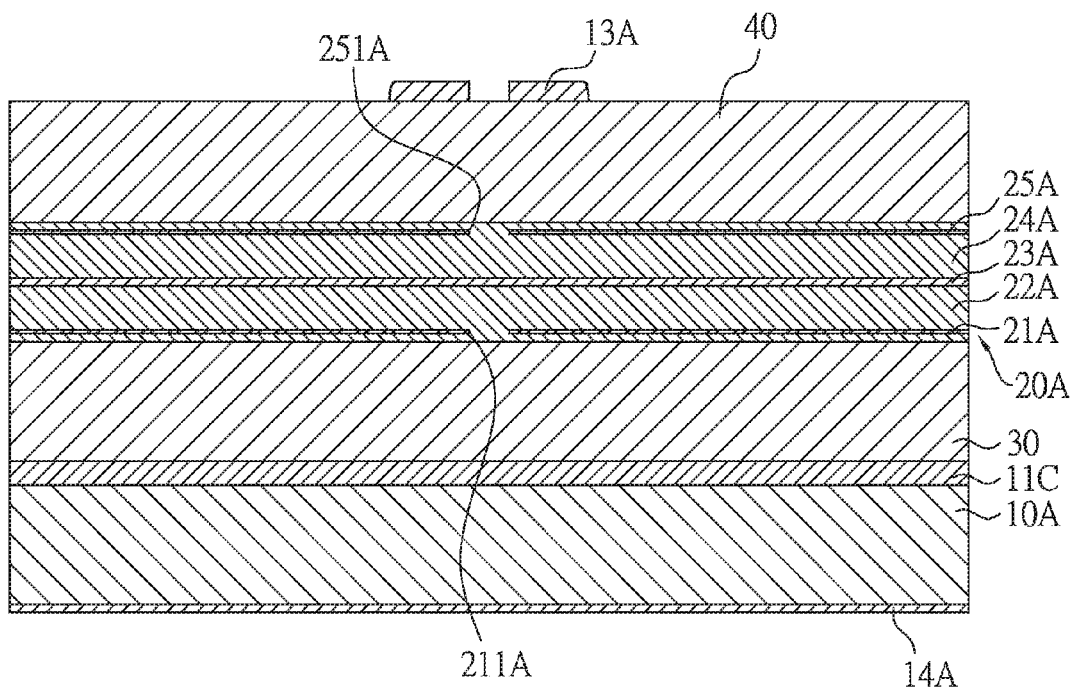
FIG. 55 illustrates a structural view of a fifty-fourth embodiment of the instant disclosure.

Please refer to FIG. 55, illustrating a fifty-fourth embodiment of the instant disclosure. In the fifty-fourth embodiment, the surface emitting laser further comprises a metal bonding layer 11C, and the metal bonding layer 11C is disposed between the conductive substrate 10A and the first epitaxial semiconductor reflection layer 30. In this embodiment, the metal bonding layer 11C is provided for bonding purposes, and the metal bonding layer 11C may be further provided for electrical conduction.

Figure 56:
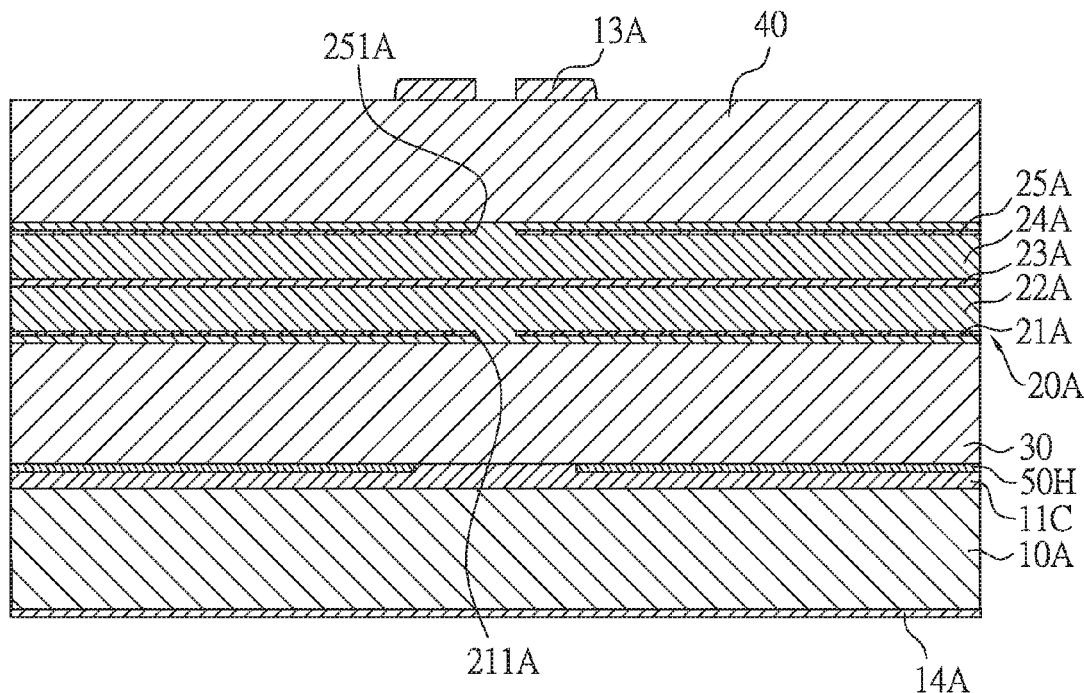
FIG. 56 illustrates a structural view of a fifty-fifth embodiment of the instant disclosure.

Please refer to FIG. 56, illustrating a fifty-fifth embodiment of the instant disclosure. In the fifty-fifth embodiment, the structure of the metal bonding layer 11C is different from that of the fifty-fourth embodiment. In the fifty-fifth embodiment, the surface emitting laser further comprises an insulating layer 50H. A thickness of a portion of the metal bonding layer 11C corresponding to the first current opening 211A is retained, and the rest portions of the metal bonding layer 11C are etched downwardly by a depth via a semiconductor manufacturing process. The depth may be determined by the practical conditions of the manufacturing process, and the maximized depth is about half of the thickness of the metal bonding layer 11C. The insulating layer 50H is on the surface of the etched portions of the metal bonding layer 11C, and the surface of the retained portions of the metal bonding layer 11C is flush with the surface of the insulating layer 50H and bonded to the first epitaxial semiconductor reflection layer 30. Hence, the retained portions of the metal bonding layer 11C allow the currents to be efficiently gathered and prevent the currents from being diffused. Moreover, the metal bonding layer 11C can be protected via the insulating layer 50H.

Figure 57:
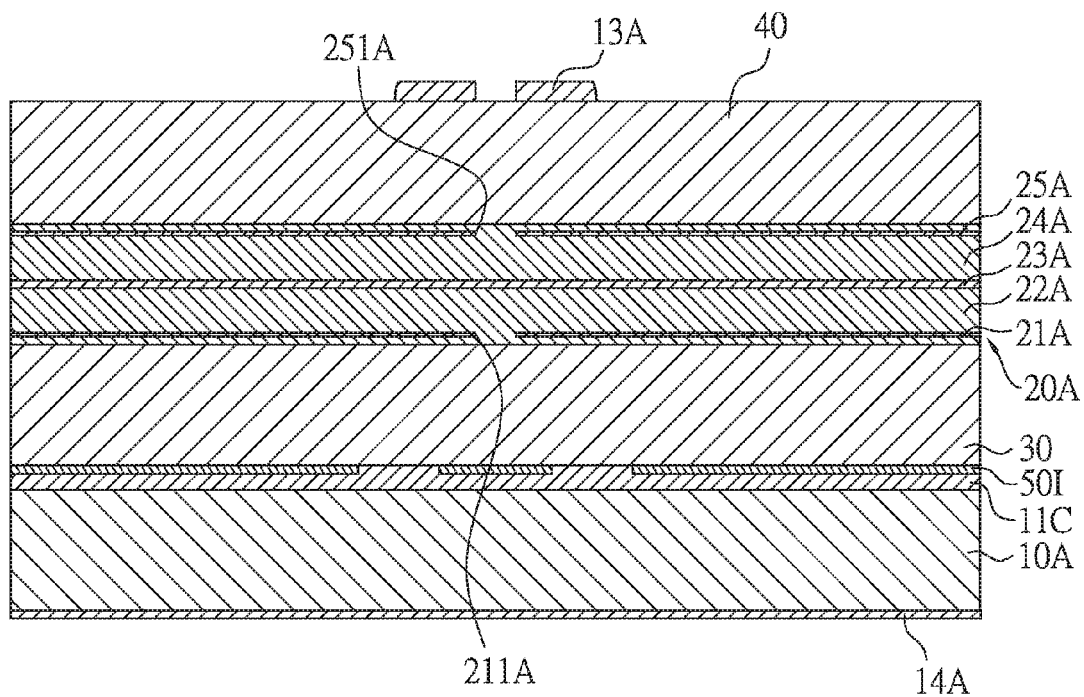
FIG. 57 illustrates a structural view of a fifty-sixth embodiment of the instant disclosure.

Please refer to FIG. 57, illustrating a fifty-sixth embodiment of the instant disclosure. In the fifty-sixth embodiment, the structure of the metal bonding layer 11C is different from that of the fifty-fourth embodiment. In the fifty-sixth embodiment, the surface emitting laser further comprises an insulating layer 50I. A thickness of a portion of the metal bonding layer 11C corresponding to two sides of the first current opening 211A is retained, and rest portions of the metal bonding layer 11C are etched downwardly by a depth via a semiconductor manufacturing process. The depth may be determined by the practical conditions of the manufacturing process. The maximized depth is about half of the thickness of the metal bonding layer 11C. The insulating layer 50I is on the surface of the etched portions of the metal bonding layer 11C, and the surface of the retained portions of the metal bonding layer 11C is flush with the surface of the insulating layer 50I and bonded to the first epitaxial reflection layer 30. Hence, the retained portions of the metal bonding layer 11C allow the currents to be efficiently gathered and prevent the currents from being diffused. Moreover, the insulating layer 50I can protect the metal bonding layer 11C.

Figure 58:
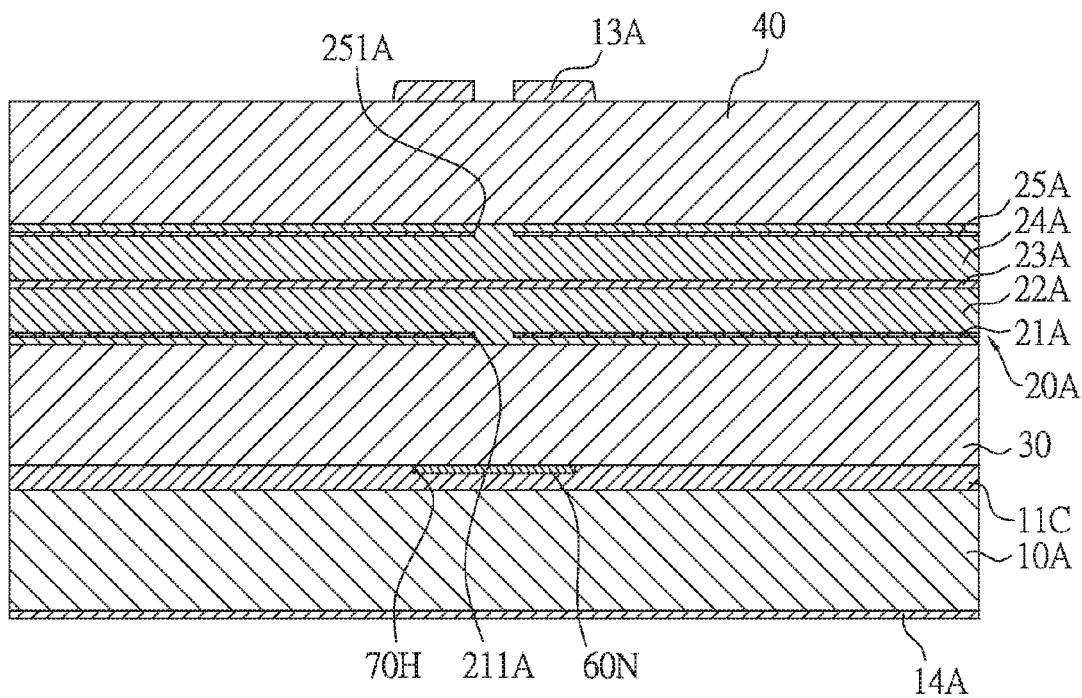
FIG. 58 illustrates a structural view of a fifty-seventh embodiment of the instant disclosure.

Please refer to FIG. 58, illustrating a fifty-seventh embodiment of the instant disclosure. In the fifty-seventh embodiment, the structure of the metal bonding layer 11C is different from that of the fifty-fourth embodiment. In the fifty-seventh embodiment, the surface emitting laser further comprises a conductive metal 60N. A portion of the metal bonding layer 11C corresponding to the first current opening 211A is etched downwardly to form a recessed groove 70H in a semiconductor manufacturing process. The conductive metal 60N is in the recessed groove 70H to correspond to the first current opening 211A. The surface of the conductive metal 60N is flush with the surface of the metal bonding layer 11C and bonded to the first epitaxial semiconductor reflection layer 30. Hence, via the conductive metal 60N, the currents can be gathered efficiently and prevented from being diffused.

Figure 59:
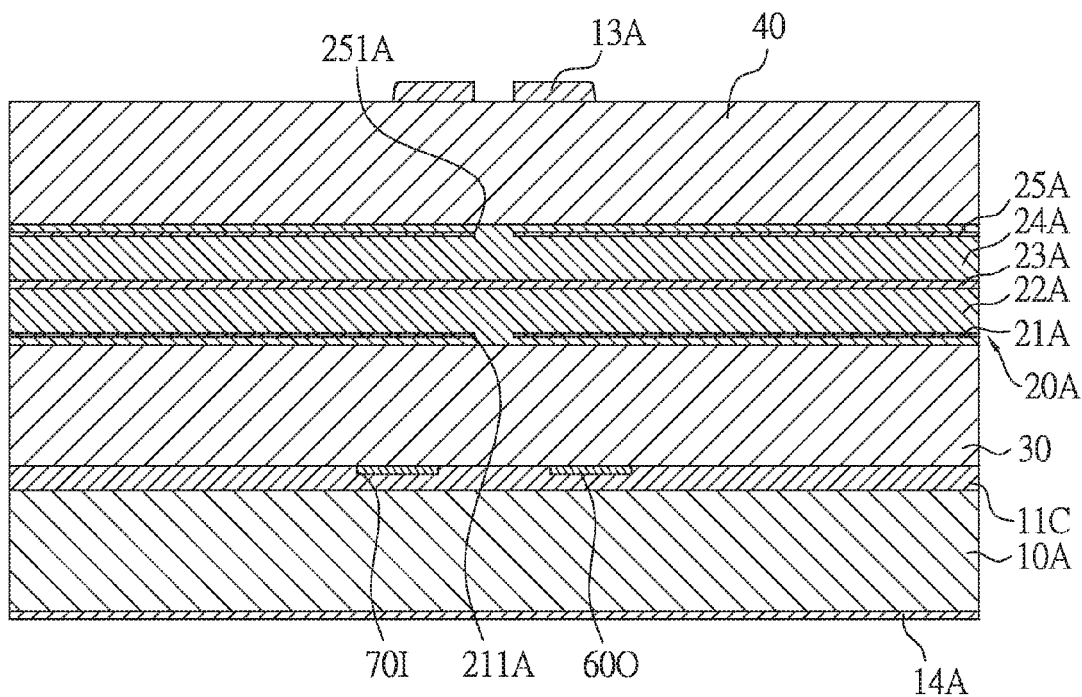
FIG. 59 illustrates a structural view of a fifty-eighth embodiment of the instant disclosure.

Please refer to FIG. 59, illustrating a thirty-sixth embodiment of the instant disclosure. In the thirty-sixth embodiment, the structure of the metal bonding layer 11C is different from that of the thirty-second embodiment. In the thirty-sixth embodiment, the surface emitting laser further comprises two conductive metals 60O. Portions of the metal bonding layer 11C respectively corresponding to the two sides of the first current opening 211A are etched downwardly to form two recessed grooves 70I in a semiconductor manufacturing process. The conductive metals 60O are in the recessed grooves 70I, respectively. The surfaces of the conductive metals 60O are flush with the surface of the metal bonding layer 11C and bonded to the first epitaxial semiconductor reflection layer 30. Hence, via the conductive metals 60O, the currents can be gathered efficiently and prevented from being diffused.

Figure 60:
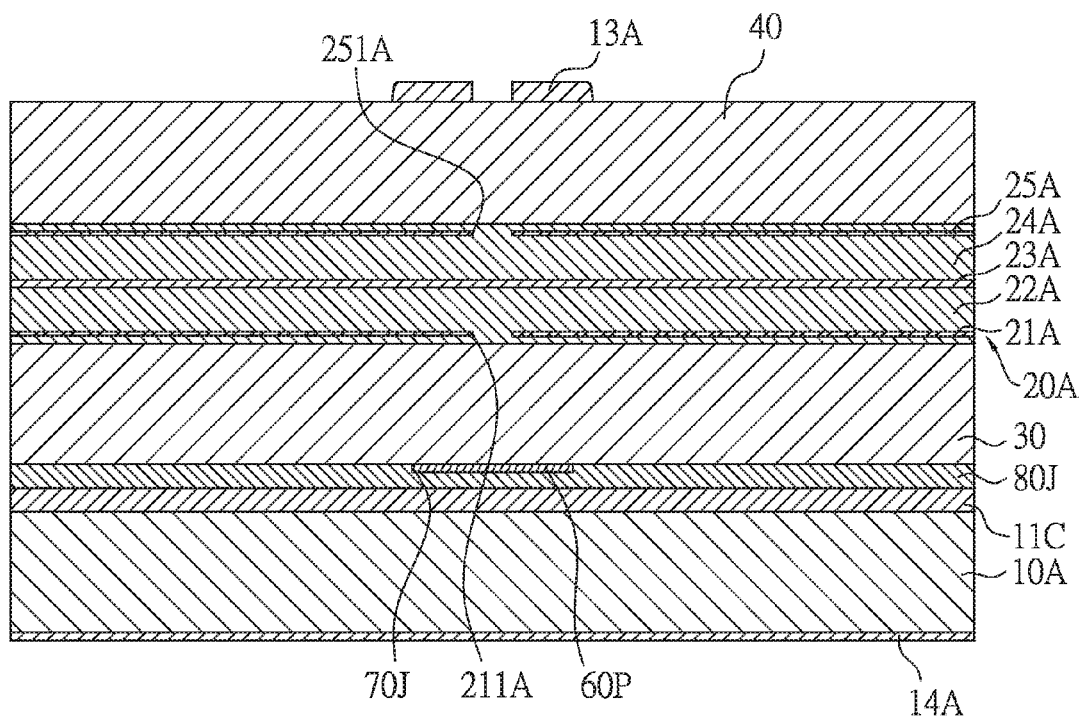
FIG. 60 illustrates a structural view of a fifty-ninth embodiment of the instant disclosure.

Please refer to FIG. 60, illustrating a fifty-ninth embodiment of the instant disclosure. In the fifty-ninth embodiment, the surface emitting laser further comprises a transparent conductive layer 80J and a conductive metal 60P. The transparent conductive layer 80J is between the metal bonding layer 11C and the first epitaxial semiconductor reflection layer 30. A portion of the transparent conductive layer 80J corresponding to the first current opening 211A is etched to form a recessed groove 70J in a semiconductor manufacturing process. The conductive metal 60P is in the recessed groove 70J. The surface of the conductive metal 60P is flush with the surface of the transparent conductive layer 80J and bonded to the first epitaxial semiconductor reflection layer 30. Hence, via the conductive metal 60P, the currents can be gathered efficiently and prevented from being diffused, and the mobility of the currents can be improved via the transparent conductive layer 80J.

Figure 61:
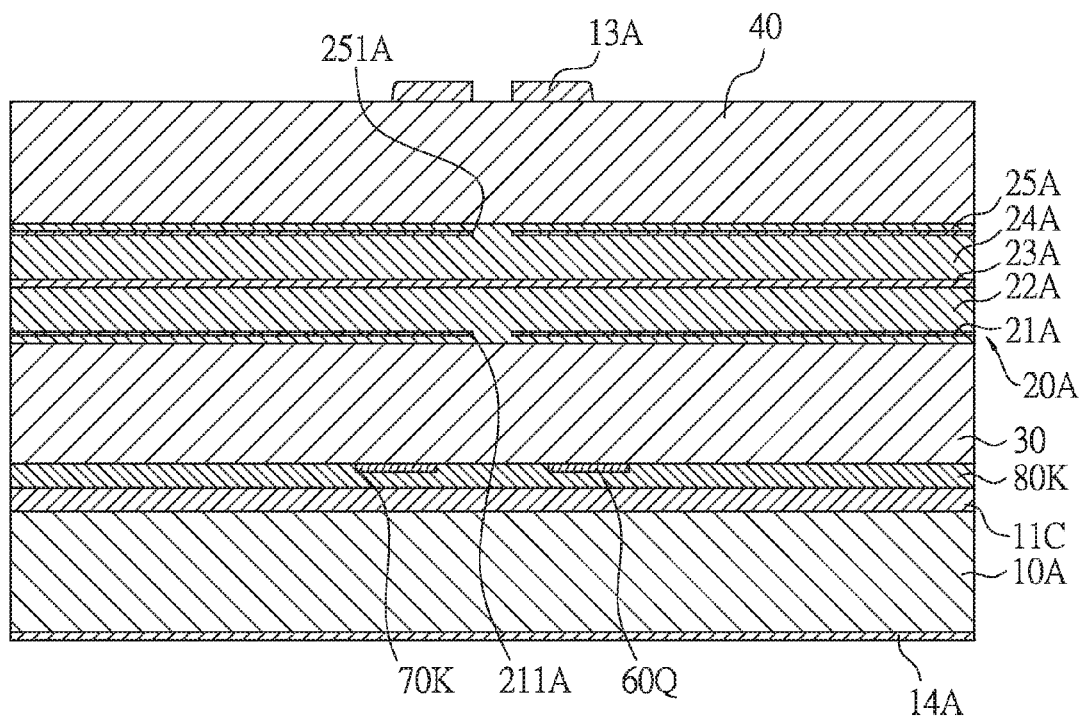
FIG. 61 illustrates a structural view of a sixtieth embodiment of the instant disclosure.

Please refer to FIG. 61, illustrating a sixtieth embodiment of the instant disclosure. In the sixtieth embodiment, the surface emitting laser further comprises a transparent conductive layer 80K and two conductive metals 60Q. The transparent conductive layer 80K is between the metal bonding layer 11C and the first epitaxial semiconductor reflection layer 30. Portions of the transparent conductive layer 80K respectively corresponding to the two sides of the first current opening 211A are etched downwardly to form two recessed grooves 70K. The conductive metals 60Q are in the recessed grooves 70K, respectively. The surfaces of the conductive metals 60Q are flush with the surface of the transparent conductive layer 80K and bonded to the first epitaxial semiconductor reflection layer 30. Hence, via the conductive metals 60Q, the currents can be gathered efficiently and prevented from being diffused, and the mobility of the currents can be improved via the transparent conductive layer 80K.

Figure 62:
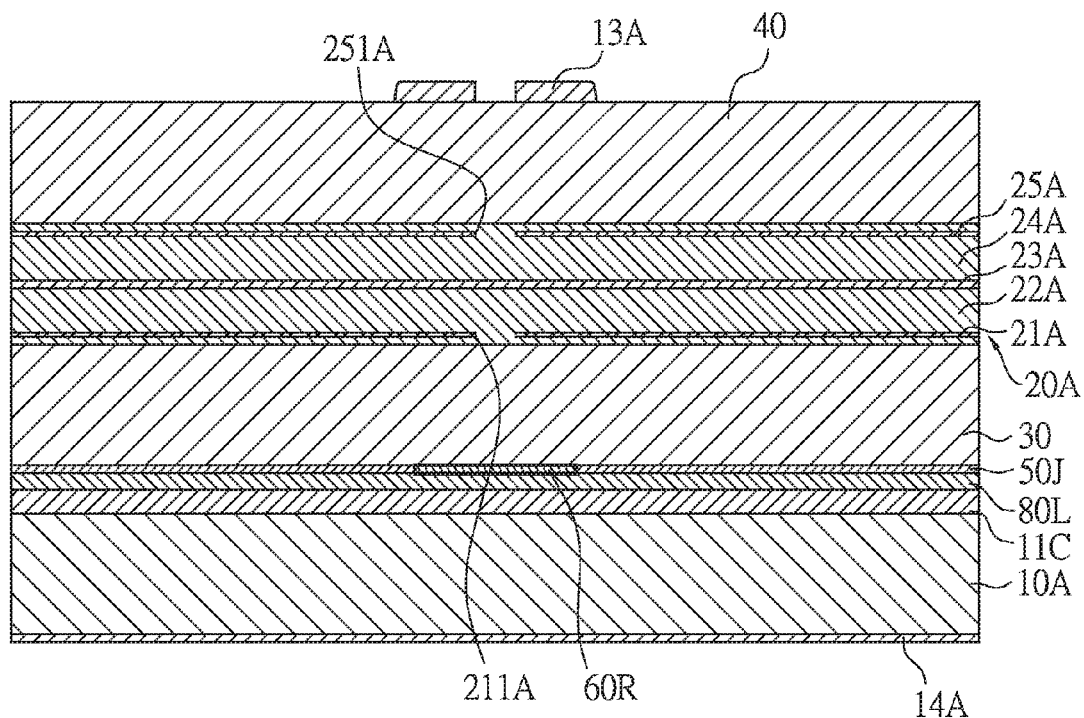
FIG. 62 illustrates a structural view of a sixty-first embodiment of the instant disclosure.

Please refer to FIG. 62, illustrating a sixty-first embodiment of the instant disclosure. In the sixty-first embodiment, the surface emitting laser further comprises a transparent conductive layer 80L, a conductive metal 60R, and an insulating layer 50J. The transparent conductive layer 80L is between the metal bonding layer 11C and the first epitaxial semiconductor reflection layer 30. The conductive metal 60R is on a portion of the transparent conductive layer 80L corresponding to the first current opening 211A and the conductive metal 60R corresponds to the first current opening 211A. The insulating layer 50J is on the surface of the transparent conductive layer 80L and surrounds the conductive metal 60R. The surface of the insulating layer 50J is flush with the surface of the conductive metal 60R and bonded to the first epitaxial semiconductor layer 30. Hence, via the conductive metal 60R, the currents can be gathered efficiently and prevented from being diffused. Moreover, the mobility of the currents can be improved via the transparent conductive layer 80L. Furthermore, the insulating layer 50J can protect the transparent conductive layer 80L and the insulating layer 50J can prevent the currents from transmitting through other portions.

Figure 63:
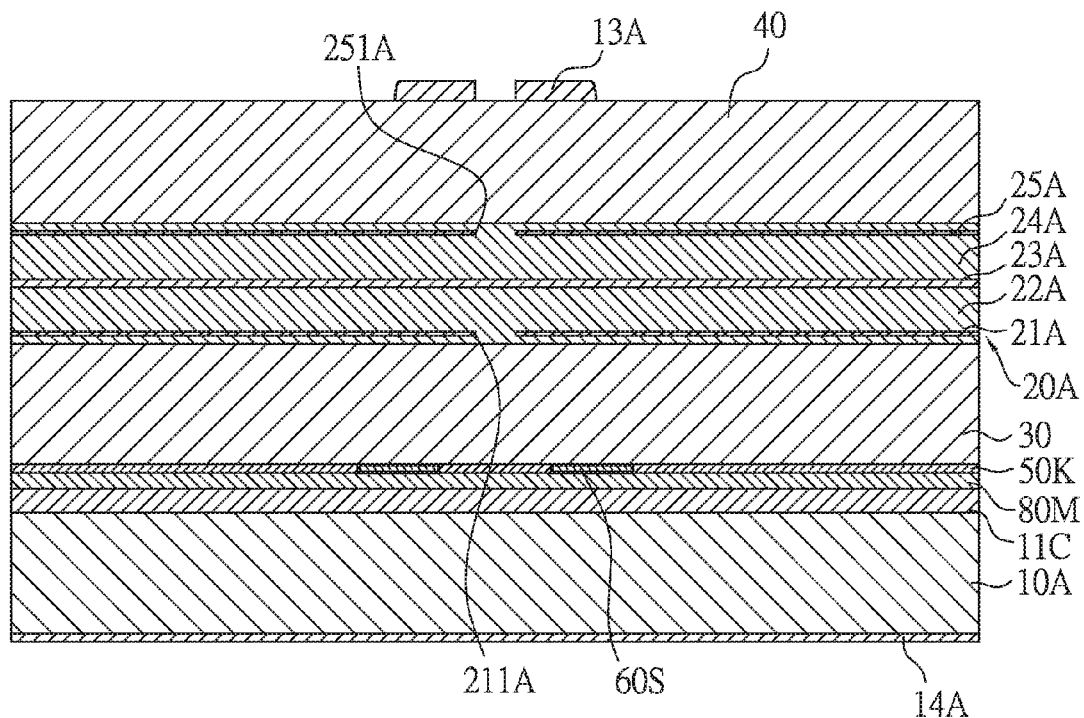
FIG. 63 illustrates a structural view of a sixty-second embodiment of the instant disclosure.

Please refer to FIG. 63, illustrating a sixty-second embodiment of the instant disclosure. In the sixty-second embodiment, the surface emitting laser further comprises a transparent conductive layer 80M, two conductive metals 60S, and an insulating layer 50K. The transparent conductive layer 80M is between the metal bonding layer 11C and the first epitaxial semiconductor layer 30. The conductive metals 60S are on portions of the transparent conductive layer 80M corresponding to the two sides of the first current opening 211A, respectively. The insulating layer 50K is on the surface of the transparent conductive layer 80M and surrounds the conductive metals 60S. The surface of the insulating layer 50K is flush with the surfaces of the conductive metals 60S and bonded to the first epitaxial semiconductor layer 30. Hence, via the conductive metals 60S, the currents can be gathered efficiently and prevented from being diffused. Moreover, the mobility of the currents can be improved via the transparent conductive layer 80M. Furthermore, the insulating layer 50K can protect the transparent conductive layer 80M.

Figure 64:
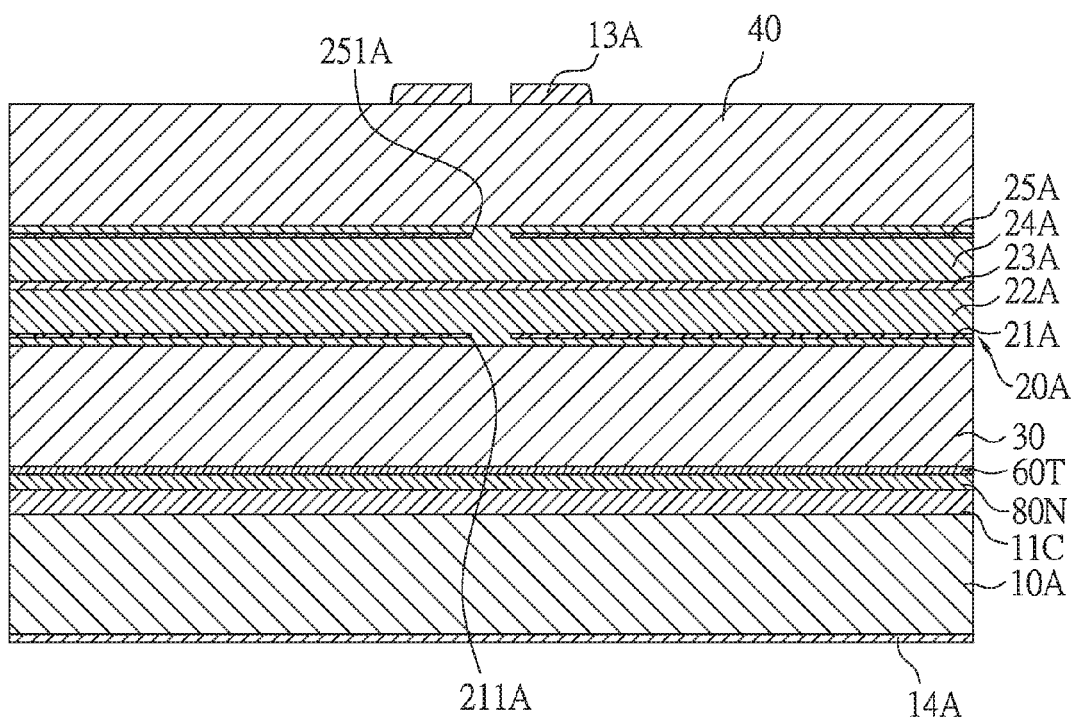
FIG. 64 illustrates a structural view of a sixty-third embodiment of the instant disclosure.

Please refer to FIG. 64, illustrating a sixty-third embodiment of the instant disclosure. In the sixty-third embodiment, the surface emitting laser further comprises a transparent conductive layer 80N and a layer of conductive metal 60T. The transparent conductive layer 80N is between the metal bonding layer 11C and the first epitaxial semiconductor reflection layer 30. The conductive metal 60T is between the transparent conductive layer 80N and the first epitaxial semiconductor reflection layer 30. The conductive metal 60T is a whole layer to correspond to the transparent conductive layer 80N and the first epitaxial semiconductor reflection layer 30. Hence, the mobility of the currents can be improved via the transparent conductive layer 80N. Moreover, the layer of the conductive metal 60T allows the currents to pass through the surface emitting laser evenly.

In the foregoing embodiments, the insulating layers 50-50K may be a titanium dioxide ($TiO_2$) transparent dielectric material, a silicon dioxide ($SiO_2$) transparent dielectric material, a silicon nitride ($Si_3N_4$) transparent dielectric material, a magnesium fluoride ($MgF_2$) transparent dielectric material, or a transparent insulating polymer, etc.

In the foregoing embodiments, the transparent conductive layer 80-80N may be made of indium tin oxide (ITO), zinc oxide (ZnO), indium zinc tin oxide (IZTO), indium gallium zinc oxide (IGZO), beta-phase gallium oxide ($\beta$-Ga2O3), etc.

The first current-blocking layer (i.e., the first epitaxial current-blocking layer 21, 21A) and the second current-blocking layer (i.e., the second epitaxial current-blocking layer 25, 25A) grown by the semiconductor epitaxy process allow the structure of the laser structure layer 20, 20A to be smooth, so that the junction interface between the laser structure layer 20 and the epitaxial semiconductor reflection layer 12 (or the junction interfaces between the laser structure layer 20A and the first epitaxial semiconductor reflection layer 30 and the second epitaxial semiconductor reflection layer 40) can be combined properly to improve the efficiency of the surface emitting laser.

What is claimed is:

1. A surface emitting comprising:
   a conductive substrate;
   a metal bonding layer on an upper surface of the conductive substrate;
   a laser structure layer on an upper surface of the metal bonding layer, wherein the laser structure layer has a first epitaxial current-blocking layer, and the first epitaxial current-blocking layer has a first current opening for current passing;
   an epitaxial semiconductor reflection layer on an upper surface of the laser structure layer;
   a first electrode layer on an upper surface of the epitaxial semiconductor reflection layer for packaging and electrical conduction;
   wherein the first epitaxial current-blocking layer is grown by a semiconductor epitaxy process, and a type of a semiconductor material of the first epitaxial current-blocking layer is different from a type of a semiconductor material of the laser structure layer;
   wherein the metal bonding layer, the laser structure layer, the epitaxial semiconductor reflection layer, the first electrode layer, and the conductive substrate are combined with each other by a wafer bonding process; in the wafer bonding process, the metal bonding layer is disposed on the upper surface of the conductive substrate; after a substrate for loading the laser structure layer, the epitaxial semiconductor reflection layer, and the first electrode layer is removed, the laser structure layer, the epitaxial semiconductor reflection layer, and the first electrode layer are transferred to the upper surface of the metal bonding layer; a second electrode layer is disposed on a lower surface of the conductive substrate;
   wherein the laser structure layer sequentially has, from a top to a bottom, a first semiconductor epitaxial layer, an emitting reaction active layer, and a second semiconductor epitaxial layer on the upper surface of the metal bonding layer; a type of a semiconductor material of the first semiconductor epitaxial layer is opposite to a type of a semiconductor material of the second semiconductor epitaxial layer; the first epitaxial current-blocking layer is in the first semiconductor epitaxial layer;

wherein the first epitaxial current-blocking layer is a multiple layer structure; the first epitaxial current-blocking layer is formed by three or more layers including both N type and P type semiconductor layers stacked with one another in an interlacing manner; a type of a semiconductor material of an uppermost layer of the first epitaxial current-blocking layer and a type of a semiconductor material of a lowermost layer of the first epitaxial current-blocking layer are opposite to the type of the semiconductor material of the first semiconductor epitaxial layer; a total number of the layers of the first epitaxial current-blocking layer is an odd number;

wherein the surface emitting laser further comprises two conductive metals, portions of the metal bonding layer respectively corresponding to the two sides of the first current opening are etched downwardly to form two recessed grooves; the conductive metals are in the recessed grooves, respectively; surfaces of the conductive metals are flush with a surface of the metal bonding layer and bonded to the laser structure layer.

2. The surface emitting laser according to claim 1, further comprising an insulating layer, wherein a thickness of a portion of the metal bonding layer corresponding to the first current opening is retained, and rest portions of the metal bonding layer are etched downwardly by a depth; the insulating layer is on a surface of the etched portions of the metal bonding layer; the insulating layer and the metal bonding layer are bonded to the laser structure layer.

3. A surface emitting laser comprising:
a conductive substrate;
a metal bonding layer on an upper surface of the conductive substrate;
a laser structure layer on an upper surface of the metal bonding layer, wherein the laser structure layer has a first epitaxial current-blocking layer, and the first epitaxial current-blocking layer has a first current opening for current passing;
an epitaxial semiconductor reflection layer on an upper surface of the laser structure layer;
a first electrode layer on an upper surface of the epitaxial semiconductor reflection layer for packaging and electrical conduction;
wherein the first epitaxial current-blocking layer is grown by a semiconductor epitaxy process, and a type of a semiconductor material of the first epitaxial current-blocking layer is different from a type of a semiconductor material of the laser structure layer;
wherein the metal bonding layer, the laser structure layer, the epitaxial semiconductor reflection layer, the first electrode layer, and the conductive substrate are combined with each other by a wafer bonding process; in the wafer bonding process, the metal bonding layer is disposed on the upper surface of the conductive substrate; after a substrate for loading the laser structure layer, the epitaxial semiconductor reflection layer, and the first electrode layer is removed, the laser structure layer, the epitaxial semiconductor reflection layer, and the first electrode layer are transferred to the upper surface of the metal bonding layer; a second electrode layer is disposed on a lower surface of the conductive substrate;
wherein the laser structure layer sequentially has, from a top to a bottom, a first semiconductor epitaxial layer, an emitting reaction active layer, and a second semiconductor epitaxial layer on the upper surface of the metal bonding layer; a type of a semiconductor material of the first semiconductor epitaxial layer is opposite to a type of a semiconductor material of the second semiconductor epitaxial layer; the first epitaxial current-blocking layer is in the second semiconductor epitaxial layer;

wherein the first epitaxial current-blocking layer is a multiple layer structure; the first epitaxial current-blocking layer is formed by three or more layers including both N type and P type semiconductor layers stacked with one another in an interlacing manner; a type of a semiconductor material of an uppermost layer of the first epitaxial current-blocking layer and a type of a semiconductor material of a lowermost layer of the first epitaxial current-blocking layer are opposite to the type of the semiconductor material of the second semiconductor epitaxial layer; a total number of the layers of the first epitaxial current-blocking layer is an odd number;

wherein the surface emitting laser further comprises two conductive metals, portions of the metal bonding layer respectively corresponding to the two sides of the first current opening are etched downwardly to form two recessed grooves; the conductive metals are in the recessed grooves, respectively; surfaces of the conductive metals are flush with a surface of the metal bonding layer and bonded to the laser structure layer.

4. The surface emitting laser according to claim 3, further comprising an insulating layer, wherein a thickness of a portion of the metal bonding layer corresponding to the first current opening is retained, and rest portion of the metal bonding layer are etched downwardly by a depth; the insulating layer is on a surface of the etched portions of the metal bonding layer; the insulating layer and the metal bonding layer are bonded to the laser structure layer.

5. The surface emitting laser according to claim 1, further comprising a second epitaxial current-blocking layer, wherein the second epitaxial current-blocking layer is in the second semiconductor epitaxial layer, and the second epitaxial current-blocking layer has a second current opening corresponding to the first current opening;
wherein the second epitaxial current-blocking layer is a single layer structure or a multilayer structure;
wherein when the second epitaxial current-blocking layer is a single layer structure, the second epitaxial current-blocking layer is an N type semiconductor layer or a P type semiconductor layer, and a type of a semiconductor material of the second epitaxial current-blocking layer is opposite to the type of the semiconductor material of the second semiconductor epitaxial layer;
wherein when the second epitaxial current-blocking layer is a multiple layer structure, the second epitaxial current-blocking layer is formed by three or more layers including both N type and P type semiconductor layers stacked with one another in an interlacing manner; a type of a semiconductor material of an uppermost layer of the second epitaxial current-blocking layer and a type of a semiconductor material of a lowermost layer of the second epitaxial current-blocking layer are opposite to the type of the semiconductor material of the second semiconductor epitaxial layer; a total number of the layers of the second epitaxial current-blocking layer is an odd number.

6. A surface emitting laser comprising:
a conductive substrate;

a first epitaxial semiconductor reflection layer on an upper surface of the conductive substrate;

a laser structure layer on an upper surface of the first epitaxial semiconductor reflection layer, wherein the laser structure layer has a first epitaxial current-blocking layer, and the first epitaxial current-blocking layer has a first current opening for current passing;

a second epitaxial semiconductor reflection layer on an upper surface of the laser structure layer;

a first electrode layer on the upper surface of the laser structure layer for packaging and electrical conduction;

wherein the first epitaxial current-blocking layer is grown by a semiconductor epitaxy process, and a type of a semiconductor material of the first epitaxial current-blocking layer is different from a type of a semiconductor material of the laser structure layer;

wherein the laser structure layer sequentially has, from a top to a bottom, a first semiconductor epitaxial layer, an emitting reaction active layer, and a second semiconductor epitaxial layer on the upper surface of the first epitaxial semiconductor reflection layer; a type of a semiconductor material of the first semiconductor epitaxial layer is opposite to a type of a semiconductor material of the second semiconductor epitaxial layer; the first epitaxial current-blocking layer is in the first semiconductor epitaxial layer;

wherein the first epitaxial current-blocking layer is a multiple layer structure; the first epitaxial current-blocking layer is formed by three or more layers including both N type and P type semiconductor layers stacked with one another in an interlacing manner; a type of a semiconductor material of an uppermost layer of the first epitaxial current-blocking layer and a type of a semiconductor material of a lowermost layer of the first epitaxial current-blocking layer are opposite to the type of the semiconductor material of the first semiconductor epitaxial layer; a total number of the layers of the first epitaxial current-blocking layer is an odd number;

wherein the surface emitting laser further comprises two conductive metals, portions of the first epitaxial semiconductor reflection layer respectively corresponding to the two sides of the first current opening are etched downwardly to form two recessed grooves; the conductive metals are in the recessed grooves, respectively; surfaces of the conductive metals are flush with a surface of the first epitaxial semiconductor reflection layer and bonded to the laser structure layer.

7. The surface emitting laser according to claim 6, further comprising a metal bonding layer, wherein the metal bonding layer is between the conductive substrate and the first epitaxial semiconductor reflection layer; the metal bonding layer, the first epitaxial semiconductor reflection layer, the laser structure layer, the second epitaxial semiconductor reflection layer, the first electrode layer, and the conductive substrate are combined with each other by a wafer bonding process; in the wafer bonding process, the metal bonding layer is disposed on the upper surface of the conductive substrate; after a substrate for loading the first epitaxial semiconductor reflection layer, the laser structure layer, the second epitaxial semiconductor reflection layer, and the first electrode layer is removed, the first epitaxial semiconductor reflection layer, the laser structure layer, the second epitaxial semiconductor reflection layer, and the first electrode layer are transferred to an upper surface of the metal bonding layer; a second electrode layer is disposed on a lower surface of the conductive substrate.

8. The surface emitting laser according to claim 7, further comprising an insulating layer, wherein a thickness of a portion of the metal bonding layer corresponding to the first current opening is retained, and rest portions of the metal bonding layer are etched downwardly by a depth; the insulating layer is on a surface of the etched portions of the metal bonding layer; the insulating layer and the metal bonding layer are bonded to the laser structure layer.

9. A surface emitting laser comprising:

a conductive substrate;

a first epitaxial semiconductor reflection layer on an upper surface of the conductive substrate;

a laser structure layer on an upper surface of the first epitaxial semiconductor reflection layer, wherein the laser structure layer has a first epitaxial current-blocking layer, and the first epitaxial current-blocking layer has a first current opening for current passing;

a second epitaxial semiconductor reflection layer on an upper surface of the laser structure layer;

a first electrode layer on the upper surface of the laser structure layer for packaging and electrical conduction;

wherein the first epitaxial current-blocking layer is grown by a semiconductor epitaxy process, and a type of a semiconductor material of the first epitaxial current-blocking layer is different from a type of a semiconductor material of the laser structure layer;

wherein the laser structure layer sequentially has, from a top to a bottom, a first semiconductor epitaxial layer, an emitting reaction active layer, and a second semiconductor epitaxial layer on the upper surface of the first epitaxial semiconductor reflection layer; a type of a semiconductor material of the first semiconductor epitaxial layer is opposite to a type of a semiconductor material of the second semiconductor epitaxial layer; the first epitaxial current-blocking layer is in the second semiconductor epitaxial layer;

wherein the first epitaxial current-blocking layer is a multiple layer structure; the first epitaxial current-blocking layer is formed by three or more layers including both N type and P type semiconductor layers stacked with one another in an interlacing manner; a type of a semiconductor material of an uppermost layer of the first epitaxial current-blocking layer and a type of a semiconductor material of a lowermost layer of the first epitaxial current-blocking layer are opposite to the type of the semiconductor material of the second semiconductor epitaxial layer; a total number of the layers of the first epitaxial current-blocking layer is an odd number;

wherein the surface emitting laser further comprises two conductive metals, portions of the first epitaxial semiconductor reflection respectively corresponding to the two sides of the first current opening are etched downwardly to form two recessed grooves; the conductive metals are in the recessed grooves, respectively; surfaces of the conductive metals are flush with a surface of the first epitaxial semiconductor reflection and bonded to the laser structure layer.

10. The surface emitting laser according to claim 9, further comprising a metal bonding layer, wherein the metal bonding layer is between the conductive substrate and the first epitaxial semiconductor reflection layer; the metal bonding layer, the first epitaxial semiconductor reflection layer, the laser structure layer, the second epitaxial semiconductor reflection layer, the first electrode layer, and the conductive substrate are combined with each other by a wafer bonding process; in the wafer bonding process, the metal bonding layer is disposed on the upper surface of the conductive substrate; after a substrate for loading the first epitaxial semiconductor reflection layer, the laser structure layer, the second epitaxial semiconductor reflection layer, and the first electrode layer is removed, the first epitaxial semiconductor reflection layer, the laser structure layer, the second epitaxial semiconductor reflection layer, and the first electrode layer are transferred to an upper surface of the metal bonding layer; a second electrode layer is disposed on a lower surface of the conductive substrate.

11. The surface emitting laser according to claim 10, further comprising an insulating layer, wherein a thickness of a portion of the metal bonding layer corresponding to the first current opening is retained, and rest portions of the metal bonding layer are etched downwardly by a depth; the insulating layer is on a surface of the etched portions of the metal bonding layer; the insulating layer and the metal bonding layer are bonded to the laser structure layer.

12. The surface emitting laser according to claim 6, further comprising a second epitaxial current-blocking layer, wherein the second epitaxial current-blocking layer is in the second semiconductor epitaxial layer, and the second epitaxial current-blocking layer has a second current opening corresponding to the first current opening;

wherein the second epitaxial current-blocking layer is a single layer structure or a multilayer structure;

wherein when the second epitaxial current-blocking layer is a single layer structure, the second epitaxial current-blocking layer is an N type semiconductor layer or a P type semiconductor layer, and a type of a semiconductor material of the second epitaxial current-blocking layer is opposite to the type of the semiconductor material of the second semiconductor epitaxial layer;

wherein when the second epitaxial current-blocking layer is a multiple layer structure, the second epitaxial current-blocking layer is formed by three or more layers including both N type and P type semiconductor layers stacked with one another in an interlacing manner; a type of a semiconductor material of an uppermost layer of the second epitaxial current-blocking layer and a type of a semiconductor material of a lowermost layer of the second epitaxial current-blocking layer are opposite to the type of the semiconductor material of the second semiconductor epitaxial layer; a total number of the layers of the second epitaxial current-blocking layer is an odd number.

13. The surface emitting laser according to claim 12, further comprising a metal bonding layer, wherein the metal bonding layer is between the conductive substrate and the first epitaxial semiconductor reflection layer; the metal bonding layer, the first epitaxial semiconductor reflection layer, the laser structure layer, the second epitaxial semiconductor reflection layer, the first electrode layer, and the conductive substrate are combined with each other by a wafer bonding process; in the wafer bonding process, the metal bonding layer is disposed on the upper surface of the conductive substrate; after a substrate for loading the first epitaxial semiconductor reflection layer, the laser structure layer, the second epitaxial semiconductor reflection layer, and the first electrode layer is removed, the first epitaxial semiconductor reflection layer, the laser structure layer, the second epitaxial semiconductor reflection layer, and the first electrode layer are transferred to an upper surface of the metal bonding layer; a second electrode layer is disposed on a lower surface of the conductive substrate.

14. The surface emitting laser according to claim 1, wherein the metal bonding layer and the epitaxial semiconductor reflection layer are configured to reflect light emitted by the laser structure layer to provide resonance gain.

15. The surface emitting laser according to claim 3, wherein the metal bonding layer and the epitaxial semiconductor reflection layer are configured to reflect light emitted by the laser structure layer to provide resonance gain.

16. The surface emitting laser according to claim 6, wherein the first epitaxial semiconductor reflection and the second epitaxial semiconductor reflection layer are configured to reflect light emitted by the laser structure layer to provide resonance gain.

17. The surface emitting laser according to claim 9, wherein the first epitaxial semiconductor reflection and the second epitaxial semiconductor reflection layer are configured to reflect light emitted by the laser structure layer to provide resonance gain.

* * * * *